(12) United States Patent
Kim et al.

(10) Patent No.: US 12,501,784 B2
(45) Date of Patent: Dec. 16, 2025

(54) DISPLAY DEVICE, METHOD OF FABRICATING THE SAME

(71) Applicant: Samsung Display Co., LTD., Yongin-si (KR)

(72) Inventors: Jae Sik Kim, Yongin-si (KR); Woo Yong Sung, Yongin-si (KR); Jeong Seok Lee, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 491 days.

(21) Appl. No.: 18/169,160

(22) Filed: Feb. 14, 2023

(65) Prior Publication Data

US 2023/0403884 A1   Dec. 14, 2023

(30) Foreign Application Priority Data

Jun. 9, 2022   (KR) .................. 10-2022-0069922

(51) Int. Cl.
  *H10K 59/122*   (2023.01)
  *H10K 50/15*   (2023.01)
  (Continued)

(52) U.S. Cl.
  CPC ........... *H10K 59/122* (2023.02); *H10K 50/15* (2023.02); *H10K 50/16* (2023.02); *H10K 50/81* (2023.02);
  (Continued)

(58) Field of Classification Search
  CPC .................................................. H10K 59/122
  See application file for complete search history.

(56) References Cited

U.S. PATENT DOCUMENTS 10,326,076 B2   6/2019  Song et al.
2011/0254133 A1  10/2011  Pohlers
(Continued)

FOREIGN PATENT DOCUMENTS

| JP | 2008135325 A | * | 6/2008 | ....... H10K 59/80522 |
|---|---|---|---|---|
| KR | 10-2021-0052782 A | | 5/2021 | |
| WO | 2021/071630 A1 | | 4/2021 | |

OTHER PUBLICATIONS

EPO, EPO Search Opinion, EPO Application No. 23176762.5, dated Oct. 5, 2023, all pages. (Year: 2023).*

(Continued)

*Primary Examiner* — Victoria K. Hall
(74) *Attorney, Agent, or Firm* — Womble Bond Dickinson (US) LLP

(57) ABSTRACT

A display device and a method for fabricating the same are provided, the display device including a substrate including emission areas for displaying images, and a non-emission area between the emission areas, anode electrodes above the substrate and respectively in the emission areas, a bank buffer layer above the substrate in the non-emission area and covering edges of the anode electrodes, a first multi-layer above the bank buffer layer, including a stack of two or more different metal materials, and including an undercut structure, a pixel-defining layer above the first multi-layer, a second multi-layer above the pixel-defining layer, including a stack of two or more different metal materials, and including an undercut structure, and a spacer above the second multi-layer.

40 Claims, 38 Drawing Sheets

(51) Int. Cl.
  *H10K 50/16* (2023.01)
  *H10K 50/81* (2023.01)
  *H10K 50/822* (2023.01)
  *H10K 50/844* (2023.01)
  *H10K 59/12* (2023.01)
  *H10K 59/123* (2023.01)
  *H10K 59/35* (2023.01)
  *H10K 59/80* (2023.01)
  *H10K 71/00* (2023.01)
  *H10K 71/60* (2023.01)
  *H10K 59/131* (2023.01)
  *H10K 102/00* (2023.01)

(52) U.S. Cl.
  CPC ......... *H10K 50/822* (2023.02); *H10K 50/844* (2023.02); *H10K 59/1201* (2023.02); *H10K 59/123* (2023.02); *H10K 59/80522* (2023.02); *H10K 59/8723* (2023.02); *H10K 59/873* (2023.02); *H10K 71/00* (2023.02); *H10K 71/60* (2023.02); *H10K 59/131* (2023.02); *H10K 59/353* (2023.02); *H10K 2102/341* (2023.02); *H10K 2102/351* (2023.02)

(56) References Cited

U.S. PATENT DOCUMENTS

| | | | |
|---|---|---|---|
| 2014/0346663 A1 | 11/2014 | Chopin et al. | |
| 2015/0280171 A1 | 10/2015 | Ko et al. | |
| 2019/0189972 A1* | 6/2019 | Kwon | H10K 71/166 |
| 2020/0152718 A1* | 5/2020 | Ko | H10K 59/35 |
| 2020/0168670 A1 | 5/2020 | Kim et al. | |
| 2021/0202655 A1* | 7/2021 | Cho | H10K 59/124 |
| 2022/0077251 A1* | 3/2022 | Choung | H10K 50/844 |
| 2022/0115623 A1* | 4/2022 | Fang | H10K 59/124 |
| 2023/0013772 A1* | 1/2023 | Choung | H10K 59/80522 |
| 2023/0041252 A1* | 2/2023 | Chen | H10K 71/00 |
| 2023/0071206 A1* | 3/2023 | Bang | H10K 59/124 |
| 2023/0209956 A1* | 6/2023 | Tabatake | H10K 50/841 257/40 |
| 2023/0217735 A1* | 7/2023 | Tabatake | H10K 59/123 257/40 |
| 2023/0225180 A1* | 7/2023 | Kokame | H10K 59/1201 438/22 |
| 2023/0232694 A1* | 7/2023 | Tabatake | H10K 59/122 257/40 |
| 2023/0232699 A1* | 7/2023 | Mizukoshi | H10K 71/221 438/99 |
| 2023/0240096 A1* | 7/2023 | Sung | H10K 59/873 |
| 2023/0240117 A1* | 7/2023 | Fukuda | H10K 59/8721 257/40 |
| 2023/0240120 A1* | 7/2023 | Yamamoto | H10K 59/873 257/40 |
| 2023/0240122 A1* | 7/2023 | Matsumoto | H10K 71/231 |
| 2023/0240123 A1* | 7/2023 | Yamamoto | H10K 50/814 |
| 2023/0255063 A1* | 8/2023 | Fukuda | H10K 59/122 257/40 |
| 2023/0255097 A1* | 8/2023 | Yamamoto | H10K 71/231 438/99 |
| 2023/0263013 A1* | 8/2023 | Fukuda | H10K 59/873 257/40 |
| 2023/0269969 A1* | 8/2023 | Lee | H10K 59/873 257/40 |
| 2023/0292555 A1* | 9/2023 | Takayama | H10K 59/879 |
| 2023/0301141 A1* | 9/2023 | Matsumoto | H10K 59/873 257/40 |
| 2023/0329042 A1* | 10/2023 | Sung | H10K 59/40 |
| 2024/0224604 A1* | 7/2024 | Shin | H10K 59/1201 |
| 2024/0381697 A1* | 11/2024 | Yang | H10K 59/122 |

OTHER PUBLICATIONS

EPO, EPO Search Report, EPO Application No. 23176762.5, dated Oct. 5, 2023, all pages. (Year: 2023).*
EPO, Decision to Grant Patent, EPO U.S. Appl. No. 23/176,762, dated Jul. 10, 2025, all pages. (Year: 2025).*
Machine translation, Tanaka, Japanese Pat. Pub. No. JP2008135325A, Espacenet, translation date: Aug. 1, 2025, all pages. (Year: 2025).*

* cited by examiner

DISPLAY DEVICE, METHOD OF FABRICATING THE SAME

CROSS-REFERENCE TO RELATED APPLICATION

This application claims priority to, and the benefit of, Korean Patent Application No. 10-2022-0069922 filed on Jun. 9, 2022, in the Korean Intellectual Property Office, the disclosure of which is incorporated herein by reference in its entirety.

BACKGROUND

1. Field

The present disclosure relates to a display device and a method for fabricating the same.

2. Description of the Related Art

As the information-oriented society evolves, various demands for display devices are ever increasing. Display devices may be flat panel display devices, such as a liquid-crystal display device, a field emission display device, and a light-emitting display device.

Light-emitting display devices may include an organic light-emitting display device including organic light-emitting emitting diodes as light-emitting elements, or a light-emitting diode display device including inorganic light-emitting diodes, such as light-emitting diodes (LEDs) as light-emitting elements.

An organic light-emitting display device includes a plurality of organic light-emitting diodes located in a plurality of emission areas associated with a plurality of sub-pixels. In addition, an organic light-emitting display device can display images by adjusting the luminance or grayscale of light from a plurality of organic light-emitting diodes with the magnitude of the driving current applied to each of the organic light-emitting diodes.

SUMMARY

An organic light-emitting diode of an organic light-emitting display device includes an emissive layer of an organic light-emitting material for converting a driving current into a photon. Such an organic light-emitting material has a disadvantage in that it may be rapidly deteriorated by moisture or oxygen. Accordingly, an organic light-emitting display device may include an encapsulation structure for protecting the emissive layer from moisture or oxygen.

Aspects of the present disclosure provide a display device having a structure that can decrease or prevent a permeation path of oxygen or moisture from expanding due to damage to an encapsulation structure, and a method of fabricating the same.

According to one or more embodiments, a display device includes a substrate including emission areas for displaying images, and a non-emission area between the emission areas, anode electrodes above the substrate and respectively in the emission areas, a bank buffer layer above the substrate in the non-emission area and covering edges of the anode electrodes, a first multi-layer above the bank buffer layer, including a stack of two or more different metal materials, and including an undercut structure, a pixel-defining layer above the first multi-layer, a second multi-layer above the pixel-defining layer, including a stack of two or more different metal materials, and including an undercut structure, and a spacer above the second multi-layer.

The display device may further include first common layers above the anode electrodes, respectively, emissive layers above the first common layers, respectively, a second common layer in the emission areas and the non-emission area and covering the emissive layers, the pixel-defining layer, and the spacer, and a cathode electrode above the second common layer and in the emission areas.

The first common layers may include a hole transport layer, wherein the second common layer includes an electron transport layer.

The first multi-layer may include a first main layer including a metal material, and a first cover layer above the first main layer and including a metal material that is different from the metal material of the first main layer, wherein the undercut structure of the first multi-layer is formed by the first cover layer having an edge extending past the first main layer.

The second common layer and the cathode electrode above the emissive layers may be separated from the second common layer and the cathode electrode above the pixel-defining layer by the undercut structure of the first multi-layer, wherein the cathode electrode above the emissive layers is in contact with the first multi-layer.

A width by which the first cover layer extends past the first main layer may range from about 0.3 µm to about 0.7 µm.

The first multi-layer may further include a first support layer between the bank buffer layer and the first main layer and including a metal material that is different from the metal material of the first main layer.

The second multi-layer may include a second main layer including a metal material, and a second cover layer above the second main layer and including a metal material that is different from the metal material of the second main layer, wherein the undercut structure of the second multi-layer is formed by the second cover layer having an edge extending past the second main layer.

The second common layer and the cathode electrode above the spacer may be separated from the second common layer and the cathode electrode above the pixel-defining layer by the undercut structure of the second multi-layer.

A width by which the second cover layer extends past the second main layer may range from about 0.3 µm to about 0.7 µm.

The second multi-layer may further include a second support layer between the pixel-defining layer and the second main layer and including a metal material that is different from the metal material of the second main layer.

The first main layer and the second main layer may include aluminum (Al) or copper (Cu), wherein the first cover layer and the second cover layer include titanium (Ti) or molybdenum (Mo).

The display device may further include an encapsulation structure above the cathode electrode and including a first encapsulation layer above the cathode electrode, in contact with the first multi-layer and the second multi-layer, and including an inorganic insulating material, a second encapsulation layer above the first encapsulation layer, including an organic insulating material, and defining adhesion holes penetrating therethrough in the non-emission area, and a third encapsulation layer above the second encapsulation layer, including the inorganic insulating material, and contacting the first encapsulation layer through the adhesion holes.

A thickness of the first main layer or a thickness of the second main layer may exceed a sum of a thickness of the second common layer and a thickness of the cathode electrode.

The encapsulation structure may further include an adhesion-promoting layer between the first encapsulation layer and the second encapsulation layer.

The second encapsulation layer may include a negative photoresist material, wherein the adhesion-promoting layer includes a material including at least one functional group selected from among —H, —CH, —CH$_2$, —CH$_3$, —F, —CF, —CF$_2$ or —CF$_3$.

The second multi-layer may include multiple second multi-layers spaced apart from one another by a distance associated with a distance between two or more of the emission areas, with a width that is less than a width of an upper portion of the pixel-defining layer, wherein the spacer includes multiple spacers respectively above the second multi-layers.

The second multi-layers may be above a part of the pixel-defining layer, wherein the adhesion holes respectively overlap with other parts of the pixel-defining layer and the spacers.

The second multi-layer may have a width that is less than a width of an upper surface of the pixel-defining layer and is in the non-emission area, wherein the spacer includes multiple spacers spaced apart from one another by a distance associated with a distance between two or more of the emission areas.

The spacers may be above a part of the second multi-layer, wherein the adhesion holes respectively overlap with other parts of the second multi-layer and the spacers.

The second multi-layer may have a width that is less than a width of an upper surface of the pixel-defining layer and is in the non-emission area, wherein the spacer is in the non-emission area, and wherein the adhesion hole overlaps with the spacer.

The bank buffer layer may be spaced apart from an upper portion of the edges of the anode electrodes.

The display device may further include a sacrificial layer between the bank buffer layer and the anode electrodes, wherein the bank buffer layer has an edge extending past the sacrificial layer.

The display device may further include a circuit layer above the substrate and including pixel drivers respectively associated with the emission areas and respectively connected to the anode electrodes, wherein the anode electrodes and the bank buffer layer are above the circuit layer.

According to one or more embodiments, a method of fabricating a display device includes preparing a substrate including emission areas for displaying images, and a non-emission area between the emission areas, locating a circuit layer including pixel drivers respectively associated with the emission areas above the substrate, locating anode electrodes respectively in the emission areas above the circuit layer, locating a bank buffer layer covering the anode electrodes above the circuit layer, locating a first multi-layer including a stack of two or more different metal materials above the bank buffer layer, locating a pixel-defining layer in the non-emission area above the first multi-layer, locating a second multi-layer covering the pixel-defining layer and including a stack of two or more different metal materials above the first multi-layer, locating a spacer in at least a part of the non-emission area above the second multi-layer, patterning the bank buffer layer, the first multi-layer, and the second multi-layer using the pixel-defining layer and the spacer as masks, transforming the patterned first multi-layer and the patterned second multi-layer into respective undercut structures to expose central portions of the anode electrodes, locating first common layers and emissive layers respectively in the emission areas above the anode electrodes, locating a second common layer and a cathode electrode covering the emissive layers, the pixel-defining layer, and the spacer in the emission areas and the non-emission area, and locating an encapsulation structure above the cathode electrode.

The emission areas may include first emission areas for emitting light of a first color in a first wavelength band, second emission areas for emitting light of a second color in a second wavelength band that is lower than the first wavelength band, and third emission areas for emitting light of a third color in a third wavelength band that is lower than the second wavelength band, wherein the emissive layers include a first emissive layer for emitting light of the first color, a second emissive layer for emitting light of the second color, and a third emissive layer for emitting light of the third color, and wherein the locating of the first common layers and the emissive layers respectively above the anode electrodes includes locating the first common layer and the first emissive layer above the anode electrodes of the first emission areas with a first mask defining openings aligned with the first emission areas above the spacer, locating the first common layer and the second emissive layer above the anode electrodes of the second emission areas with a second mask defining openings aligned with the second emission areas above the spacer, and locating the first common layer and the third emissive layer above the anode electrodes of the third emission areas with a third mask defining openings aligned with the third emission areas above the spacer.

The first common layers may include a hole transparent layer, wherein the second common layer includes an electron transport layer.

The first multi-layer may include a first main layer including a metal material, and a first cover layer above the first main layer and including a metal material that is different from the metal material of the first main layer, wherein the second multi-layer includes a second main layer including a metal material, and a second cover layer above the second main layer and including a metal material that is different from the metal material of the second main layer.

The transforming the patterned first multi-layer and the patterned second multi-layer into the respective undercut structures may include patterning the first main layer and the second main layer, wherein an edge of the first cover layer of the patterned first multi-layer extends past the first main layer to provide the undercut structure of the first multi-layer, and wherein an edge of the second cover layer of the patterned second multi-layer extends past the second main layer to provide the undercut structure of the second multi-layer.

The second common layer and the cathode electrode above the pixel-defining layer may be separated from the second common layer and the cathode electrode above the emissive layers by the undercut structure of the first multi-layer, and may be separated from the second common layer and the cathode electrode above the spacer by the undercut structure of the second multi-layer.

The first multi-layer may further include a first support layer between the bank buffer layer and the first main layer and including a metal material that is different from the metal material of the first main layer, wherein the second multi-layer further includes a second support layer between the pixel-defining layer and the second main layer and including a metal material that is different from the metal material of the second main layer.

The locating of the encapsulation structure above the cathode electrode may include locating a first encapsulation layer including an inorganic insulating material above the cathode electrode and contacting the first multi-layer and the second multi-layer, locating a second encapsulation layer including an organic insulating material above the first encapsulation layer, forming an adhesion hole in the non-emission area by patterning the second encapsulation layer, and locating a third encapsulation layer including an inorganic insulating material above the first encapsulation layer, the third encapsulation layer covering the second encapsulation layer and the adhesion hole to contact the first encapsulation layer through the adhesion hole.

The locating of the encapsulation structure may further include locating an adhesion-promoting layer above the first encapsulation layer, wherein the second encapsulation layer is above the adhesion-promoting layer, and wherein the adhesion-promoting layer is patterned with the second encapsulation layer to form the adhesion hole therethrough.

The second encapsulation layer may include a negative photoresist material, wherein the adhesion-promoting layer includes a material including at least one functional group selected from among —H, —CH, —CH$_2$, —CH$_3$, —F, —CF, —CF$_2$ or —CF$_3$.

The spacer may include multiple spacers spaced apart from one another by a distance associated with a distance between two or more of the emission areas, and having a width that is less than a width of an upper portion of the pixel-defining layer, wherein the patterned second multi-layer is above a part of the pixel-defining layer, and wherein the adhesion holes respectively overlap with other parts of the pixel-defining layer and the spacers.

The spacer may have a width that is less than a width of an upper portion of the pixel-defining layer in the non-emission area, wherein the patterned second multi-layer is in the non-emission area.

The adhesion hole may overlap with the spacer.

The method may further include patterning the spacer in the non-emission area such that remaining spacers are above a part of the second multi-layer and are spaced apart from one another by a distance associated with a distance between two or more of the emission areas, wherein the adhesion holes overlap with other parts of the second multi-layer and the spacers.

The method may further include locating sacrificial layers respectively above the anode electrodes, and removing at least a part of the sacrificial layers is removed to expose central portions of the anode electrodes, wherein the bank buffer layer is spaced apart from an upper portion of edges of the anode electrodes.

The method may further include removing a part of the sacrificial layers such that other parts of the sacrificial layers remain between the bank buffer layer and the anode electrodes, and such that the bank buffer layer has an edge extending past the other parts of the sacrificial layers.

As a result, leakage current between adjacent emission areas by the second common layer can be suppressed, so that deterioration of the display quality of the display device due to the leakage current can be reduced or prevented.

In addition, a first encapsulation layer of the encapsulation structure for reducing or preventing permeation of oxygen or moisture into the emissive layer of an inorganic insulating material is in contact with the first multi-layer. In this manner, the emissive layer of each emission area can be more reliably encapsulated by adhesion between the inorganic materials by the first encapsulation layer and the first multi-layer.

In addition, the first encapsulation layer may be in contact with the second multi-layer. In this manner, the emissive layer on the spacer can be individually encapsulated by the first encapsulation layer and the second multi-layer. Therefore, even if the spacer is damaged such that a penetration path of oxygen or moisture is generated in the emissive layer on the spacer, it is possible to decrease or prevent the penetration path of oxygen or moisture from expanding to the emissive layer in the emission area adjacent to the spacer. Accordingly, deterioration in the display quality, and decrease in lifetime of the display device due to damage to the spacer, can be reduced or prevented.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
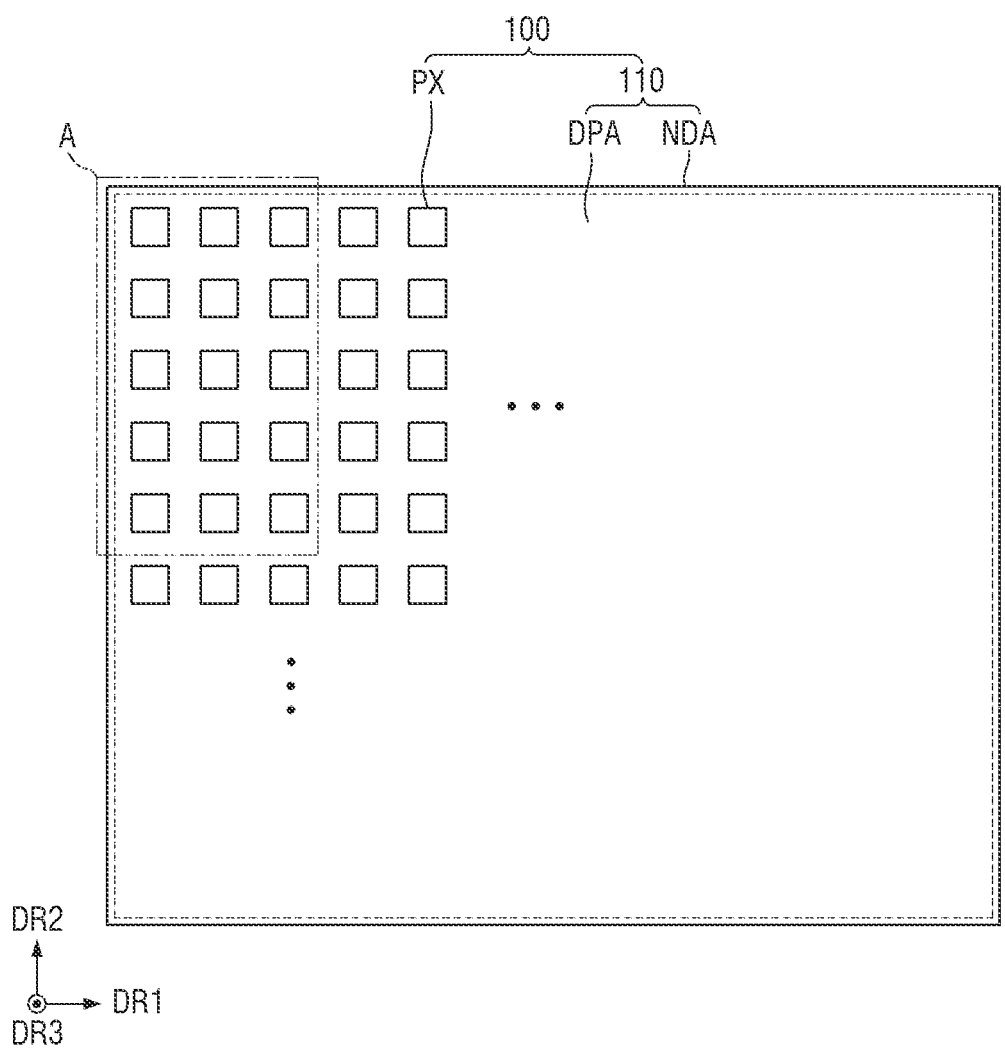
FIG. 1 is a plan view showing a display device according to one or more embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B. Similarly, expressions such as "at least one of," "a plurality of," "one of," and other prepositional phrases, when preceding a list of elements, modify the entire list of elements and do not modify the individual elements of the list.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first," "second," etc. may also be used herein to differentiate different categories or sets of elements. For conciseness, the terms "first," "second," etc. may represent "first-category (or first-set)," "second-category (or second-set)," etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, embodiments of the present disclosure will be described in detail with reference to the accompanying drawings.

Figure 2:
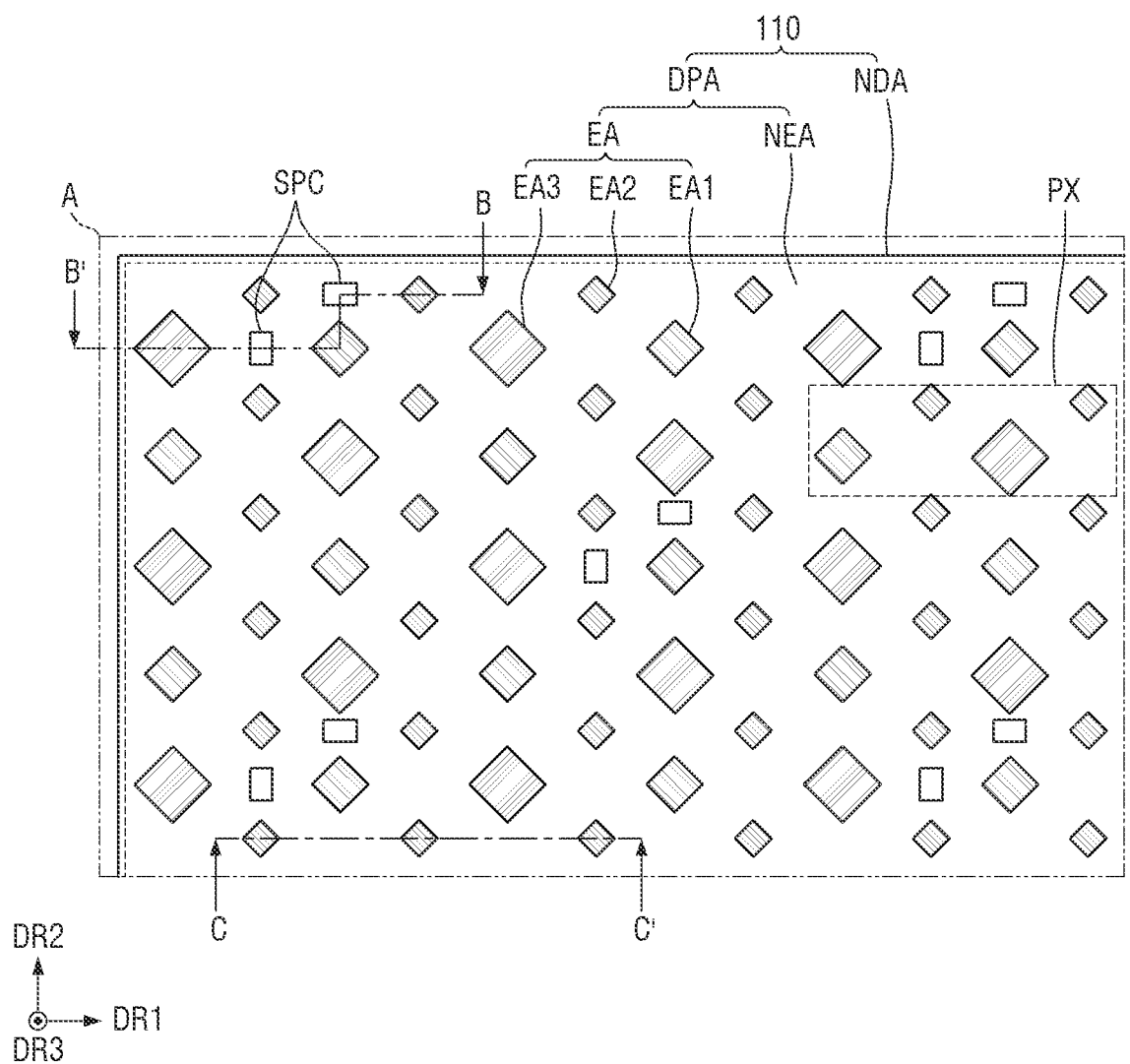
FIG. 2 is an enlarged plan view showing an example of portion A of FIG. 1.

FIG. 1 is a plan view showing a display device according to one or more embodiments of the present disclosure. FIG. 2 is an enlarged plan view showing an example of portion A of FIG. 1.

Referring to FIG. 1, a display device 100 according to one or more embodiments of the present disclosure may be formed in a flat panel shape. A display device 10 according to one or more embodiments of the present disclosure is for displaying moving images or still images. The display device 1 may be used as the display screen of portable electronic devices, such as a mobile phone, a smart phone, a tablet PC, a smart watch, a watch phone, a mobile communications terminal, an electronic notebook, an electronic book, a portable multimedia player (PMP), a navigation device and a ultra-mobile PC (UMPC), as well as the display screen of various products, such as a television, a notebook, a monitor, a billboard and the Internet of Things.

The display device 100 may be a light-emitting display device including light-emitting elements. For example, the display panel 100 may be at least one of an organic light-emitting display device using organic light-emitting diodes as light-emitting elements, a micro light-emitting element diode display device using micro-LEDs as light-emitting elements, a quantum-dot organic light-emitting diode display device using quantum dots and organic light-emitting diodes, and/or an inorganic light-emitting display device using an inorganic semiconductor as a light-emitting element. In the following description, an organic light-emitting display device is employed as the display device 100.

For example, the display device 100 may be formed in a rectangular plane having longer sides in the first direction DR1, and shorter sides in the second direction DR2 intersecting the first direction DR1. Each of the corners where a longer side in the first direction DR1 meets a shorter side in the second direction DR2 may be rounded with a curvature (e.g., predetermined curvature) or may be a right angle. The shape of the display device 100 when viewed from the top is not limited to a quadrangular shape, but may be formed in another polygonal shape, circular shape, or elliptical shape. The display device 100 may be formed flat, but is not limited thereto. For example, the display device 100 may include curved portions that are formed at left and right ends and that have a constant curvature or varying curvatures.

In addition, the display device 100 may be flexible so that it can be curved, bent, folded, or rolled.

The display device 100 may include a substrate 110 including a display area DPA where images are displayed, a non-display area NDA around the display area DPA, and a plurality of pixels PX arranged in the display area DPA on the substrate 110.

In the display area DPA, light is output to display images. The display area DPA may have a circular shape, an oval shape, or a polygonal shape. The display area DPA may be selected as a central portion of the substrate 110.

In the non-display area NDA surrounding the display area DPA, no image is displayed. The non-display area NDA may be selected as the area between the border of the display area DPA and the border of the substrate 110.

The plurality of pixels PX may be arranged in a matrix in the first direction DR1 and in the second direction DR2. Each of the plurality of pixels PX may be a unit for individually representing various colors including white.

Referring to FIG. 2, the display area DPA of the substrate 110 may include a plurality of emission areas EA arranged in parallel with one another, and a non-emission area NEA between the plurality of emission areas EA.

Each of the plurality of emission areas EA may be a unit area for emitting light of one of two or more different colors with its own luminance.

For example, the plurality of emission areas EA may include first emission areas EA1 for emitting light of a first color in a wavelength band (e.g., predetermined wavelength band), second emission areas EA2 for emitting light of a second color in a wavelength band that is lower than that of the first color, and third emission areas EA3 for emitting light of a third color in a wavelength band that is lower than that of the second color.

For example, the first color may be red in a wavelength band of about 600 nm to about 750 nm, the second color may be green in a wavelength band of about 480 nm to about 560 nm, and the third color may be blue in a wavelength band of about 370 nm to about 460 nm. It should be noted that this is merely illustrative. The wavelength bands of lights emitted from the first, second, and third emission areas EA1, EA2 and EA3 according to one or more embodiments of the present disclosure are not limited thereto.

Each of the plurality of pixels PX may include two or more emission areas EA that emit lights of different respective colors and that are located adjacent to each other. That is, lights of various colors represented by the plurality of pixels PX may be achieved by mixing of lights emitted from two or more emission areas EA.

For example, as shown in FIG. 2, the arrangement of the plurality of emission areas EA may include columns in which the first emission areas EA1 and the third emission areas EA3 are arranged alternately in the first direction DR1 and/or in the second direction DR2, and columns in which the second emission areas EA2, which are diagonally adjacent to the first emission areas EA1 and the third emission areas EA3, are arranged in the first direction DR1 or the second direction DR2.

In this instance, each of the plurality of pixels PX may include one first emission area EA1 and one third emission area EA3 adjacent to each other in the first direction DR1 or the second direction DR2, and two second emission areas EA2 adjacent to them in a respective diagonal direction.

As another example, in one or more other embodiments, the arrangement of the plurality of emission areas EA may include first columns in which first emission areas EA1 are arranged in one of the first direction DR1 and the second direction DR2, second columns in which second emission areas EA2 are arranged in one direction, and third columns in which third emission areas EA3 are arranged in one direction. The first, second, and third columns may be arranged sequentially and repeatedly in the other one of the first direction DR1 and the second direction DR2. In this instance, each of the plurality of pixels PX may include one first emission area EA1, one second emission area EA2, and one third emission area EA3 adjacent to one another in the other direction.

It should be noted that this is merely illustrative. The arrangement of the plurality of emission areas EA and the configuration of each of the plurality of pixels PX are not limited to the foregoing descriptions.

In addition, as shown in FIG. 2, among the plurality of emission areas EA, the third emission area EA3 may be the largest. The first emission area EA1 may be less than the third emission area EA3 and may be larger than the second emission area EA2. The second emission areas EA2 may be the smallest, and may be twice the number of each of the first and third emission areas EA1 and EA3. In this manner, it is possible to easily represent the third color of high luminance, and the visibility of the second color can be lowered. It should be understood, however, that the present disclosure is not limited thereto. The sizes and numbers of the first, second, and third emission areas EA1, EA2 and EA3 are not limited to those shown in FIG. 2, but may be changed variously.

The display device 100 according to one or more embodiments may further include a spacer SPC located at a certain location in the non-emission area NEA. The spacer SPC serves to support a mask for locating (e.g., disposing) an emission layer EML (see FIG. 4) of each of the plurality of emission areas EA.

There may be a plurality of spacers SPC, which are spaced apart from one another by a distance substantially equal to the distance between the two or more emission areas EA. For example, as shown in FIG. 2, among the plurality of spacers SPC, two spacers SPC in parallel with each other in the first direction DR1 may be spaced apart from each other with the four second emission areas EA2 therebetween. In addition, among the plurality of spacers SPC, two spacers SPC in parallel with each other in the second direction DR2 may be spaced apart from each other with the four second emission areas EA2 therebetween.

The arrangement of the spacers SPC is not limited to that shown in FIG. 2, but may be variously changed. For example, the spacers SPC may be arranged in parallel with the first emission area EA1 or the third emission area EA3. Alternatively, the spacers SPC may be arranged in a grid pattern conforming to the non-emission area NEA.

Figure 3:
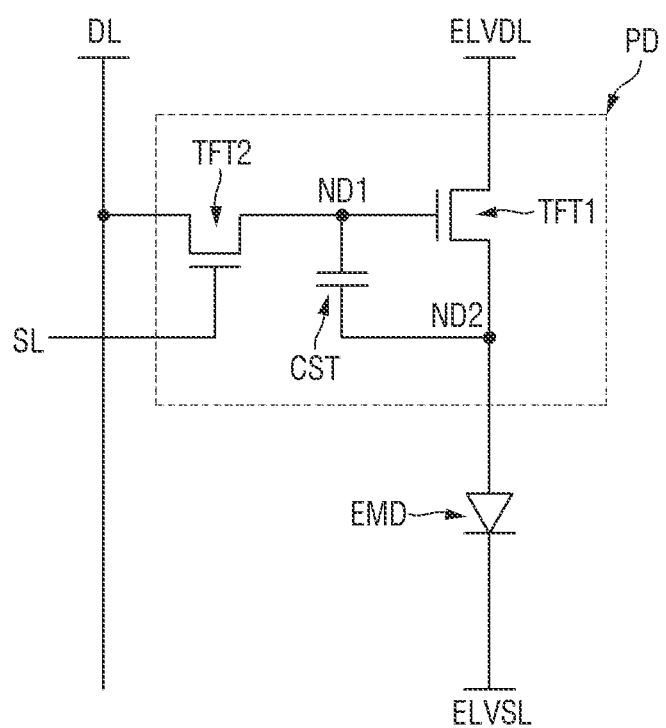
FIG. 3 is an equivalent circuit diagram showing an example of one of the emission areas shown in FIG. 2.

FIG. 3 is an equivalent circuit diagram showing an example of one of the emission areas shown in FIG. 2.

According to one or more embodiments of the present disclosure, the display device 100 may include a plurality of pixel drivers PD respectively associated with a plurality of emission areas EA (see FIG. 2).

The plurality of pixel drivers PD may respectively supply driving currents to the plurality of light-emitting elements EMD associated with the plurality of emission areas EA.

Referring to FIG. 3, each of the plurality of pixel drivers PD may have a 2T1C structure including two transistors and one capacitor. It should be noted that FIG. 3 shows only an example, and the pixel driver PD according to one or more embodiments is not limited to that shown in FIG. 3 but may be altered in a variety of ways.

The light-emitting element EMD of each emission area EA may be an organic light-emitting diode including an emissive layer of an organic light-emitting material interposed between an anode electrode and a cathode electrode facing each other.

The pixel driver PD of each emission area EA may include a first transistor TFT1, a second transistor TFT2, and a storage capacitor CST.

The first transistor TFT1 may be connected in series with the light-emitting element EMD between a first supply voltage line ELVDL for supplying a first supply voltage (e.g., predetermined first supply voltage) for driving the light-emitting element EMD, and a second supply voltage line ELVSL for supplying a second supply voltage having a level lower than that of the first supply voltage.

In other words, the first transistor TFT1 may be located between the first supply voltage line ELVDL and the light-emitting element EMD.

The second transistor TFT2 may be located between a data line DL and the gate electrode of the first transistor TFT1. The gate electrode of the second transistor TFT2 may be connected to a scan line SL.

When the second transistor TFT2 is turned on based on a scan signal from the scan line SL, the second transistor TFT2 transfers a data signal from the data line DL to a first node ND1. The first node ND1 is a contact point between the gate electrode of the first transistor TFT1 and the second transistor TFT2.

The storage capacitor CST may be located between the first node ND1 and a second node ND2. The second node ND2 is a contact point between the first transistor TFT1 and the light-emitting element EMD.

The storage capacitor CST is charged with the data signal supplied to the first node ND1, and stores a voltage difference between the first node ND1 and the second node ND2.

The gate electrode of the first transistor TFT1 is connected to the first node ND1. When the first transistor TFT1 is turned on based on the data signal supplied to the first node ND1, a driving current corresponding to a voltage difference between the gate electrode and the first electrode may be output to the second electrode. Accordingly, the light-emitting element EMD may emit light having a luminance corresponding to the driving current of the first transistor TFT1.

A period in which the first transistor TFT1 is turned on may be associated with a charging voltage of the storage capacitor CST.

Although each of the first and second transistors TFT1 and TFT2 is implemented as an n-type MOSFET (metal oxide semiconductor field effect transistor) in the example shown in FIG. 3, this is merely illustrative. That is, at least one of the first and second transistors TFT1 and/or TFT2 may be a p-type MOSFET.

Figure 4:
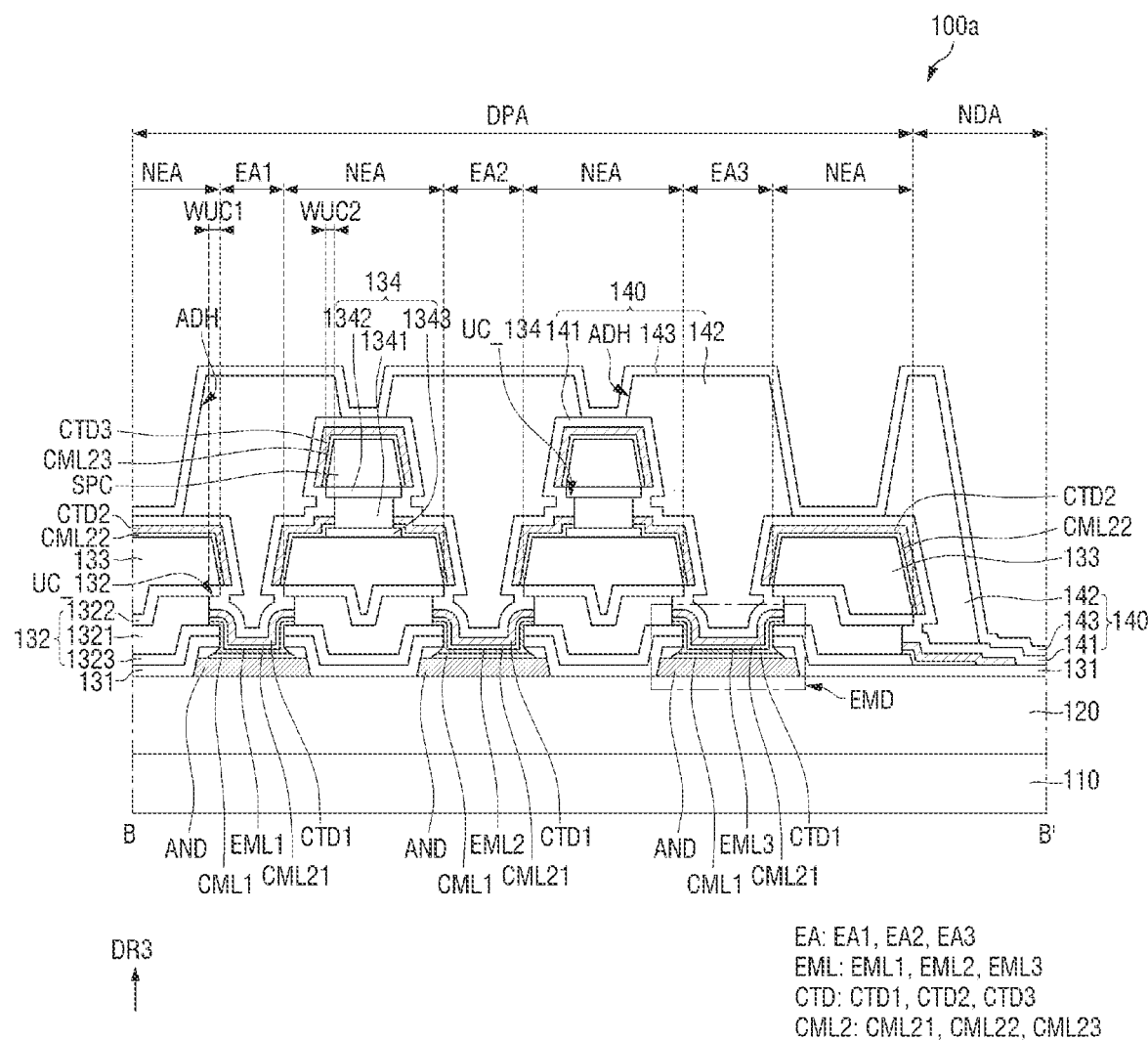
FIG. 4 is a view showing an example of a cross section of a display device according to one or more embodiments, taken along the line B-B' of FIG. 2.
Figure 5:
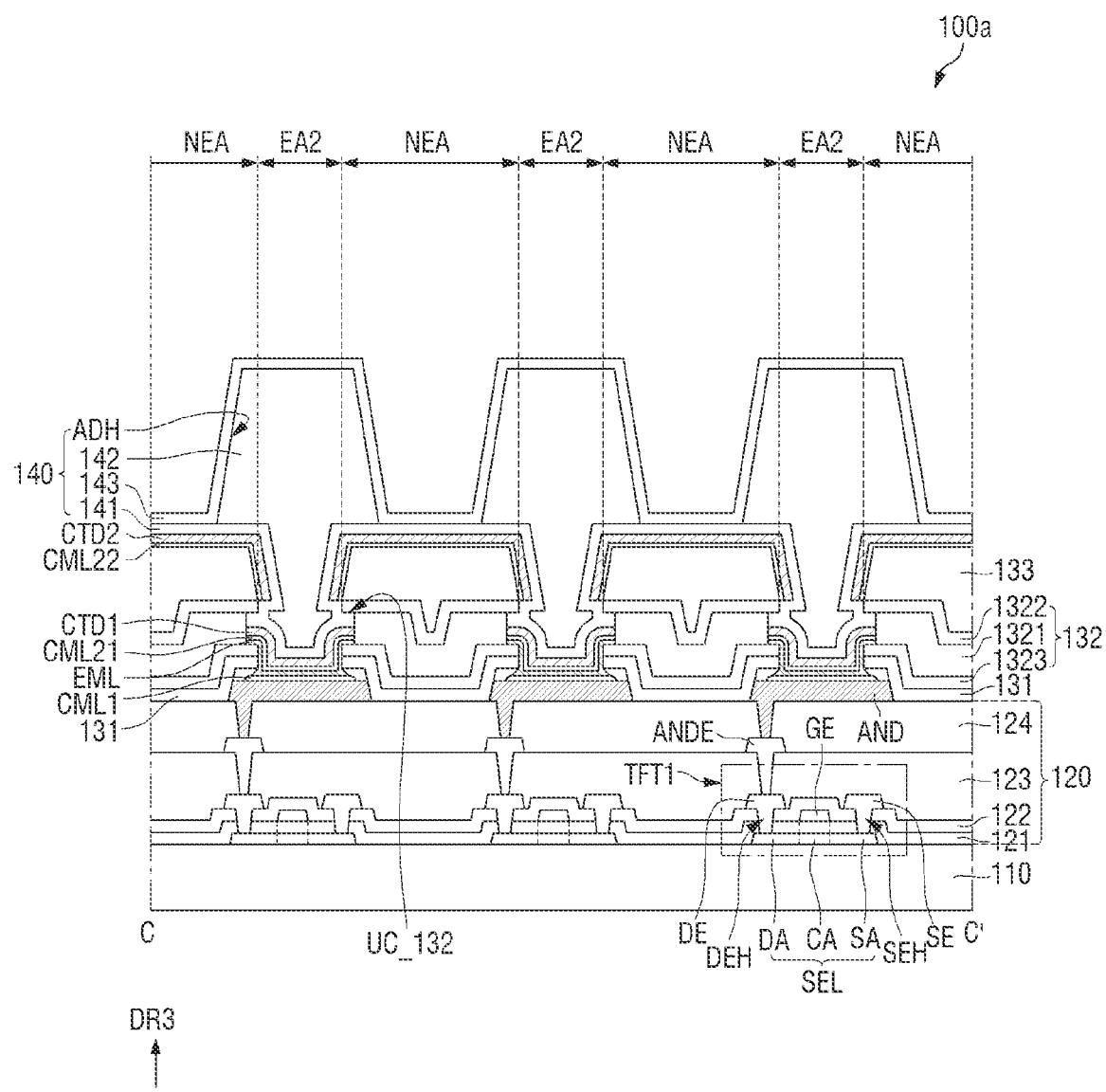
FIG. 5 is a view showing an example of a cross section of the display device according to the one or more other embodiments corresponding to FIG. 4, taken along the line C-C' of FIG. 2.

FIG. 4 is a view showing an example of a cross section of a display device according to one or more other embodiments, taken along the line B-B' of FIG. 2. FIG. 5 is a view showing an example of a cross section of the display device according to the one or more other embodiments corresponding to FIG. 4, taken along the line C-C' of FIG. 2.

Referring to FIG. 4, a display device 100a according to one or more embodiments includes a substrate 110 including a plurality of emission areas EA, a non-emission area NEA between the plurality of emission areas EA, a plurality of anode electrodes AND located on the substrate 110 and respectively associated with the plurality of emission areas EA, a bank buffer layer 131 located in the non-emission area NEA on the substrate 110 and covering edges of each of the plurality of anode electrodes AND, a first multi-layer 132 located on the bank buffer layer 131, made up of a stack of two or more different metal materials 1321, 1322, and 1323 and including an undercut structure UC_132, a pixel-defining layer 133 located on the first multi-layer 132, a second multi-layer 134 located on the pixel-defining layer 133, made up of a stack of two or more different metal materials 1341, 1342, and 1343 and including an undercut structure UC_134, and a spacer SPC located on the second multi-layer 134.

In addition, the display device 100a of the one or more embodiments corresponding to FIG. 4 may further include a plurality of first common layers CML1 located on the plurality of anode electrodes AND, respectively, a plurality of emissive layers EML located on the plurality of first common layers, respectively, a second common layer CML2 covering the plurality of emissive layers EML, the pixel-defining layer 133, and the spacer SPC, the second common layer CML2 being located in the plurality of emission areas EA, and a cathode electrode CTD located on the second common layer CML2 and located across the plurality of emission areas EA.

Accordingly, in each of the plurality of emission areas EA, a light-emitting element EMD may be formed, which consists of an anode electrode AND and a cathode electrode CTD facing each other, and a first common layer CML1, an emissive layer EML, and a second common layer CML2 interposed between the anode electrode AND and the cathode electrode CTD and sequentially stacked on one another.

Each of the plurality of first common layers CML1 may include a hole transport layer made of an organic material. That is, each of the plurality of first common layers CML1 may be made of an organic material having a property of transporting holes supplied from the respective one of the anode electrodes AND to the emissive layer EML.

In addition, each of the plurality of first common layers CML1 may further include a hole injection layer located between the hole transport layer and the corresponding anode electrode AND.

The second common layer CML2 may include an electron transport layer made of an organic material. For example, the second common layer CML2 may be made of an organic material having a property of transporting electrons supplied from the cathode electrode CTD to the emissive layer EML.

In addition, the second common layer CML2 may further include an electron injection layer located between the corresponding cathode electrode CTD and the electron transport layer.

The plurality of emission areas EA may include a first emission area EA1 associated with a first color, a second emission area EA2 associated with a second color, and a third emission area EA3 associated with a third color.

The emissive layer EML may include a first emissive layer EML1 associated with the first emission area EA1 for emitting light of the first color, a second emissive layer EML2 associated with the second emission area EA2 for emitting light of the second color, and a third emissive layer EML3 associated with the third emission area EA3 for emitting light of the third color.

The first emissive layer EML1 may be located between the anode electrode AND and the cathode electrode CTD of the first emission area EA1.

The second emissive layer EML2 may be located between the anode electrode AND and the cathode electrode CTD of the second emission area EA2.

The third emissive layer EML3 may be located between the anode electrode AND and the cathode electrode CTD of the third emission area EA3.

The substrate 110 may include an insulating material. For example, the substrate 110 may be made of an insulating material, such as glass, quartz, and/or a polymer resin. Examples of the polymer resin may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), and/or a combination thereof.

The substrate 110 may be made of a rigid material to sufficiently support the elements located on one surface thereof.

Alternatively, to easily change the shape of the display device 100a, the substrate 110 may be made of a flexible material that is easily deformable, such as bending, folding, and/or rolling.

Alternatively, the substrate 110 may be made of a metal material.

The display device 100a according to the one or more embodiments corresponding to FIG. 4 may further include a circuit layer 120 located on the substrate 110 and including a plurality of pixel drivers PD (see FIG. 3) respectively associated with the plurality of emission areas EA. The pixel drivers PD are connected to the anode electrodes AND, respectively.

The plurality of anode electrodes AND and the bank buffer layer 131 may be located on the circuit layer 120.

The circuit layer 120 will be described in detail later with reference to FIG. 5.

A plurality of anode electrodes AND associated with the plurality of emission areas EA may be located on the circuit layer 120, and may be respectively connected to the pixel drivers PD of the circuit layer 120.

Each of the plurality of anode electrodes AND may include at least one low-resistance metal material selected from the group consisting of: copper (Cu), silver (Ag), magnesium (Mg), aluminum (Al), platinum (Pt), lead (Pb), palladium (Pd), gold (Au), nickel (Ni), neodymium (Nd), iridium (Ir), chrome (Cr), lithium (Li), calcium (Ca), or a mixture thereof.

Alternatively, each of the plurality of anode electrodes AND may have a structure in which a conductive layer made of a low-resistance metal material and a conductive layer made of a transparent conductive material are stacked on one another. For example, each of the plurality of anode electrodes AND may have a multi-layer structure, such as ITO/Mg, ITO/MgF, ITO/Ag, and/or ITO/Ag/ITO.

The bank buffer layer 131 may be located on the circuit layer 120 in the non-emission area NEA, and may cover the edge of each of the plurality of anode electrodes AND.

The bank buffer layer 131 may include at least one inorganic insulating material among silicon nitride, aluminum nitride, zirconium nitride, titanium nitride, hafnium nitride, tantalum nitride, silicon oxide, aluminum oxide, titanium oxide, tin oxide, and silicon oxynitride.

The bank buffer layer 131 may have a thickness of about 1,500 Å to about 2,000 Å.

As the bank buffer layer 131 of the inorganic insulating material is located, the time point when the cathode electrode CTD is exposed to the outgas from the organic insulating material located in the circuit layer 120 can be delayed. As a result, oxidation of the cathode electrode CTD can be delayed, and thus, decrease in the lifetime of the display device 100a can be reduced or prevented.

The bank buffer layer 131 may be spaced apart from the edges of each of the plurality of anode electrodes AND in the third direction DR3. That is, the bank buffer layer 131 may cover the edges of each of the plurality of anode electrodes AND in the form of eaves. For example, the bank buffer layer 131 may be in an undercut structure such that is has an edge protruding from a sacrificial layer that is removed from the plurality of anode electrodes AND.

The first multi-layer 132 located on the bank buffer layer 131 may be electrically insulated from the plurality of anode electrodes AND by the bank buffer layer 131.

The first multi-layer 132 is located between the bank buffer layer 131 and the pixel-defining layer 133, and includes the undercut structure UC_132.

The first multi-layer 132 may include a first main layer 1321 made of a metal material (e.g., predetermined metal material), and a first cover layer 1322 located on the first main layer 1321 and made of a metal material that is different from that of the first main layer 1321.

As the first cover layer 1322 is wider than the first main layer 1321 (e.g., in plan view), the edge of the first cover layer 1322 protrudes from the first main layer 1321. The first multi-layer 132 including the first cover layer 1322 and the first main layer 1321 may have the undercut structure UC_132.

The undercut structure UC_132 of the first multi-layer 132 may be achieved by an electrochemical corrosion effect (galvanic corrosion effect) of the first main layer 1321. To this end, the first cover layer 1322 may be made of a different metal material that has a different corrosion potential relative to the metal material of the first main layer 1321.

For example, the first main layer 1321 may be made of copper (Cu) or aluminum (Al). In this instance, the first cover layer 1322 may be made of titanium (Ti) or molybdenum (Mo). That is, the first multi-layer 132 may be made up of a double layer of one of Ti/Cu, Mo/Cu, Ti/Al, and Mo/Al.

In addition, the first multi-layer 132 may further include a first support layer 1323 located between the bank buffer layer 131 and the first main layer 1321, and made of a metal material that is different from that of the first main layer 1321.

To induce an electrochemical corrosion effect (galvanic corrosion effect) of the first main layer 1321, the first support layer 1323 may be made of a different type of metal material having a corrosion potential difference relative to the metal material of the first main layer 1321.

For example, when the first main layer 1321 is made of copper (Cu) or aluminum (Al), the first support layer 1323 may be made of titanium (Ti) or molybdenum (Mo) like the first cover layer 1322. That is, the first multi-layer 132 may be made up of a triple layer of one of Ti/Al/Ti, Ti/Cu/Ti, Mo/Al/Mo, and Mo/Cu/Mo. Alternatively, the first cover layer 1322 and the first support layer 1323 of the first multi-layer 132 may be made of different metal materials.

Because the bank buffer layer 131 is covered with the first support layer 1323, it is possible to reduce or prevent the likelihood of damage to the bank buffer layer 131 during the process of transforming the first multi-layer 132 into the undercut structure.

As the pixel-defining layer 133 is located on the first multi-layer 132, it lies in the non-emission area NEA like the first multi-layer 132.

The pixel-defining layer 133 may be made of an organic insulating material. For example, the pixel-defining layer 133 may be made of at least one of an organic insulating material, such as polyacrylate resin, epoxy resin, phenolic resin, polyamide resin, polyimide resin, unsaturated polyesters resin, poly phenylene ether resin, poly phenylene sulfide resin, and/or benzocyclobutene (BCB).

The second multi-layer 134 is located between the pixel-defining layer 133 and the spacer SPC, and includes an undercut structure UC_134.

The second multi-layer 134 may have a smaller width than the upper portion of the pixel-defining layer 133 (e.g., in plan view). By doing so, it is possible to reduce or prevent the likelihood of the second multi-layer 134 and the spacer SPC limiting the light emission range of each of the emission areas EA adjacent to the second multi-layer 134 and the spacer SPC.

According to the one or more other embodiments corresponding to FIG. 4, the second multi-layer 134 may be located in the non-emission area NEA. A plurality of second multi-layers 134 may be arranged such that they are spaced apart from one another by a distance substantially equal to the distance between two or more emission areas among the plurality of emission areas EA.

The second multi-layer 134 may include a second main layer 1341 made of a metal material (e.g., predetermined metal material), and a second cover layer 1342 located on the first main layer 1341 and made of a metal material that is different from that of the second main layer 1341.

As the second cover layer 1342 is wider than the second main layer 1341 (e.g., in plan view), the edge of the second cover layer 1342 protrudes from the second main layer 1341. The second multi-layer 134 including the second cover layer 1342 and the second main layer 1341 may have the undercut structure UC_134.

The undercut structure UC_134 of the second multi-layer 134 may be achieved by an electrochemical corrosion effect (galvanic corrosion effect) of the second main layer 1341. To this end, the second cover layer 1342 may be made of a different metal material that has a corrosion potential that is different relative to the metal material of the second main layer 1341.

For example, the second main layer 1341 may be made of copper (Cu) or aluminum (Al). In this instance, the second cover layer 1342 may be made of titanium (Ti) or molybdenum (Mo). That is, the second multi-layer 134 may be made up of a double layer of one of Ti/Cu, Mo/Cu, Ti/Al, and Mo/Al.

In addition, the second multi-layer 134 may further include a second support layer 1343 located between the bank buffer layer 131 and the second main layer 1341, and made of a metal material that is different from that of the second main layer 1341.

To induce an electrochemical corrosion effect (galvanic corrosion effect) of the second main layer 1341, the second support layer 1343 may be made of a different type of metal material having a different corrosion potential than the metal material of the second main layer 1341.

For example, when the second main layer 1341 is made of copper (Cu) or aluminum (Al), the second support layer 1343 may be made of titanium (Ti) or molybdenum (Mo), like the second cover layer 1342. That is, the second multi-layer 134 may be made up of a triple layer of one of Ti/Al/Ti, Ti/Cu/Ti, Mo/Al/Mo, and Mo/Cu/Mo. Alternatively, the second cover layer 1342 and the second support layer 1343 of the second multi-layer 134 may be made of different metal materials.

The spacer SPC may be located on the second multi-layer 134, and may be located in the same shape as the second multi-layer 134 when viewed from the top/in plan view. That is, like the second multi-layer 134, the spacer SPC may be located in the non-emission area NEA. A plurality of spacers SPC may be arranged such that they are spaced apart from one another by a distance substantially equal to the distance between two or more emission areas among the plurality of emission areas EA.

The spacer SPC may be made of an organic insulating material. For example, the spacer SPC may be made of at least one of an organic insulating material, such as polyacrylate resin, epoxy resin, phenolic resin, polyamide resin, polyimide resin, unsaturated polyesters resin, poly phenylene ether resin, poly phenylene sulfide resin, and/or benzocyclobutene (BCB).

The first common layers CML1 lie in the emission areas EA, respectively, and are located on the anode electrodes AND, respectively. Each of the plurality of first common layers CML1 may include a hole transport layer that transports holes generated by the anode electrode AND to the emissive layer EML.

The emissive layers EML lie in the emission areas EA, respectively, and are located on the first common layers CML1, respectively. The plurality of emissive layers EML may include a first emissive layer EML1 associated with the first emission area EA1, a second emissive layer EML2 associated with the second emission area EA2, and a third emissive layer EML3 associated with the third emission area EA3. The first emissive layer EML1, the second emissive layer EML2, and the third emissive layer EML3 may include dopant materials or host materials corresponding to different colors to emit light of different colors, respectively.

The second common layer CML2 may be located across the plurality of emission areas EA and is located on the emissive layers EML, the pixel-defining layer 134 and the spacer SPC. The second common layer CML2 may include an electron transport layer that transports electrons from the cathode electrodes CTD to the emissive layer EML.

The cathode electrodes CTD lie in the emission areas EA, respectively, and are located on the second common layers CML2, respectively. The cathode electrodes CTD may include a transparent metal oxide material, such as ITO, IZO, and/or IGZO.

Because the second multi-layer 134 under the spacer SPC and the first multi-layer 132 under the pixel-defining layer 133 have undercut structures UC_134 and UC_132, respectively, the second common layer CML2 and the cathode electrode CTD located on the pixel-defining layer 133 are separated from those on the spacer SPC by the undercut structures.

That is, by the undercut structure UC_132 of the first multi-layer 132, the second common layer CML21 and the cathode electrode CTD1 located on each of the plurality of emissive layers EML can be separated from the second common layer CML22 and the cathode electrode CTD2 located on the pixel-defining layer 133.

To this end, for the undercut structure UC_132 of the first multi-layer 132, the width WUC1 by which the first cover layer 1322 protrudes from, or extends past, the first main layer 1321 (e.g., in plan view) may be in the range of about 0.3 μm to about 0.7 μm.

If the width WUC1 by which the first cover layer 1322 protrudes from the first main layer 1321 is less than about 0.3 μm, the second common layer CML2 and the cathode electrode CTD may not be sufficiently separated by the undercut structure UC_132 of the first multi-layer 132.

If the width WUC1 by which the first cover layer 1322 protrudes from the first main layer 1321 is greater than about 0.7 μm, the protruding edge of the first cover layer 1322 may be more easily broken.

In addition, to reduce or prevent the likelihood of the first cover layer 1322 being easily broken, the first cover layer 1322 may have a thickness of about 700 Å or more. It should be understood that this is merely illustrative. The thickness of the first cover layer 1322 may be changed depending on the material and the protruding width.

As such, by the undercut structure UC_132 of the first multi-layer 132, the second common layer CML21 on the emissive layer EML is separated so that it is located in each of the plurality of emission areas EA. Accordingly, it is possible to reduce or prevent a leakage current through the second common layer CML21 from being generated between the adjacent emission areas EA. Therefore, it is possible to reduce or prevent deterioration of display quality, such as color purity and contrast ratio, due to such leakage current.

In addition, the cathode electrode CTD1 that is located in each of the emission areas EA and on each of the emissive layers EML is in contact with the nearby first multi-layer 132. That is, the cathode electrode CTD1 may be separated such that it is located in each of the plurality of emission areas EA by the undercut structure UC_132 of the first multi-layer 132, and may be electrically connected to the first multi-layer 132. As such, the first multi-layer 132 may be used as a line for connecting the cathode electrodes CTD1 of each of the emission areas EA.

By the undercut structure UC_134 of the second multi-layer 134, the second common layer CML23 and the cathode electrode CTD3 located on the spacer SPC can be effectively separated from the second common layer CML22 and the cathode electrode CTD2 located on the pixel-defining layer 133.

To this end, for the undercut structure UC_134 of the second multi-layer 134, the width WUC2 by which the second cover layer 1342 protrudes from, or extends past, the second main layer 1341 (e.g., in plan view) may be in the range of about 0.3 μm to about 0.7 μm.

If the width WUC2 by which the second cover layer 1342 protrudes from the second main layer 1341 is less than about 0.3 μm, the second common layer CML2 and the cathode electrode CTD may not be suitably separated by the undercut structure UC_134 of the second multi-layer 134.

If the width WUC2 by which the second cover layer 1342 protrudes from the second main layer 1341 is greater than about 0.7 μm, the protruding edge of the second cover layer 1342 may be more easily broken.

In addition, to reduce or prevent the likelihood of the second cover layer 1342 being easily broken, the second cover layer 1342 may have a thickness of about 700 Å or more. It should be understood that this is merely illustrative. The thickness of the second cover layer 1342 may be changed depending on the material and the protruding width.

In this manner, even if a permeation path of oxygen or moisture is created due to damage to the spacer SPC, the permeation path may affect only the second common layer CML23 on the spacer SPC, which is in an island shape and is separated from the periphery. That is, it is possible to decrease or prevent a permeation path of oxygen or moisture due to damage to the spacer SPC from being extended to the emission areas EA around the spacer SPC. As a result, it is possible to reduce or prevent a decrease in the display quality and/or a decrease in the lifetime of the display device 100a.

According to the one or more other embodiments corresponding to FIG. 4, the display device 100a may further include an encapsulating structure 140 located on the cathode electrode CTD.

The encapsulating structure 140 is for encapsulating the emissive layer EML so that permeation of oxygen or moisture into the emissive layer EML made of an organic light-emitting material is blocked.

The encapsulating structure 140 may include a first encapsulating layer 141 located on the cathode electrode CTD, a second encapsulating layer 142 located on the first encapsulating layer 141, and a third encapsulating layer 143 located on the second encapsulating layer 132, and may define an adhesion hole ADH penetrating through the second encapsulating layer 142.

The first encapsulating layer 141 and the third encapsulating layer 143 are made of an inorganic insulating material. For example, each of the first encapsulating layer 141 and the third encapsulating layer 143 may be made up of multiple layers in which one or more inorganic layers of a silicon nitride layer, a silicon oxynitride layer, a silicon oxide layer, a titanium oxide layer, and an aluminum oxide layer are alternately stacked on one another.

The first encapsulating layer 141 may be made of an inorganic insulating material deposited by chemical vapor deposition (CVD). Accordingly, the first encapsulating layer 141 may be in contact with each of the first multi-layer 132 and the second multi-layer 134.

For bonding each of the first multi-layer 132 and the second multi-layer 134 with the first encapsulation layer 141, each of the thickness of the first main layer 1321 of the first multi-layer 132, and the thickness of the second main layer 1341 of the second multi-layer 134, may be in a range that exceeds the sum of the thickness of the second common layer CML2 and the thickness of the cathode electrode CTD.

For example, the first encapsulation layer 141 may be in contact with a part of the side portion of the first multi-layer 132 that is located between the bank buffer layer 131 and the pixel-defining layer 133 and that has the undercut structure UC_132.

Accordingly, each of the plurality of emissive layers EML may be individually encapsulated by the bonding between the side of the first multi-layer 132 and the first encapsulation layer 141 (e.g., by the bonding between inorganic materials). As a result, the emissive layer EML can be encapsulated more reliably, thereby reducing or preventing a decrease in the lifetime of the display device 100a.

In addition, the first encapsulation layer 141 may be in contact with a part of the side portion of the second multi-layer 134 that is located between the pixel-defining layer 133 and the spacer SPC and that has the undercut structure UC_134.

In this manner, the second common layer CML23 and the cathode electrode CTD3 on the spacer SPC can be individually encapsulated by the bonding between the side portion of the second multi-layer 134 and the first encapsulation layer 141 (e.g., by the bonding between inorganic materials). Therefore, it is possible to more reliably block the permeation path of oxygen or moisture, which is due to damage to the spacer SPC, from extending to the periphery. As a result, it is possible to reduce or prevent the likelihood of rapid deterioration of the display quality and/or the likelihood of rapid decrease in the lifetime due to damage to the spacer SPC.

The second encapsulating layer 142 is made of an organic insulating material. To reduce damage to organic materials, such as the first common layer CML1, the emissive layer EML, and the second common layer CML2, the second encapsulating layer 142 may be made of a curable organic film that can be cured with low temperature heat or light at a low temperature. For example, the second encapsulating layer 142 may be made of a negative photoresist material including an acrylic resin or a monomer acrylate photo initiator cross linker surfactant.

The adhesion hole ADH is formed in the non-emission area NEA, and penetrates through the second encapsulating layer 142.

The bank buffer layer 131 and the pixel-defining layer 133 are located in the non-emission area NEA. A plurality of second multi-layers 134 spaced apart from one another is located on a part of the pixel-defining layer 133. Spacers SPC are located on the second multi-layers 134, respectively.

Accordingly, the adhesion holes ADH formed in the non-emission area NEA may overlap with a plurality of spacers SPC located on a part of the pixel-defining layer 133, and may overlap the other part of the pixel-defining layer 133 where the spacers SPC are not located.

In other words, due to the adhesion holes ADH formed in the non-emission area NEA, the second encapsulating layer 142 may be located only in the plurality of emission areas EA and in a part of the periphery thereof.

The third encapsulating layer 143 is located on the second encapsulating layer 142 and covers the adhesion hole ADH. Accordingly, the third encapsulating layer 143 of the inorganic insulating material may be in contact with the first encapsulating layer 141 through the adhesion hole ADH. That is, the emission areas EA can be individually encapsulated as the first encapsulating layer 141 and the third encapsulation layer 143 are bonded together with the second encapsulation layer 142 therein. Accordingly, it is possible to suppress the permeation path of oxygen or moisture from being extended to adjacent emission areas, so that it is possible to reduce or prevent a decrease in the lifetime of the display device 100a.

Incidentally, as described above, the display device 100a according to the one or more embodiments corresponding to FIG. 4 further includes the circuit layer 120 located on the substrate 110. The circuit layer 120 may include a plurality of pixel drivers PD (see FIG. 3) associated with the plurality of emission areas EA, respectively.

The plurality of pixel drivers PD may be connected to the plurality of anode electrodes AND, respectively, and may include at least one thin-film transistor TFT1 and TFT2 (see FIG. 3).

Referring to FIG. 5, the first thin-film transistor TFT1 of each of the plurality of pixel drivers PD formed in the plurality of emission areas EA, respectively, may include a semiconductor layer SEL, a gate electrode GE overlapping a channel region CA of the semiconductor layer SEL, and a source electrode SE and a drain electrode DE respectively connected to a source region SA and a drain region DA of the semiconductor layer SEL.

In one or more other embodiments, the second thin-film transistor TFT2 of each of the plurality of pixel drivers PD may also have the same structure as the first thin-film transistor TFT1. It should be understood, however, that this is merely illustrative. The second thin-film transistor TFT2 may have a structure that is different from that of the first thin-film transistor TFT1. For example, the semiconductor layer of the second thin-film transistor TFT2 may be formed of a different material, and may be located on a different layer from the semiconductor layer SEL of the first thin-film transistor TFT1.

The circuit layer 120 may include a gate insulator 121 covering the semiconductor layer SEL, an interlayer dielectric layer 122 covering the gate electrode GE on the gate insulator 121, and at least one via layer 123 and 124 covering the source electrode SE and the drain electrode DE on the interlayer dielectric layer 122.

For example, at least one via layer of the circuit layer 120 may include a first via layer 123 covering the source electrode SE and the drain electrode DE, an anode connection electrode ANDE located on the first via layer 123 and connected to the drain electrode DE of the first transistor TFT1 through a hole penetrating the first via layer 123, and a second via layer 124 covering the anode connection electrode ANDE.

The semiconductor layer SEL may include silicon semiconductor, such as polycrystalline silicon, monocrystalline silicon, low-temperature polycrystalline silicon, and/or amorphous silicon.

Each of the gate electrode GE, the source electrode SE, the drain electrode DE, and the anode connection electrode ANDE may be made up of a single layer or multiple layers of one or more of molybdenum (Mo), aluminum (Al), chromium (Cr), gold (Au), titanium (Ti), nickel (Ni), neodymium (Nd), and/or copper (Cu), and/or an alloy thereof.

Each of the gate insulator 121 and the interlayer dielectric layer 122 may be formed of a silicon nitride layer, a silicon oxynitride layer, a silicon oxide layer, a titanium oxide layer, or an aluminum oxide layer.

Each of the first via layer 123 and the second via layer 124 may be formed of an organic layer, such as an acryl resin, an epoxy resin, a phenolic resin, a polyamide resin, and/or a polyimide resin.

Although each of the both the first multi-layer 132 and the second multi-layer 134 are made up of a triple layer in the example shown in FIGS. 4 and 5, this is merely illustrative. One of the first multi-layer 132 and the second multi-layer 134 may be made up of a double layer.

FIGS. 6 to 11 are cross-sectional views showing examples of cross sections of display devices according to one or more other embodiments, taken along the line B-B' of FIG. 2.

Figure 6:
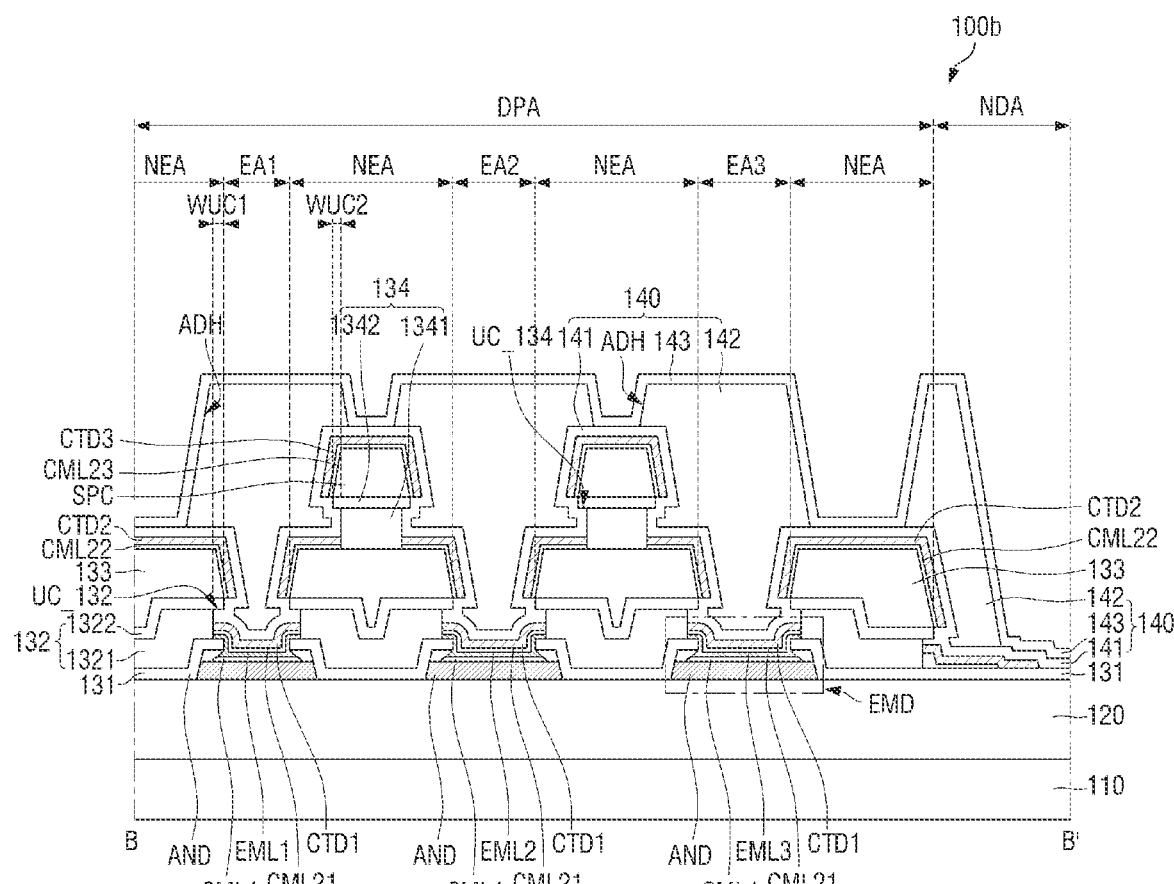
FIGS. 6 to 11 are cross-sectional views showing examples of cross sections of display devices according to one or more embodiments, taken along the line B-B' of FIG. 2.

A display device 100b according to one or more other embodiments corresponding to FIG. 6 is substantially identical to the display device 100a according to the one or more embodiments corresponding to FIGS. 4 and 5, except that a first multi-layer 132 is made up of a double layer of a first main layer 1321 and a first cover layer 1322, and a second multi-layer 134 is made up of a double layer of a second main layer 1341 and a second cover layer 1342.

The first multi-layer 132 and the second multi-layer 134 may be for providing the undercut structures UC_132 and UC_134, respectively. The undercut structures UC_132 and UC_134 may be formed by a double layer made of different types of metal materials. Therefore, the undercut structures UC_132 and UC_134 can still be formed even if each of the first multi-layer 132 and the second multi-layer 134 is made up of a double layer, as shown in FIG. 6.

In such case, there is an advantage in reducing the complexity of the process for locating (e.g., disposing, placing, or arranging) the first multi-layer 132 and the second multi-layer 134.

Figure 7:
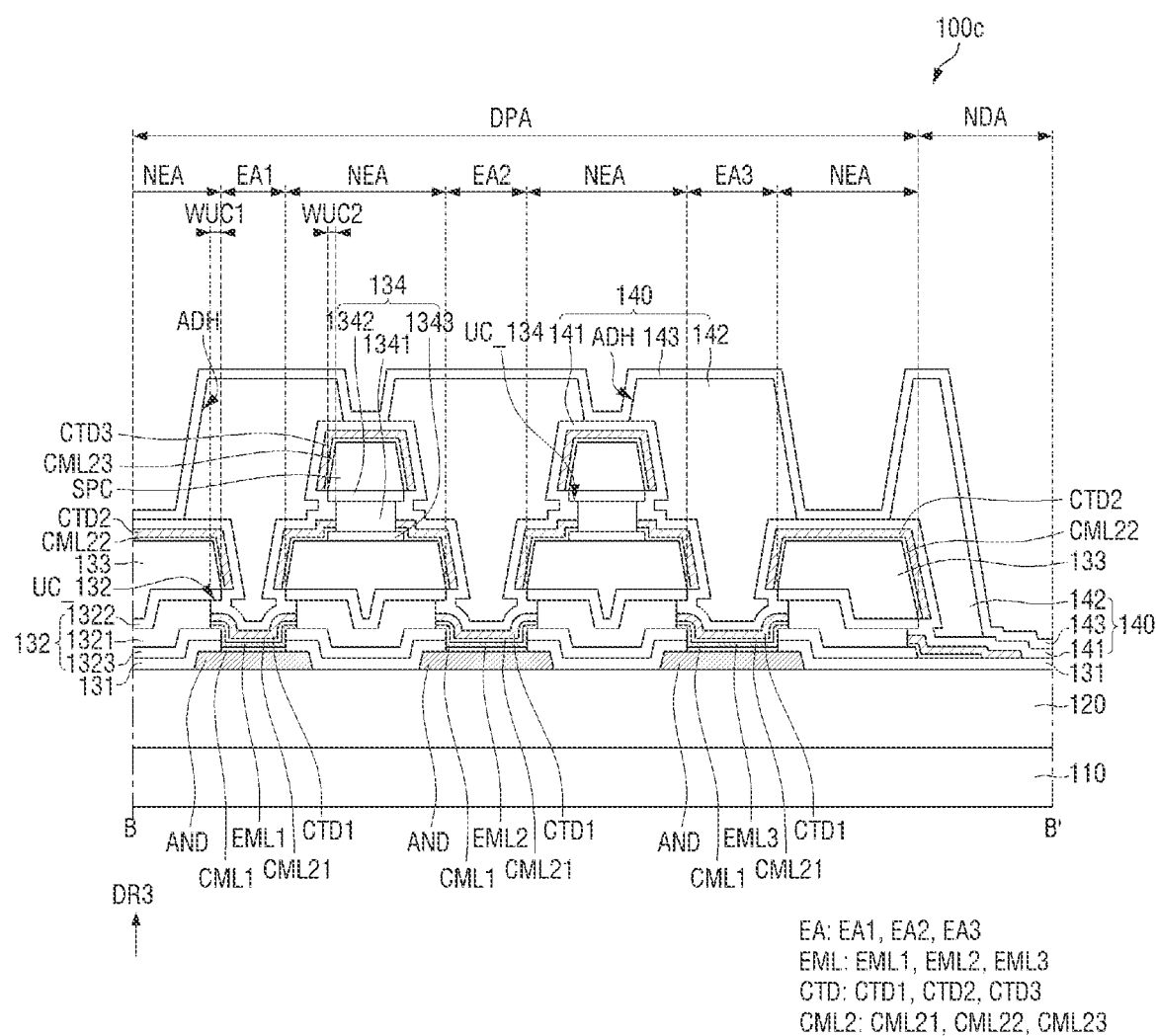

A display device 100c according to one or more other embodiments corresponding to FIG. 7 is substantially identical to the display device 100a according to the one or more embodiments corresponding to FIGS. 4 and 5, except that a bank buffer layer 131 is in contact with upper portions of edges of a plurality of anode electrodes AND, and, therefore, the redundant descriptions will be omitted.

The undercut structure of the bank buffer layer 131 of the display device 100a according to the one or more embodiments corresponding to FIGS. 4 and 5 is formed as a result of a sacrificial layer for protecting the surfaces of the plurality of anode electrodes AND.

Accordingly, when the anode electrodes AND are made of a conductive material that is not affected by the process of transforming the first multi-layer 132 and the second multi-layer 134 into the undercut structures UC_132 and UC_134, the sacrificial layer may be omitted. As a result, the bank buffer layer 131 may not be located in the undercut structure, and may be in contact with the upper portions of the edges of the anode electrodes AND.

In this manner, the sacrificial layer can be eliminated, and thus there is an advantage in reducing the complexity of the fabrication process.

Figure 8:
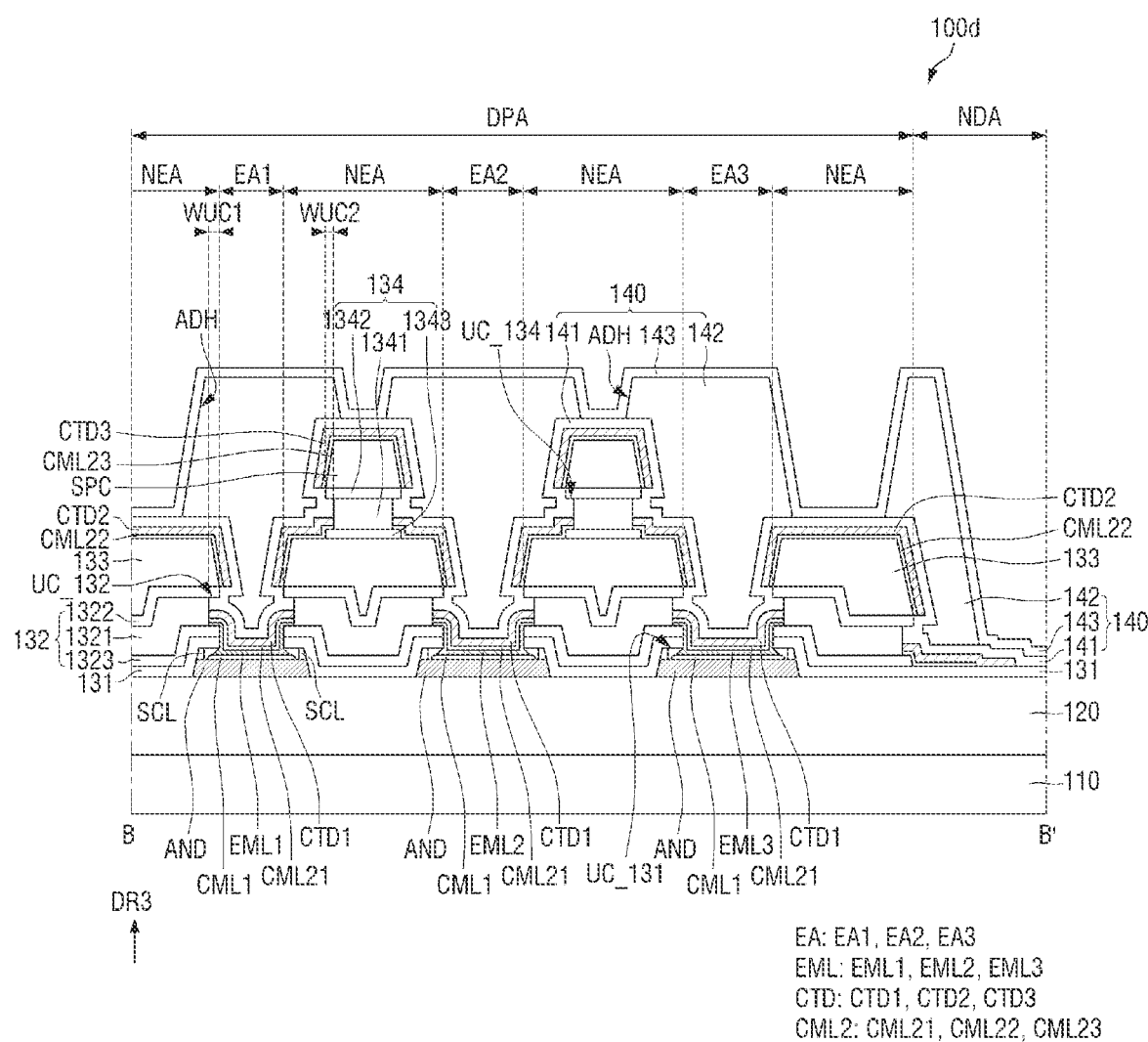

A display device 100d according to one or more other embodiments corresponding to FIG. 8 is substantially identical to the display device 100a according to the one or more embodiments corresponding to FIGS. 4 and 5, except that the display device 100d further includes a sacrificial layer SCL remaining between the edges of the plurality of anode electrodes AND and the bank buffer layer 131, and, therefore, the redundant descriptions will be omitted.

In the process of transforming the first multi-layer 132 and the second multi-layer 134 into the undercut structures UC_132 and UC_134, the sacrificial layer SCL on each of the plurality of anode electrodes AND may not be completely removed when reaching the target ranges of the widths WUC1 and WUC2 by which the edges of the first and second cover layers 1322 and 1342 protrude.

When this happens, the sacrificial layer SCL may remain between the edges of the plurality of anode electrodes AND and the bank buffer layer 131, as shown in FIG. 8. The edge of the bank buffer layer 131 protrudes from the remaining sacrificial layer SCL. That is, the bank buffer layer 131 has an undercut structure UC_131 relative to the remaining sacrificial layer SCL.

Figure 9:
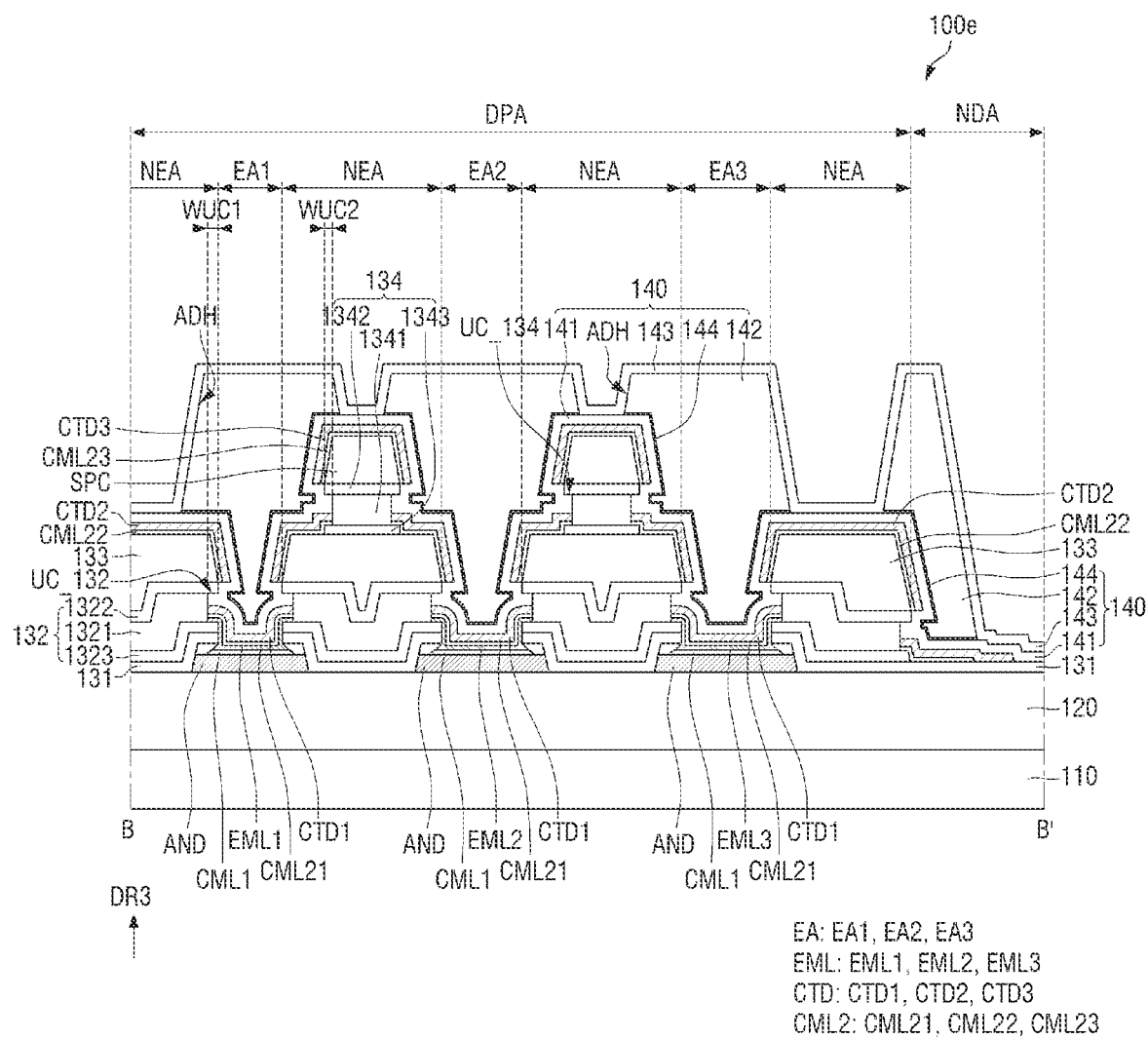

A display device 100e according to one or more other embodiments corresponding to FIG. 9 is substantially identical to the display device 100a according to the one or more embodiments corresponding to FIGS. 4 and 5, except that an encapsulation encapsulating structure 140 further includes an adhesion-promoting layer 144 located between a first encapsulation layer 141 and a second encapsulation layer 142, and, therefore, the redundant descriptions will be omitted.

The adhesion-promoting layer 144 is for facilitating adhesion between the first encapsulation layer 141 and the second encapsulation layer 142 made of different materials.

For example, on the curvature of the first encapsulation layer 141 conforming to an undercut structure UC_132 of a first multi-layer 132 and an undercut structure UC_134 of a second multi-layer 134, the second encapsulation layer 142 may not easily spread.

To address this, according to the one or more other embodiments corresponding to FIG. 9, an adhesion-promoting layer 144 is located between the first encapsulation layer 141 and the second encapsulation layer 142, which is made of a semi-permeable material having a surface energy similar to that of the organic insulating material of the second encapsulation layer 142.

For example, when the second encapsulation layer 142 is made of a negative photoresist material, the adhesion-promoting layer 144 may be made of a material including at least one functional group among —H, —CH, —CH$_2$, —CH$_3$, —F, —CF, —CF$_2$ and —CF$_3$, which can be relatively easily combined with an organic material.

As described above, according to the one or more other embodiments corresponding to FIG. 9, as the encapsulation structure 140 further includes the adhesion-promoting layer 144, the first encapsulation layer 141 can be completely covered with the second encapsulation layer 142 more reliably, and the permeation of moisture into the encapsulation structure 140 can be blocked more reliably.

Figure 10:
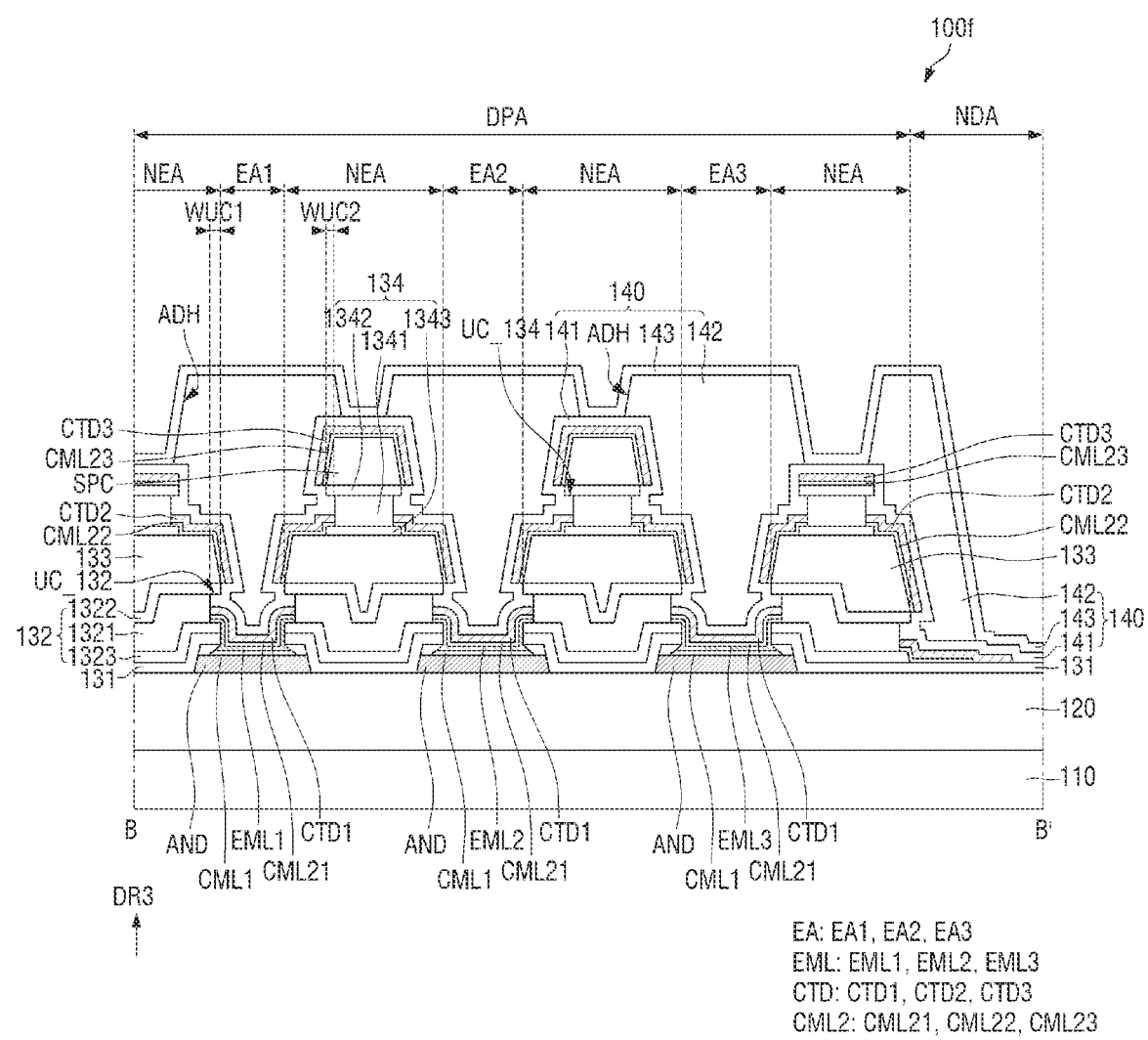

A display device 100f according to one or more other embodiments corresponding to FIG. 10 is substantially identical to the display device 100a according to the one or more embodiments corresponding to FIGS. 4 and 5, except that a second multi-layer 134 is located in the non-emission area NEA, and, therefore, the redundant descriptions will be omitted.

For example, the second multi-layer 134 of the display device 100f according to the one or more other embodiments corresponding to FIG. 10 is located not just at some locations of the non-emission area NEA, but is instead located at all locations of the non-emission area NEA.

In addition, the second multi-layer 134 may have a smaller width than the upper portion of a pixel-defining layer 133 (e.g., in plan view).

There may be a plurality of spacers SPC on some of the second multi-layers 134 such that they are spaced apart from one another. In this instance, adhesion holes ADH of the encapsulation structure 140 may overlap the plurality of spacers SPC and other parts of the second multi-layers 134.

In this manner, at least a part of the center of the upper portion of the pixel-defining layer 133 is covered with the second multi-layer 134, so that it does not directly face the mask for locating the emissive layer EML. Accordingly, it is possible to reduce or prevent the likelihood of damage to the upper portion of the pixel-defining layer 133 due to physical contact with the mask. Accordingly, it is possible to more effectively reduce or prevent the introduction of foreign matter, which may thus improve the lifetime of the display device 100f.

Figure 11:
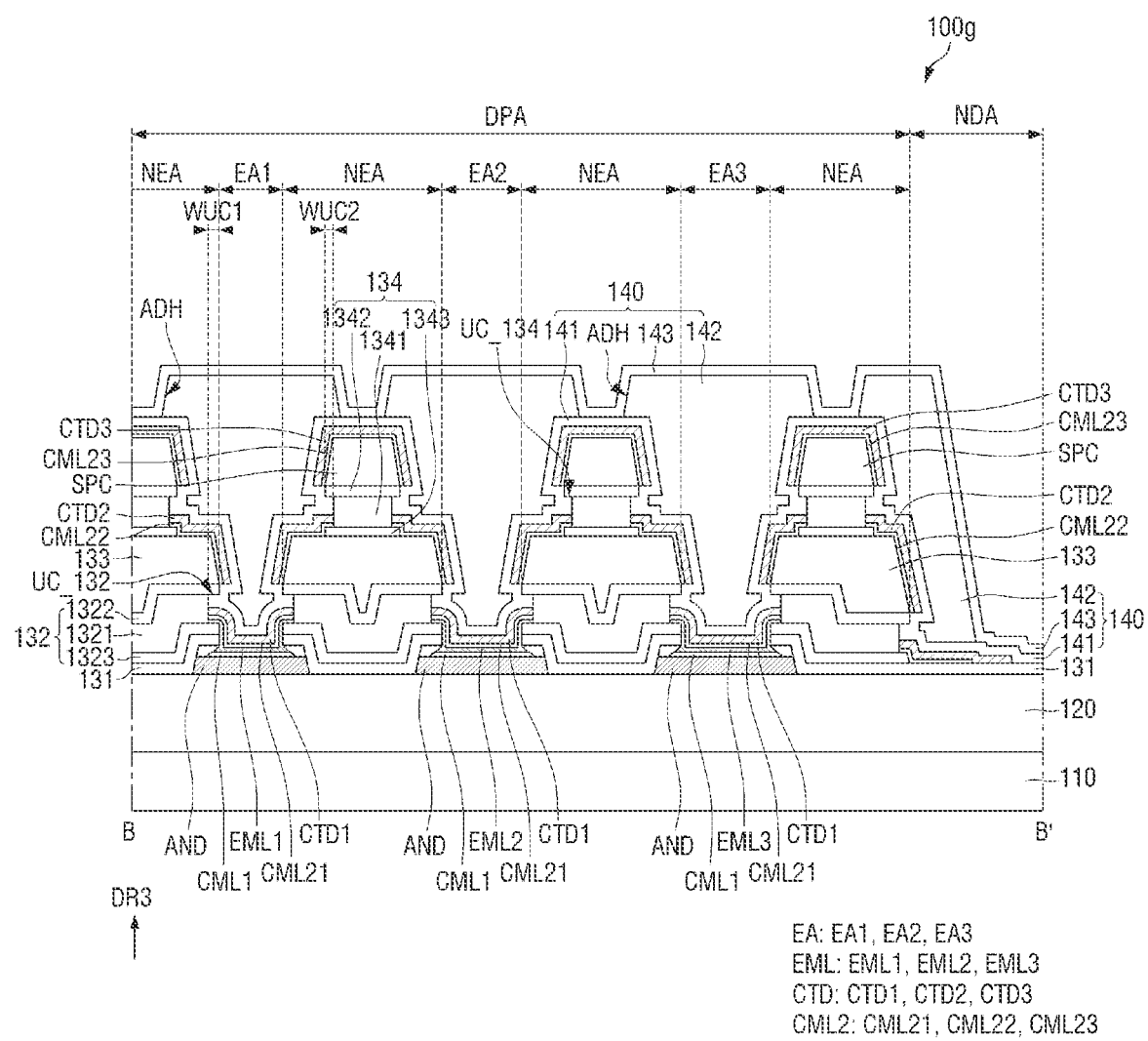

A display device 100g according to one or more other embodiments corresponding to FIG. 11 is substantially identical to the display device 100f according to the one or more other embodiments corresponding to FIG. 10, except that a spacer SPC is located in the non-emission area NEA, and, therefore, the redundant descriptions will be omitted.

According to the one or more other embodiments corresponding to FIG. 11 of the present disclosure, the spacer SPC of the display device 100g is located not only at some locations of the non-emission area NEA but at every location of the non-emission area NEA.

That is, according to the one or more other embodiments corresponding to FIG. 11, a second multi-layer 134 and a spacer SPC are located on at least a part of the center of the upper portion of the pixel-defining layer 133.

Accordingly, a mask for locating the emissive layer EML can be supported by the spacer SPC located every location of the non-emission area NEA of the display area DPA, so that it is possible to more reliably reduce or prevent the likelihood of sagging of the mask.

Accordingly, it is possible to more effectively reduce or prevent the introduction of foreign matter, which may thus further improve the lifetime of the display device 100g.

Hereinafter, a method of fabricating a display device according to one or more embodiments of the present disclosure will be described.

Figure 12:
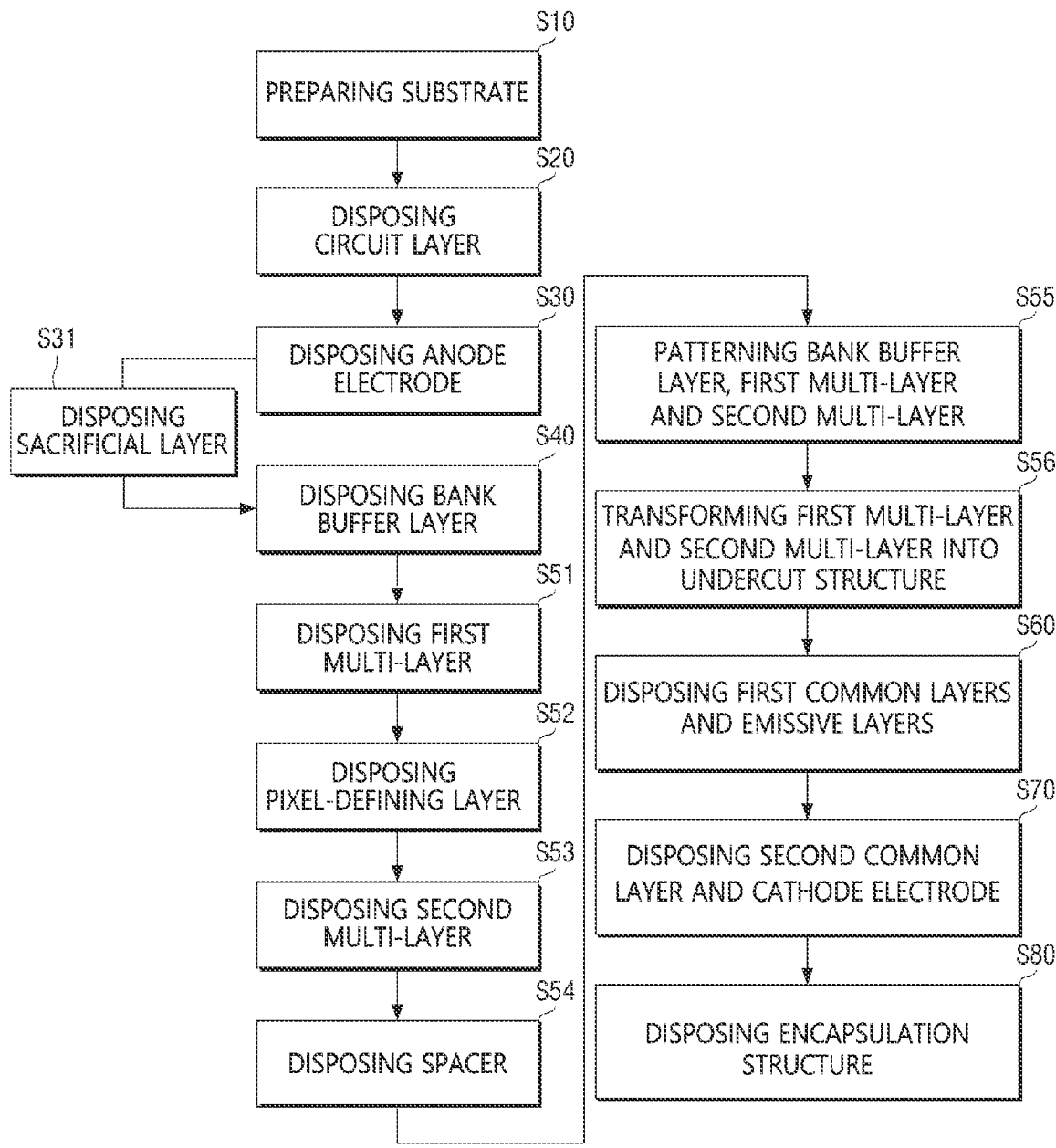
FIG. 12 is a flowchart for illustrating a method of fabricating a display device according to one or more embodiments of the present disclosure.
Figure 13:
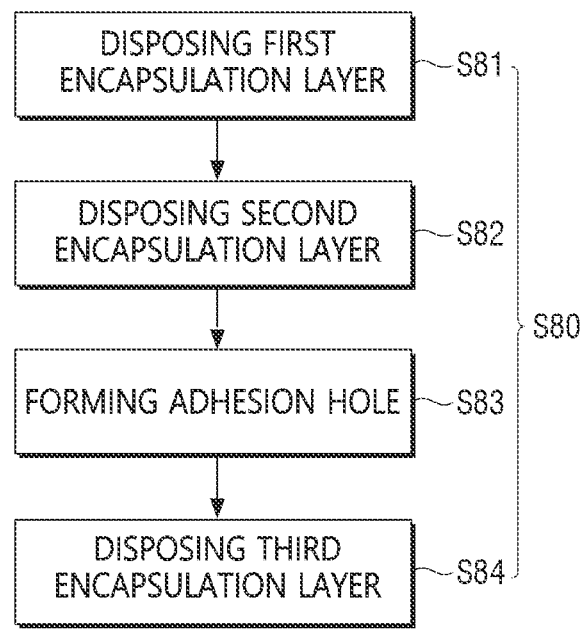
FIG. 13 is a flowchart for illustrating processing steps of locating the encapsulation structure of FIG. 12.

FIG. 12 is a flowchart for illustrating a method of fabricating a display device according to one or more embodiments of the present disclosure. FIG. 13 is a flowchart for illustrating processing steps of locating the encapsulation structure of FIG. 12. FIGS. 14 to 30 are views showing some of the processing steps of the flowcharts of FIGS. 12 and 13 according to the one or more embodiments corresponding to FIGS. 4, 6, 7, and/or 8.

Referring to FIG. 12, a method of fabricating a display device according to one or more embodiments of the present disclosure may include preparing a substrate 100 including a plurality of emission areas EA for displaying images, and including a non-emission area NEA between the plurality of emission areas EA (operation S10), locating a circuit layer 120 including a plurality of pixel drivers PD respectively associated with the plurality of emission areas EA on the substrate 110 (operation S20), locating a plurality of anode electrodes AND located in the plurality of emission areas EA, respectively, on the circuit layer 120 (operation S30), locating a bank buffer layer 131 covering the plurality of anode electrodes AND on the circuit layer 120 (operation S40), locating a first multi-layer 132 made up of a stack of two or more different metal materials on the bank buffer layer 131 (operation S51), locating a pixel-defining layer 133 in the non-emission area NEA on the first multi-layer 132 (operation S52), locating a second multi-layer 134 covering the pixel-defining layer 133 and comprising a stack of two or more different metal materials on the first multi-layer 132 (operation S53), locating a spacer SPC located in at least a part of the non-emission area NEA on the second multi-layer 134 (operation S54), patterning the bank buffer layer 131, the first multi-layer 132, and the second multi-layer 134 using the pixel-defining layer 133 and the spacer SPC as masks (operation S55), transforming the patterned first multi-layer 132 and the patterned second multi-layer 134 into undercut structures UC_132 and UC_134 to expose central portions of the plurality of anode electrodes AND (operation S56), locating a plurality of first common layers CML1 and a plurality of emissive layers EML respectively located in the plurality of emission areas EA on the plurality of anode electrodes AND (operation S60), locating a second common layer CML2 and a cathode electrode CTD covering the plurality of emissive layers EML, the pixel-defining layer 133, and the spacer SPC and located in the plurality of emission areas EA, respectively (operation S70), and locating an encapsulation structure 140 on the cathode electrode CTD (operation S80).

The method according to one or more embodiments may further include locating a plurality of sacrificial layers SCL on a plurality of anode electrodes AND, respectively, before the locating of the bank buffer layer 131 (operation S31).

In this instance, in the process of transforming the first multi-layer 132 and the patterned second multi-layer 134 into the undercut structures UC_132 and UC_134, a part of each of the plurality of sacrificial layers SCL is removed, so that a part of the center of each of the plurality of anode electrodes AND may be exposed. In addition, by the removed sacrificial layer SCL, the bank buffer layer 131 may be spaced apart from the upper portion of the edge of each of the plurality of anode electrodes AND.

Referring to FIG. 13, the locating of the encapsulation structure 140 at operation S80 may include locating a first encapsulation layer 141 of an inorganic insulating material on the cathode electrode CTD (operation S81), locating a second encapsulation layer 142 of an organic insulating material on the first encapsulation layer 141 (operation S82), patterning the second encapsulation layer 142 to form an adhesion hole ADH located in the non-emission area NEA (operation S83), and locating a third encapsulation layer 143 of an inorganic insulating material covering the second encapsulation layer 142 and the adhesion hole ADH on the first encapsulation layer 141 (operation S84).

Figure 14:
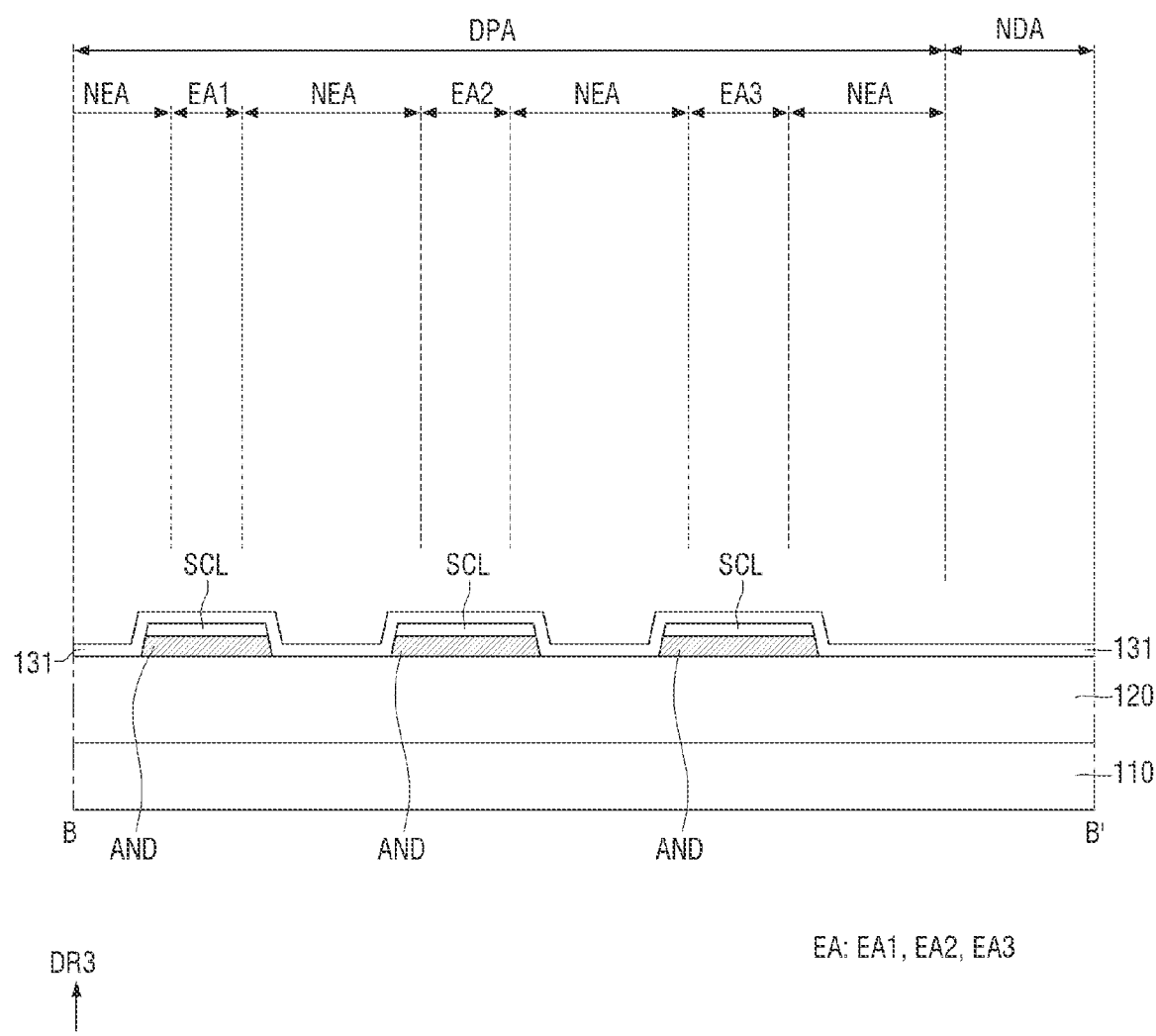
FIGS. 14 to 30 are views showing some of the processing steps of the flowcharts of FIGS. 12 and 13 according to the one or more embodiments corresponding to FIGS. 4, 6, 7, and/or 8.

Referring to FIG. 14, a substrate 110 including a display area DPA where images are displayed is prepared (operation S10), and a circuit layer 120 is located on the substrate 110 (operation S20).

As shown in FIGS. 3 and 5, the circuit layer 120 may include a plurality of pixel drivers PD respectively associated with a plurality of emission areas EA, and each of the plurality of pixel drivers PD may include one or more thin-film transistors TFT1 and TFT2.

Each of the plurality of pixel drivers PD may include a first transistor TFT1 connected to an anode electrode AND of a light-emitting element EMD.

The first transistor TFT1 may include a semiconductor layer SEL located on the substrate 110, a gate electrode GE located on a gate insulator 121 covering the semiconductor layer SEL and overlapping with a channel region CA of the semiconductor layer SEL, and a source electrode SE and a drain electrode DE located on an interlayer dielectric layer 122 covering the gate electrode GE and connected to a source region SA and a drain region DA of the semiconductor layer SEL, respectively.

The circuit layer 120 may further include a first via layer 123 covering the source electrode SE and the drain electrode DE, an anode connection electrode ANDE located on the first via layer 123 and connected to the drain electrode DE, and a second via layer 124 covering the anode connection electrode ANDE.

In addition, the circuit layer 120 may further include/define holes in line with some of the anode connection electrodes ANDE and penetrating through the second via layer 124.

As shown in FIGS. 1 and 2, the display area DPA includes a plurality of emission areas EA arranged in the first direction DR1 and in the second direction DR2, and a non-emission area NEA that is a space therebetween.

In addition, the substrate 110 may further include a non-display area NDA surrounding the display area DPA.

By patterning a conductive layer on the circuit layer 120, a plurality of anode electrodes AND may be located in the emission areas EA, respectively (operation S30). For example, the plurality of anode electrodes AND may be made up of a single layer including at least one low-resistance metal material selected from the group consisting of copper (Cu), silver (Ag), magnesium (Mg), aluminum (Al), platinum (Pt), lead (Pb), palladium (Pd), gold (Au), nickel (Ni), neodymium (Nd), iridium (Ir), chrome (Cr), lithium (Li), calcium (Ca), and/or a mixture thereof, or may be made up of a multi-layer structure of a low-resistance metal material and a transparent conductive material.

In addition, a plurality of sacrificial layers SCL may be located on the plurality of anode electrodes AND, respectively (operation S31). The sacrificial layers SCL may be made of a transparent conductive material that is different from the uppermost layer of the anode electrodes AND. For example, the sacrificial layers SCL may be made of at least one of indium gallium zinc oxide (IGZO), indium tin zinc oxide (ITZO), and/or indium zinc oxide (IZO). The sacrificial layers SCL may have a thickness of about 500 Å, which is less than that of the anode electrodes AND and the bank buffer layer 131.

Alternatively, in one or more embodiments, by patterning a conductive layer and a transparent conductive material layer sequentially stacked on the circuit layer 120 altogether, a plurality of anode electrodes AND and a plurality of sacrificial layers SCL may be formed.

Subsequently, by stacking an inorganic insulating material on the front surface of the circuit layer 120, a bank buffer layer 131 covering the anode electrodes AND and the sacrificial layers SCL may be located on the circuit layer 120 (operation S40).

The bank buffer layer 131 may be made of at least one inorganic insulating material among silicon nitride, aluminum nitride, zirconium nitride, titanium nitride, hafnium nitride, tantalum nitride, silicon oxide, aluminum oxide, titanium oxide, tin oxide, and/or silicon oxynitride.

Figure 15:
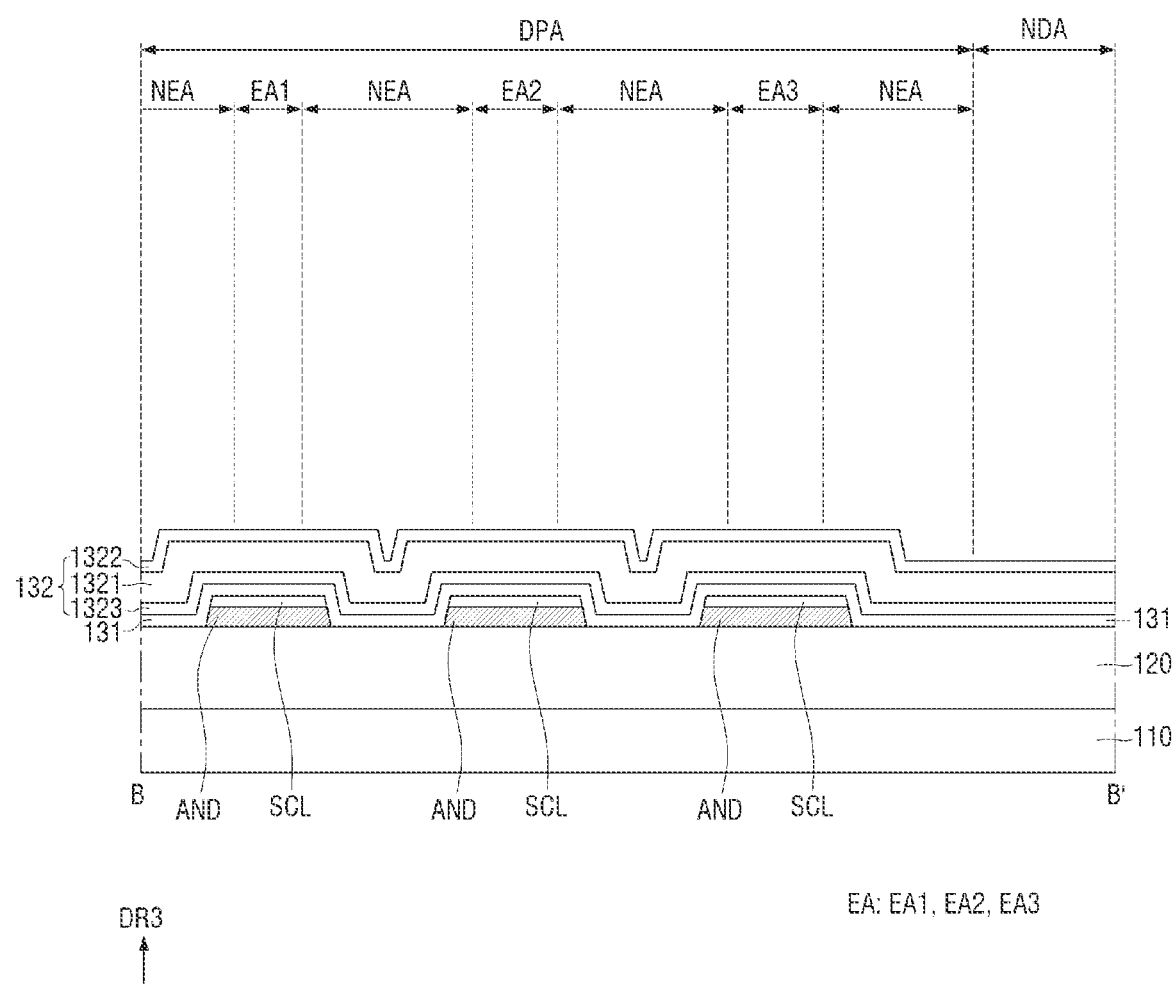

Referring to FIG. 15, a first multi-layer 132 may be located by sequentially stacking two or more different metal materials on the front surface of the bank buffer layer 131 (operation S51).

The first multi-layer 132 may include a first main layer 1321, and a first cover layer 1322 on the first main layer 1321.

Alternatively, the first multi-layer 132 may further include a first support layer 1323 between the bank buffer layer 131 and the first main layer 1321.

The first main layer 1321 may be made of aluminum (Al) and/or copper (Cu).

Each of the first cover layer 1322 and the first support layer 1323 may be made of titanium (Ti) and/or molybdenum (Mo).

Figure 16:
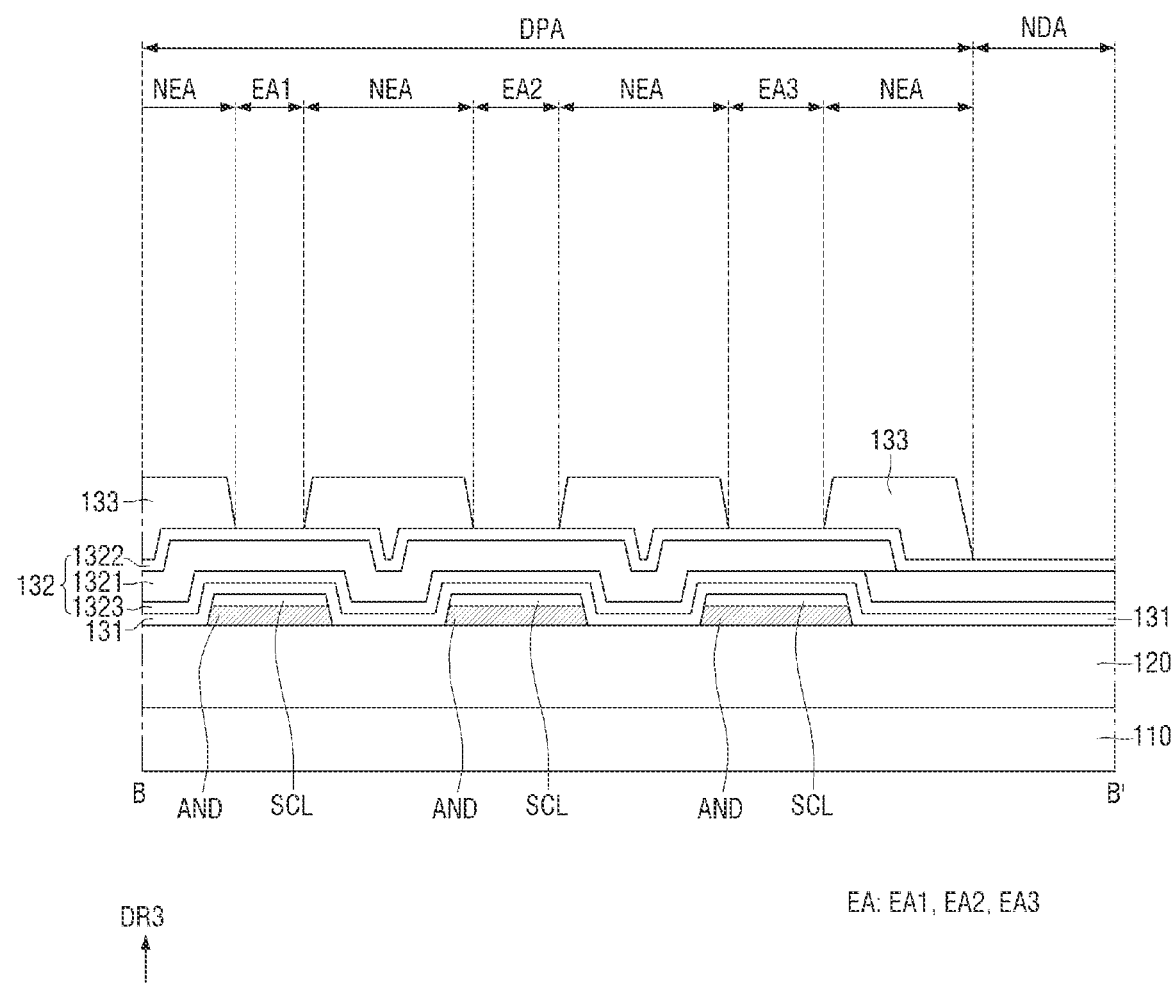

Referring to FIG. 16, by patterning an organic insulating material film on the first multi-layer 132, a pixel-defining layer 133 in line with the non-emission area NEA may be located on the first multi-layer 132 (operation S52).

The pixel-defining layer 133 may be made of at least one of polyacrylate resin, epoxy resin, phenolic resin, polyamide resin, polyimide resin, unsaturated polyesters resin, poly phenylene ether resin, poly phenylene sulfide resin, and/or benzocyclobutene (BCB).

Figure 17:
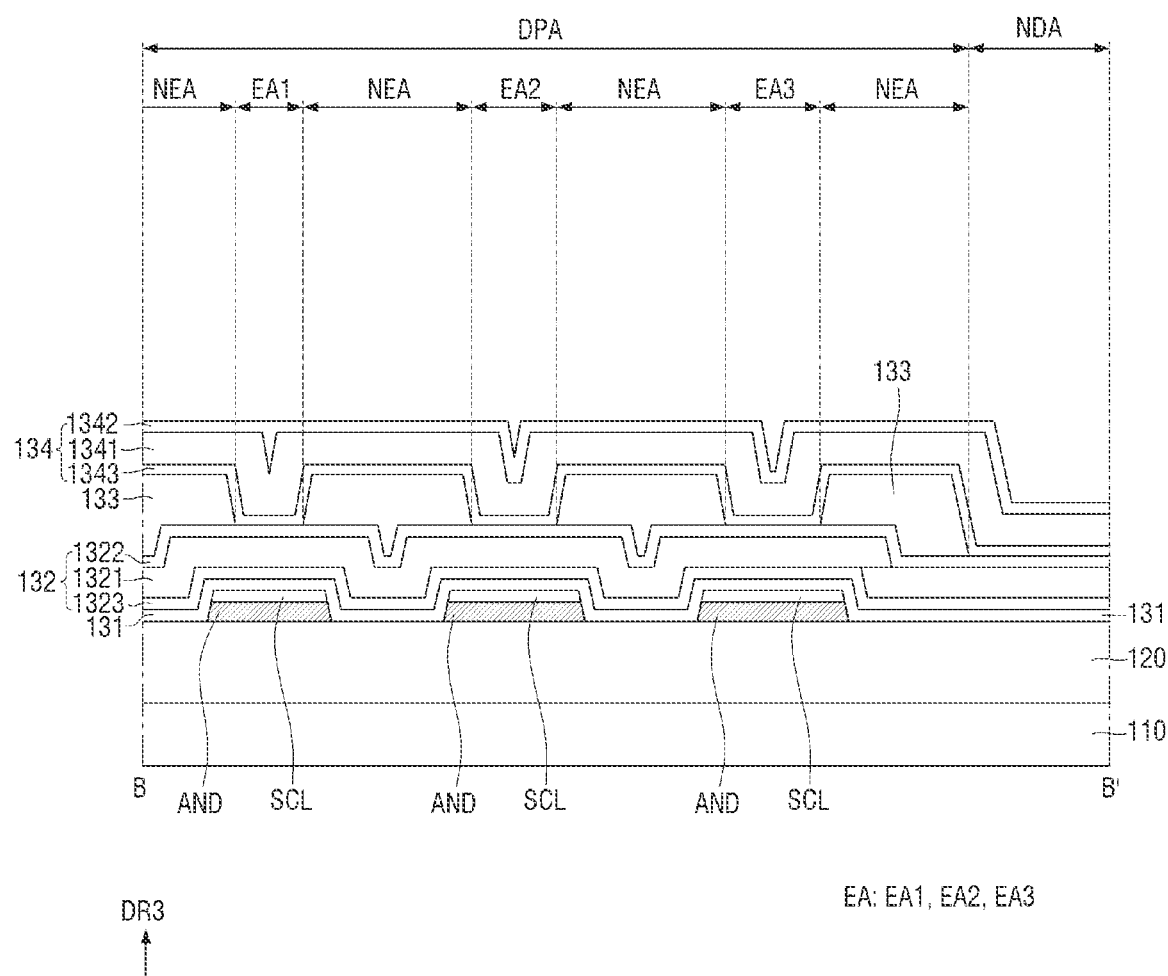

Referring to FIG. 17, two or more different metal materials are sequentially stacked on the front surface of the first multi-layer 132, so that a second multi-layer 134 covering the pixel-defining layer 133 may be located (operation S53).

The second multi-layer 134 may include a second main layer 1341, and a second cover layer 1342 on the second main layer 1341.

Alternatively, the second multi-layer 134 may further include a second support layer 1343 between the pixel-defining layer 133 and the second main layer 1341, and between each of the first multi-layer 132 and the second main layer 1341.

The second main layer 1341 may be made of aluminum (Al) or copper (Cu).

Each of the second cover layer 1342 and the second support layer 1343 may be made of titanium (Ti) or molybdenum (Mo).

Figure 18:
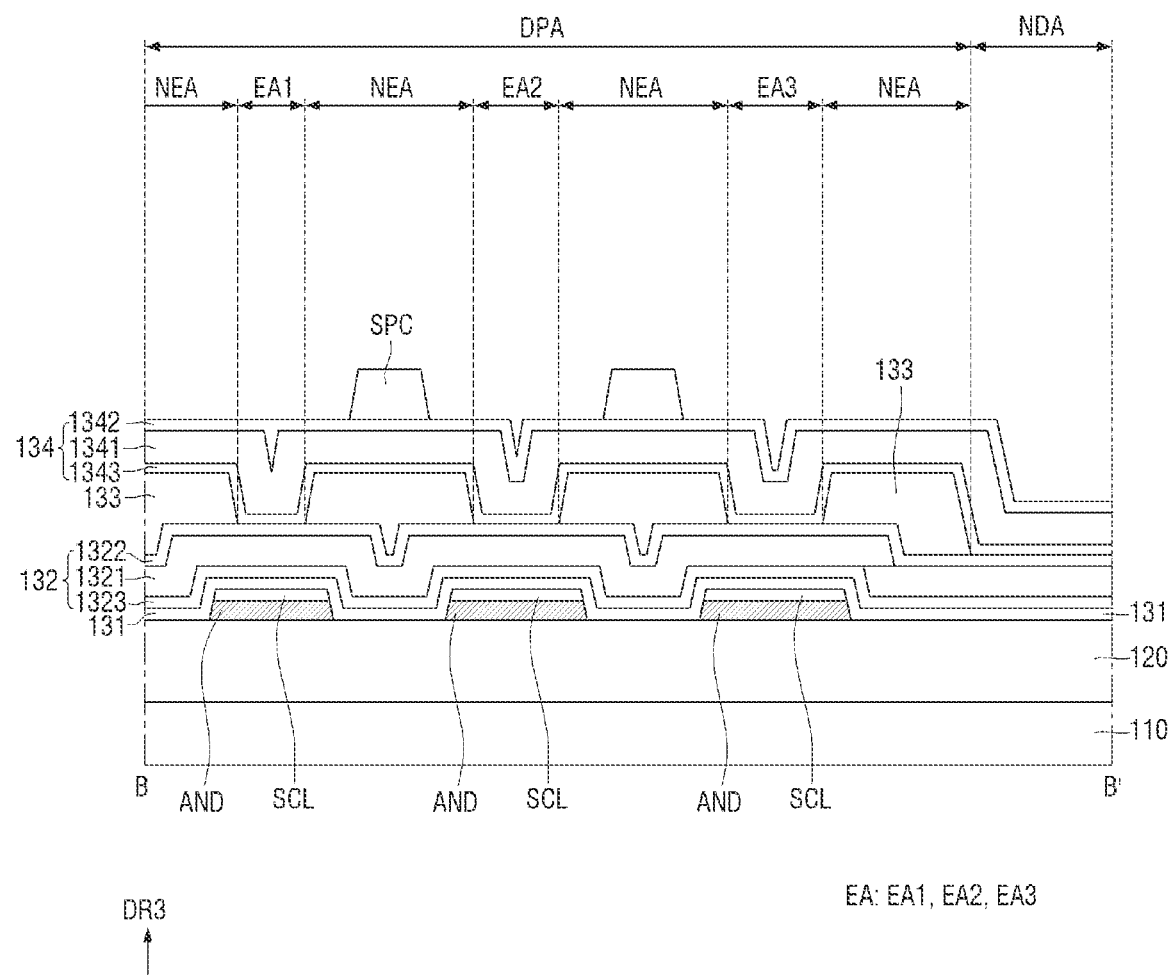

Referring to FIG. 18, by patterning an organic insulating material film on the second multi-layer 134, a spacer SPC may be located on the second multi-layer 134 in a part of the non-emission area NEA (operation S54).

The spacer SPC may be made of at least one of an organic insulating material, such as polyacrylate resin, epoxy resin, phenolic resin, polyamide resin, polyimide resin, unsaturated polyesters resin, poly phenylene ether resin, poly phenylene sulfide resin, and/or benzocyclobutene (BCB).

The spacer SPC may have a width that is less than that of the pixel-defining layer 133 (e.g., in plan view). As the spacer SPC is smaller than the pixel-defining layer 133, the range of light emission is less reduced by the spacer SPC.

According to the one or more embodiments corresponding to FIGS. 4, 6, 7, 8, and/or 9, a plurality of spacers SPC may be located in at least one direction such that they are spaced apart from one another at the distance substantially equal to the distance between two or more emission areas EA.

Figure 19:
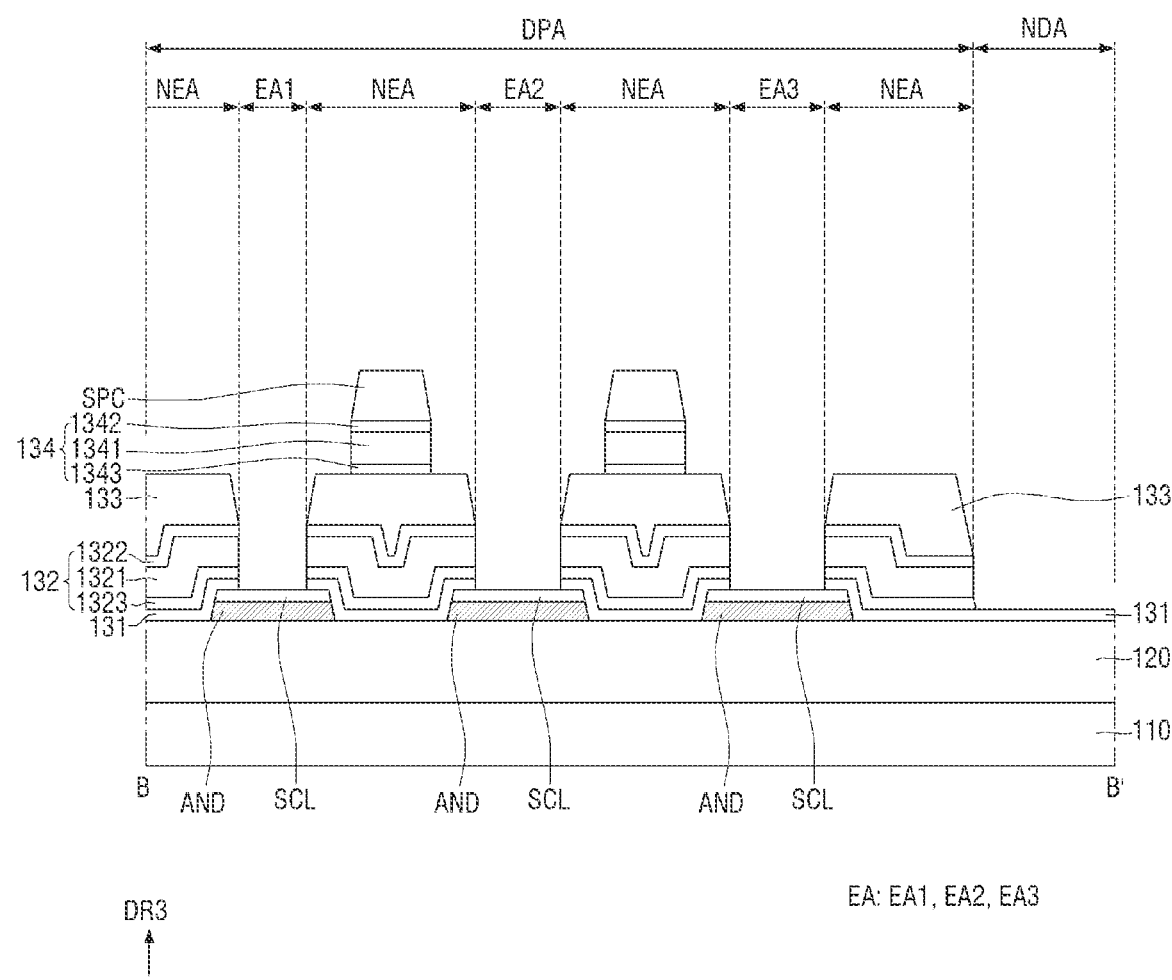

Subsequently, referring to FIG. 19, the bank buffer layer 131, the first multi-layer 132 and the second multi-layer 134 are patterned using the pixel-defining layer 133 and the spacer SPC as masks (operation S55).

In doing so, a part of the first multi-layer 132 under the pixel-defining layer 133 may remain, so that the patterned first multi-layer 132 may be formed.

In addition, a part of the second multi-layer 134 under the spacer SPX may remain, so that the patterned second multi-layer 134 may be formed.

In addition, a part of the bank buffer layer 131 under the pixel-defining layer 133 remains. The remaining part of the bank buffer layer 131 covers the edges of each of the plurality of sacrificial layers SCL while opening a central portion of each of the plurality of sacrificial layers SCL.

Figure 20:
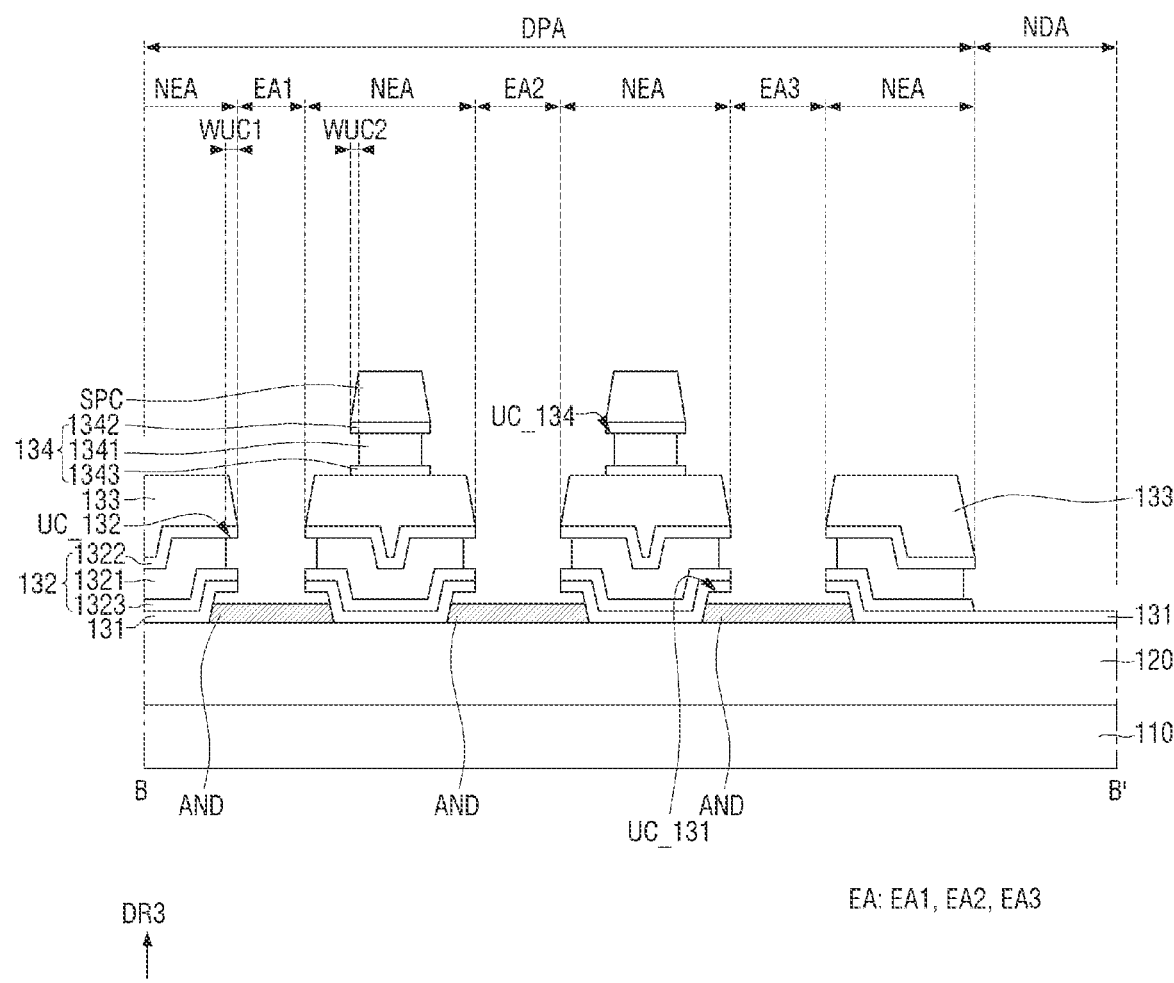

Referring to FIG. 20, by inducing an electrochemical corrosion effect (galvanic corrosion effect) on the first main layer 1321 and the second main layer 1341, the patterned first multi-layer 132 and the patterned second multi-layer 134 may be transformed into, or to include, the undercut structures UC_132 and UC_134, respectively (operation S56).

By doing so, the first multi-layer 132 of the undercut structure UC_132 located in the non-emission area NEA, and the second multi-layer 134 of the undercut structure UC_134 located at some locations of the non-emission area NEA, may be formed.

For the undercut structure UC_132 of the first multi-layer 132, the width WUC1 by which the edge of the first cover layer 1322 protrudes from the first main layer 1321 may be in the range of about 0.3 μm to about 0.7 μm.

For the undercut structure UC_134 of the second multi-layer 134, the width WUC1 by which the edge of the second cover layer 1342 protrudes from the second main layer 1341 may be in the range of about 0.3 μm to about 0.7 μm.

In addition, each of the plurality of sacrificial layers SCL having a part of the center exposed in the openings form the bank buffer layer 131 is patterned together with the first main layer 1321 and the second main layer 1341. In this manner, at least a part of each of the plurality of sacrificial layers SCL may be removed, so that a part of the center of each of the plurality of anode electrodes AND may be exposed.

In addition, the bank buffer layer 131 has an undercut structure UC_131 such that it is spaced apart from the edge of the anode electrode AND in the third direction DR3.

As shown in FIG. 20, a plurality of sacrificial layers SCL can be completely removed according to the process intensity or period of inducing an electrochemical corrosion effect (galvanic corrosion effect) on the first main layer 1321 and the second main layer 1341.

At this time, the bank buffer layer 131 is spaced apart from the upper portion of the edge of each of the plurality of anode electrodes AND and overlaps with the upper portion of the edge of each of the plurality of anode electrodes AND.

Figure 21:
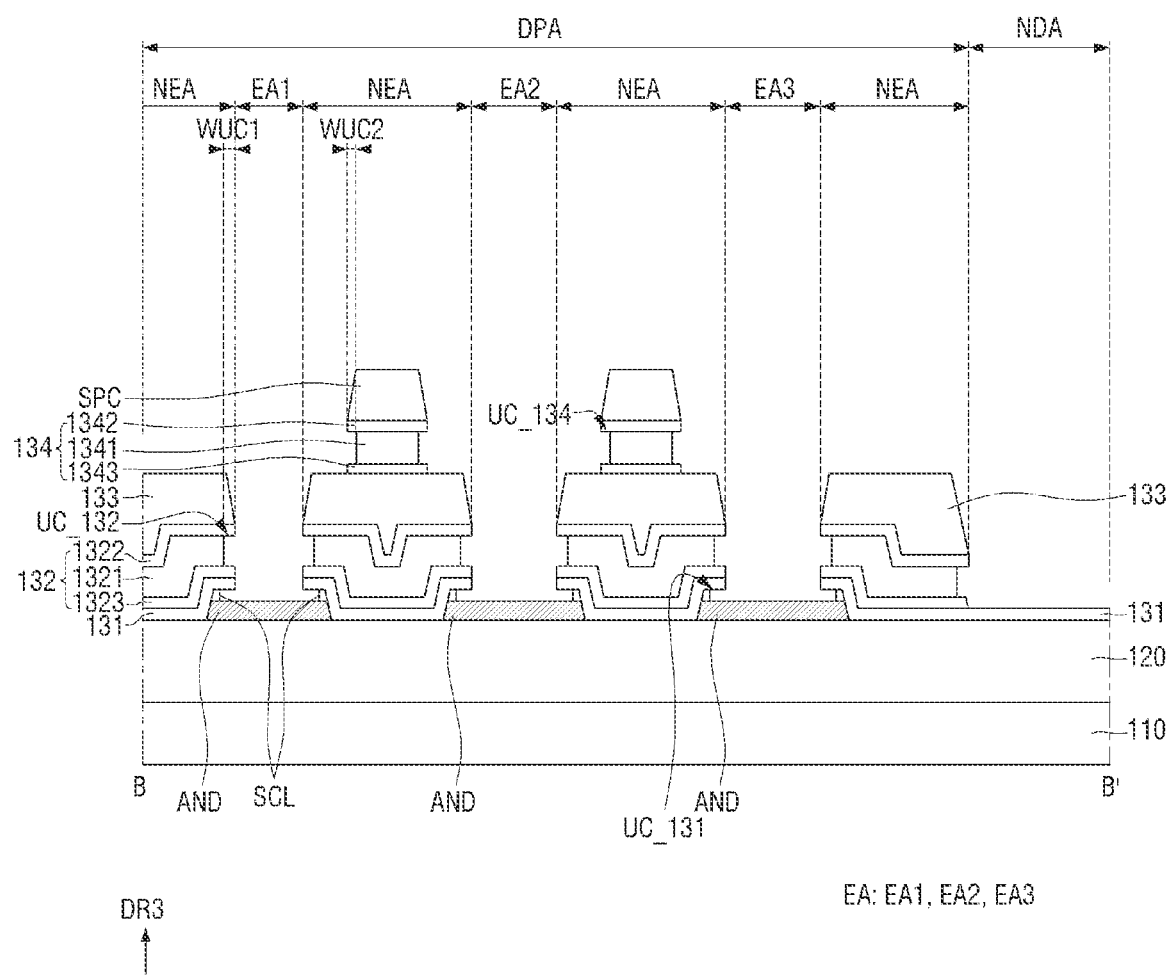

Alternatively, as shown in FIG. 21, the plurality of sacrificial layers SCL may partially remain between the anode electrode AND and the bank buffer layer 131 according to the process intensity or period of inducing an electrochemical corrosion effect (galvanic corrosion effect) on the first main layer 1321 and the second main layer 1341. In this instance, the bank buffer layer 131 has an undercut structure UC_131 such that it protrudes from the remaining sacrificial layer SCL.

Subsequently, the plurality of first common layers CML1 and the plurality of emissive layers EML may be located on the plurality of anode electrodes AND, respectively (operation S60).

The locating of the plurality of first common layers CML1 and the plurality of light-emitting layers EML at operation S60 may be performed in each of the first emission area EA1, the second emission area EA2, and the third emission area EA3. That is, the locating of the plurality of first common layers CML1 and the plurality of emissive layer layers EML at operation S60 may include locating the first common layer CML1 and the first emissive layer EML1 corresponding to the first emission area EA1, locating the first common layer CML1 and the second emissive layer EML2 corresponding to the second emission area EA2, and locating the first common layer CML1 and the third emissive layer EML3 corresponding to the third emission area EA3. It should be noted that the order of locating the first emissive layer EML1, the second emissive layer EML2 and the third emissive layer EML3 may be altered.

Figure 22:
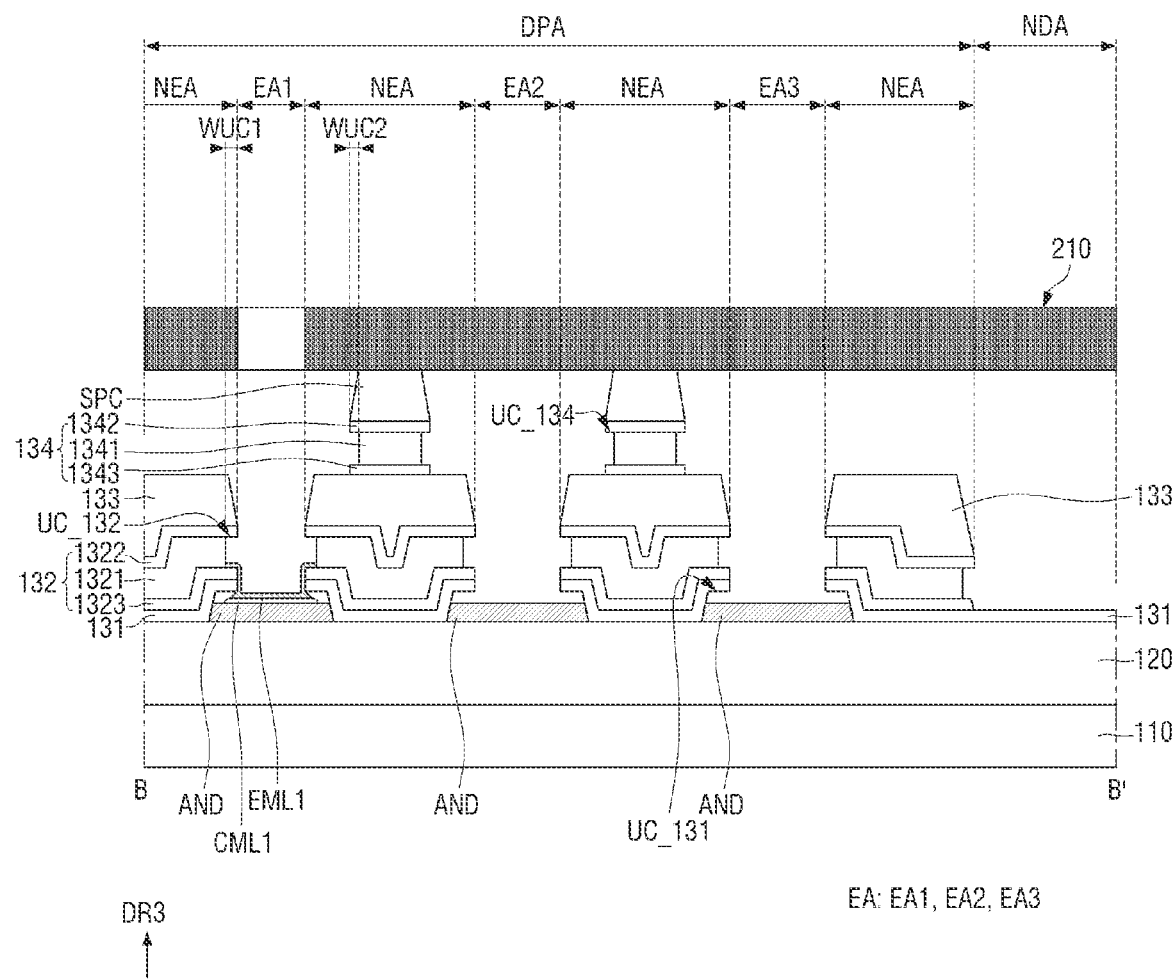

For example, referring to FIG. 22, when a first mask 210 including/defining openings in line with the first emission areas EA1 is placed on the spacers SPC, the first common layer CML1 and the first emissive layer EML1 may be sequentially stacked on each of the anode electrodes AND of the first emission areas EA1.

The first common layer CML1 may include a hole-transport material.

The first emissive layer EML1 may include a dopant material or a host material for emitting light of the first color.

Figure 23:
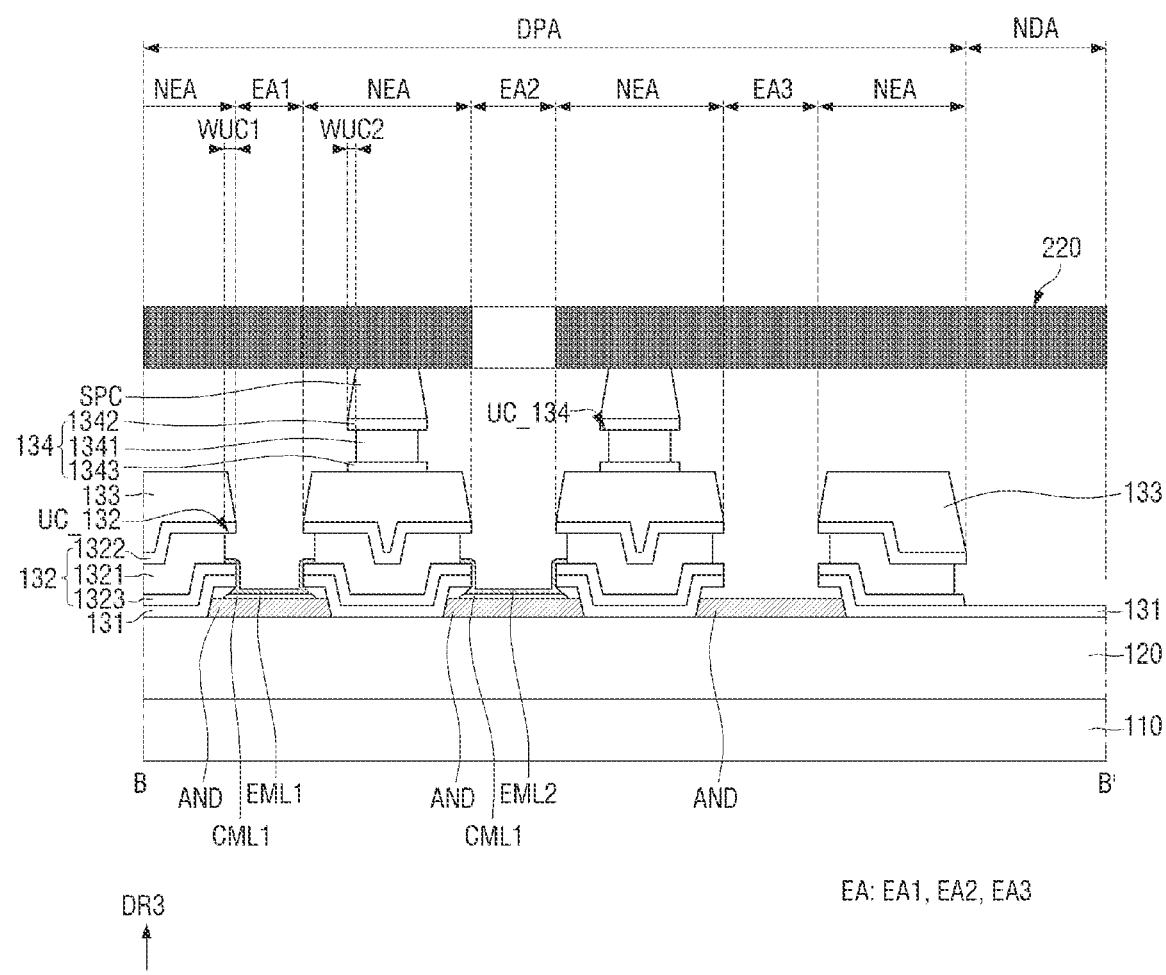

Referring to FIG. 23, when the first mask 210 is removed and a second mask 220 including/defining openings in line with the second emission areas EA2 is placed on the spacers SPC, the first common layer CML1 and the second emissive layer EML2 may be sequentially stacked on each of the anode electrodes AND of the second emission areas EA2.

The second emissive layer EML2 may include a dopant material or a host material for emitting light of the second color in a wavelength band that is different from that of the first color.

Figure 24:
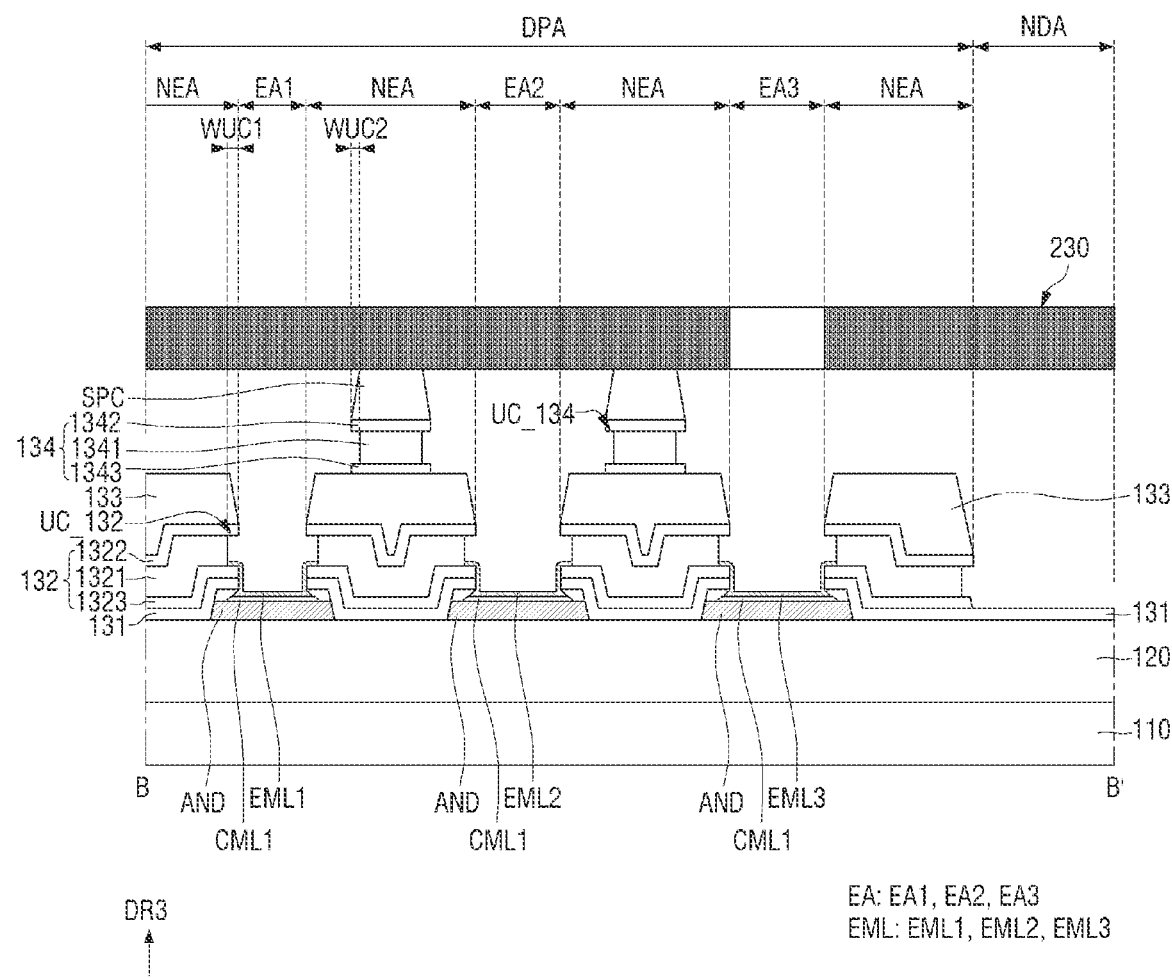

Referring to FIG. 24, when the second mask 220 (see FIG. 23) is removed and a third mask 230 including/defining openings in line with the third emission areas EA3 is placed on the spacers SPC, the first common layer CML1 and the third emissive layer EML3 may be sequentially stacked on each of the anode electrodes AND of the third emission areas EA3.

The third emissive layer EML3 may include a dopant material or a host material for emitting light of the third color in a wavelength band that is different from that of the first color and that of the second color.

Subsequently, the third mask 230 is removed.

Figure 25:
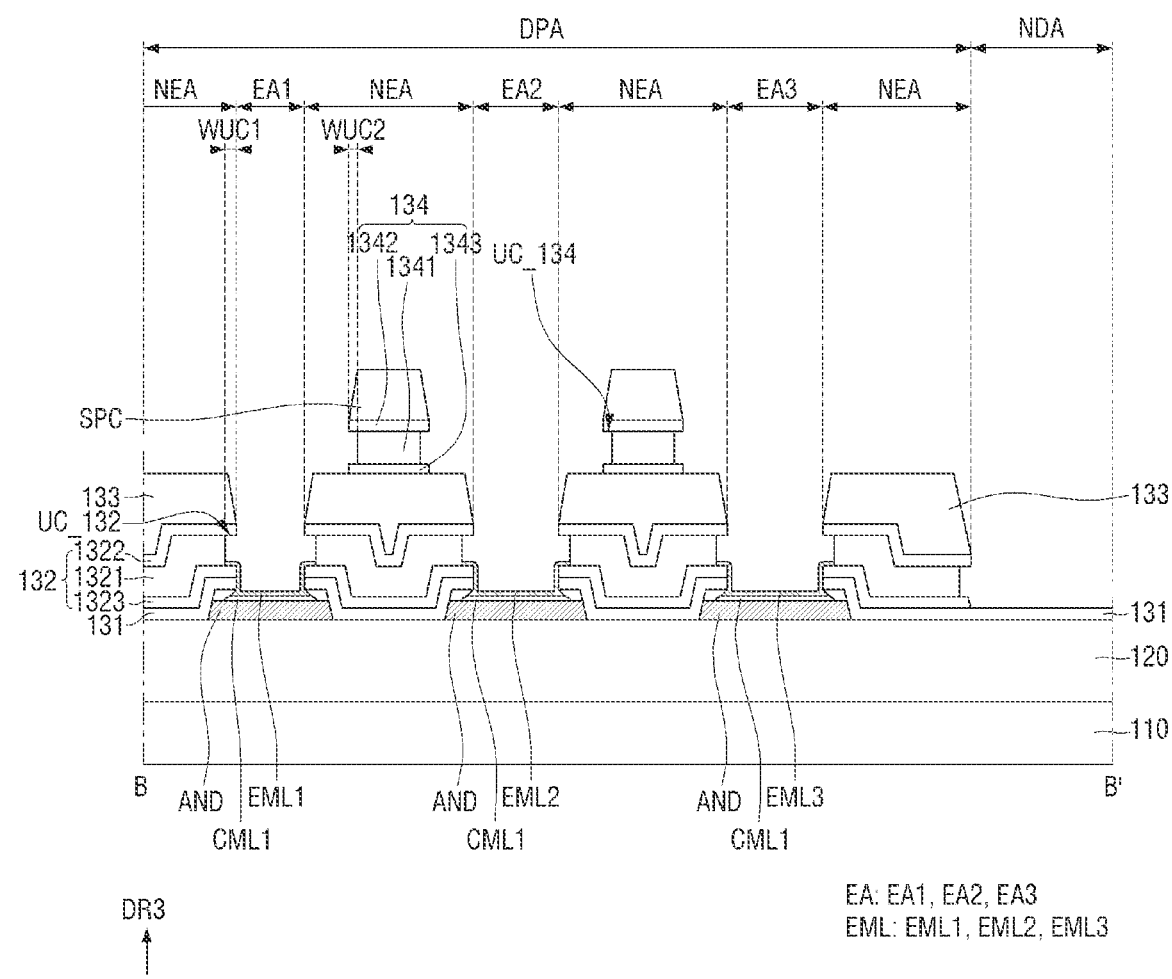

In this manner, as shown in FIG. 25, a plurality of first common layers CML1 and a plurality of emissive layers EML may be located in the plurality of emission areas EA, respectively.

Each of the plurality of emissive layers EML may be extended so that it is in contact with the bank buffer layer 131 and a part of the first main layer 1321 of the first multi-layer 132.

Figure 26:
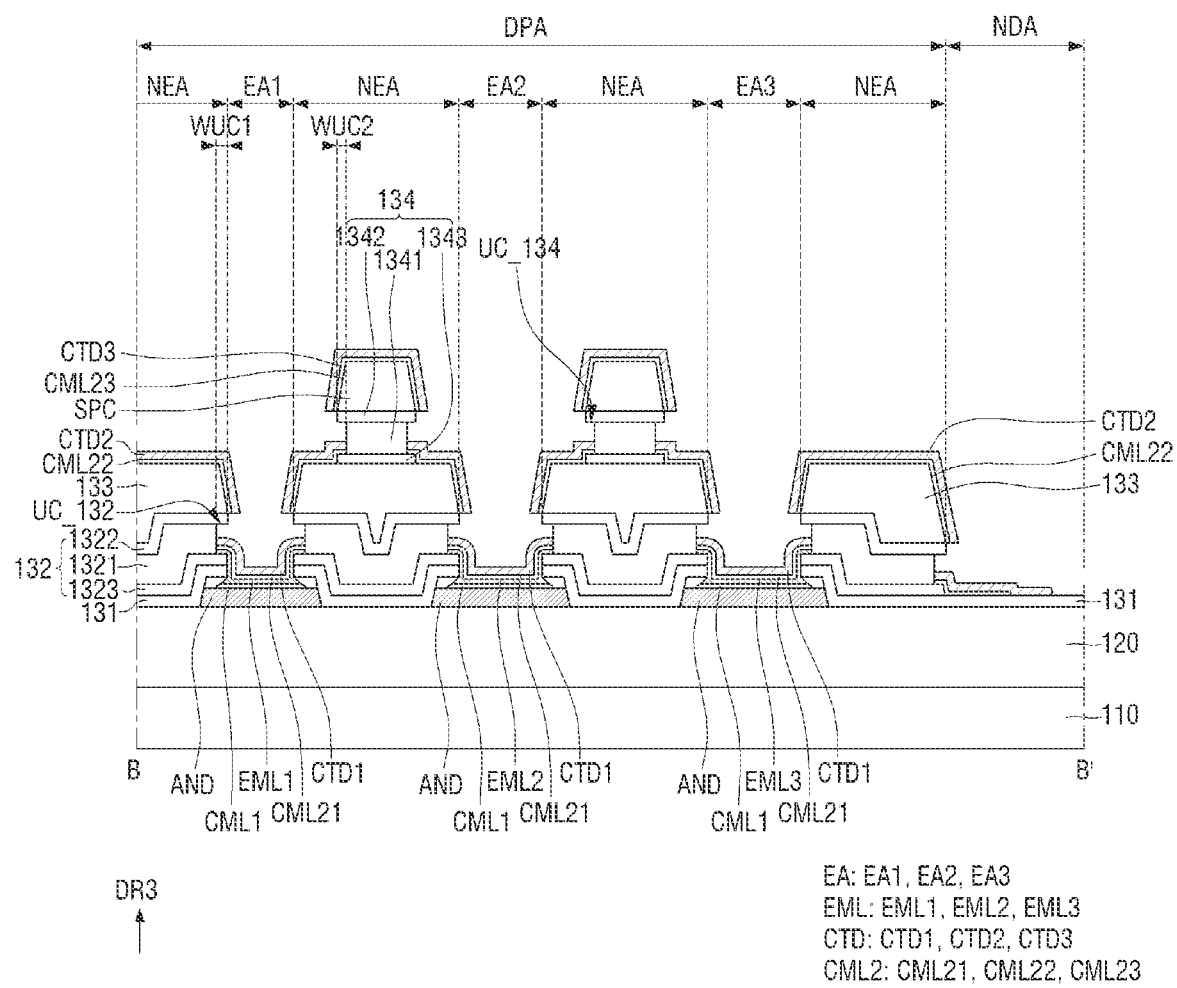

Referring to FIG. 26, a second common layer CML2 covering the plurality of emissive layers EML, the pixel-defining layer 133, and the spacers SPC is located, and cathode electrodes CTD may be located on the second common layer CML2 (operation S70).

The second common layer CML2 may include an electron-transport material.

The cathode electrodes CTD may include a transparent metal oxide material, such as ITO, IZO, and/or IGZO.

The second common layer CML2 and the cathode electrode CTD may be separated by the undercut structure UC_132 of the patterned first multi-layer 132, and the undercut structure UC_134 of the patterned second multi-layer 134.

That is, the second common layer CML21 and the cathode electrode CTD1 on each of the plurality of emissive layer EML are separated from the second common layer CML22 and the cathode electrode CTD2 on the pixel-defining layer 132 by the undercut structure UC_132 of the first multi-layer 133. In this manner, it is possible to reduce or prevent leakage current between the adjacent emission areas EA from being induced by the second common layer CML2.

In addition, the second common layer CML23 and the cathode electrode CTD3 on the spacer SPC are separated from the second common layer CML22 and the cathode electrode CTD2 on the pixel-defining layer 133 by the undercut structure UC_134 of the second multi-layer 134. Therefore, it is possible to block the permeation path of oxygen or moisture due to damage to the spacer SPC from being extended to the periphery.

In addition, the second common layer CML21 and the cathode electrode CTD1 on each of the plurality of emissive layers EML may be in contact with the first main layer 1321 of the nearby first multi-layer 132, and may be electrically connected thereto. In other words, the first multi-layer 132 may work as a line connecting the cathode electrodes CTD1 on the plurality of emissive layers EML.

Subsequently, the locating an encapsulation structure 140 on the cathode electrodes CTD may be performed (operation S80).

Figure 27:
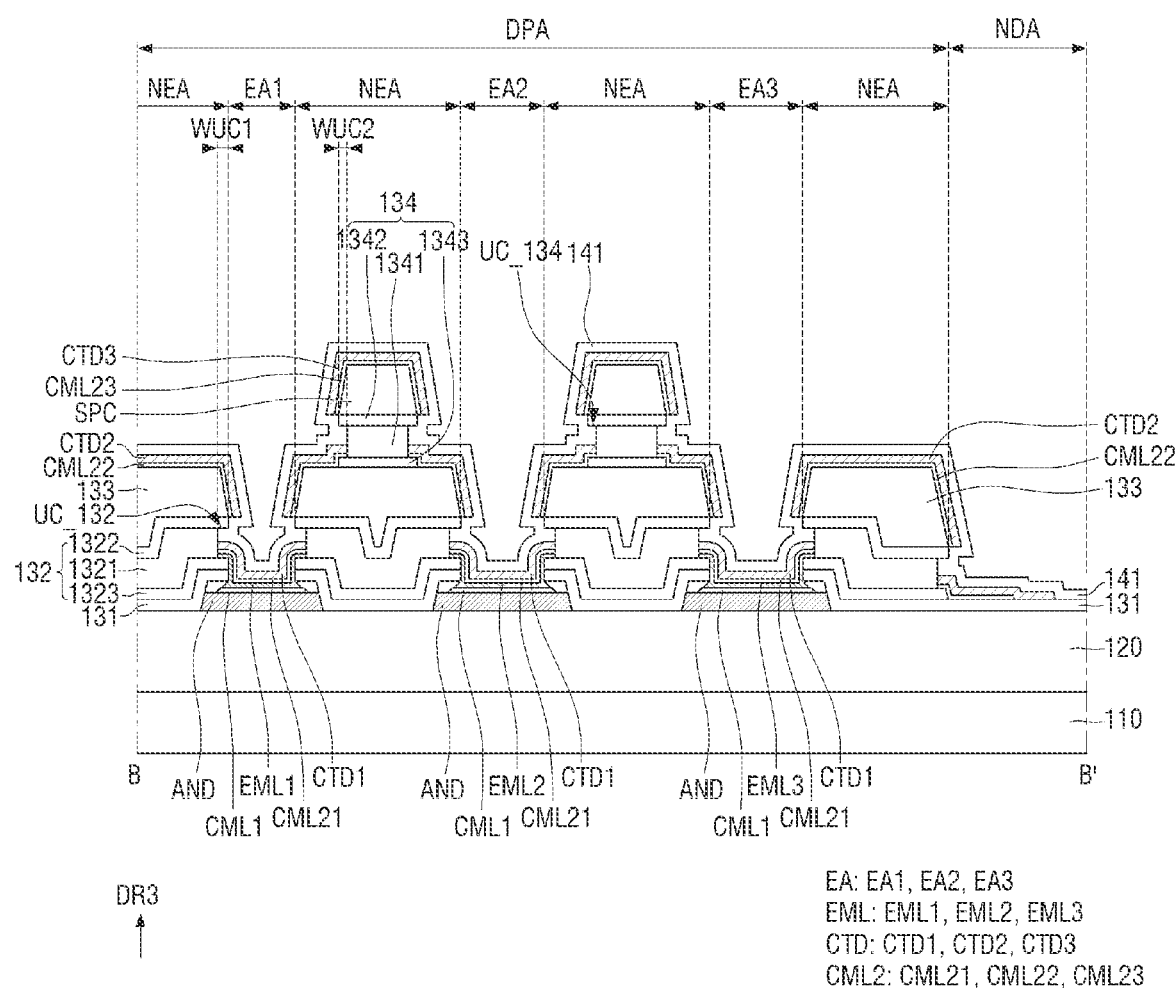

Referring to FIG. 27, a first encapsulation layer 141 may be located by stacking an inorganic insulating material on the front surface of the cathode electrodes CTD by CVD process (operation S81).

The first encapsulation layer 141 may be in contact with the first multi-layer 132 of the undercut structure UC_132 and the second multi-layer 134 of the undercut structure UC_134 by a CVD process.

For bonding each of the first multi-layer 132 and the second multi-layer 134 with the first encapsulation layer 141, each of the thickness of the first main layer 1321 of the first multi-layer 132 and the thickness of the second main layer 1341 of the second multi-layer 134 may exceed at least the sum of the thickness of the second common layer CML2 and the thickness of the cathode electrodes CTD.

Alternatively, each of the thickness of the first main layer 1321 of the first multi-layer 132 and the thickness of the second main layer 1341 of the second multi-layer 134 may exceed the sum of the thicknesses of the first common layer CML1, the emissive layer EML, the second common layer CML2, and the cathode electrodes CTD.

Accordingly, each of the plurality of emissive layers EML may be individually encapsulated by the bonding between the side of the first multi-layer 132 and the first encapsulation layer 141 (e.g., the bonding between inorganic materials).

In addition, the second common layer CML23 and the cathode electrode CTD3 on the spacer SPC can be individually encapsulated by the bonding between the side portion of the second multi-layer 134 and the first encapsulation layer 141 (e.g., the bonding between inorganic materials).

Therefore, the encapsulation function of the encapsulation structure 140 for suppressing the permeation path of oxygen or moisture can be improved.

Figure 28:
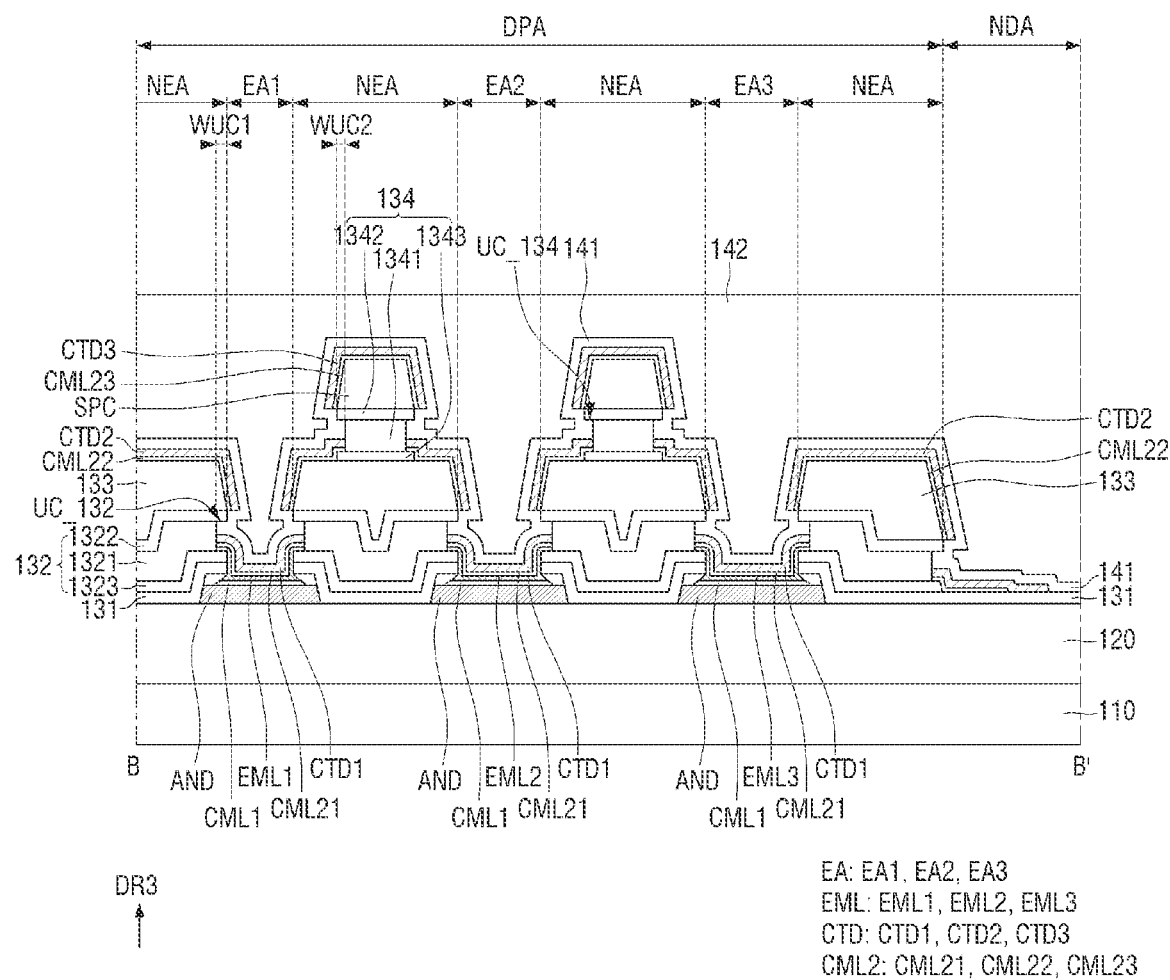

Referring to FIG. 28, a second encapsulation layer 142 may be located by applying and curing an organic insulating material on the front surface of the first encapsulation layer 141 (operation S82).

The second encapsulation layer 142 may be made of a negative photoresist material.

For example, when an organic insulating material in liquid phase is dropped on the first encapsulation layer 141, and the dropped material in liquid phase is diffused over the front surface, the second encapsulation layer 142 may be located via a process of curing the diffused material in liquid phase.

The second encapsulation layer 142 may be flatly located in at least the display area DPA.

Figure 29:
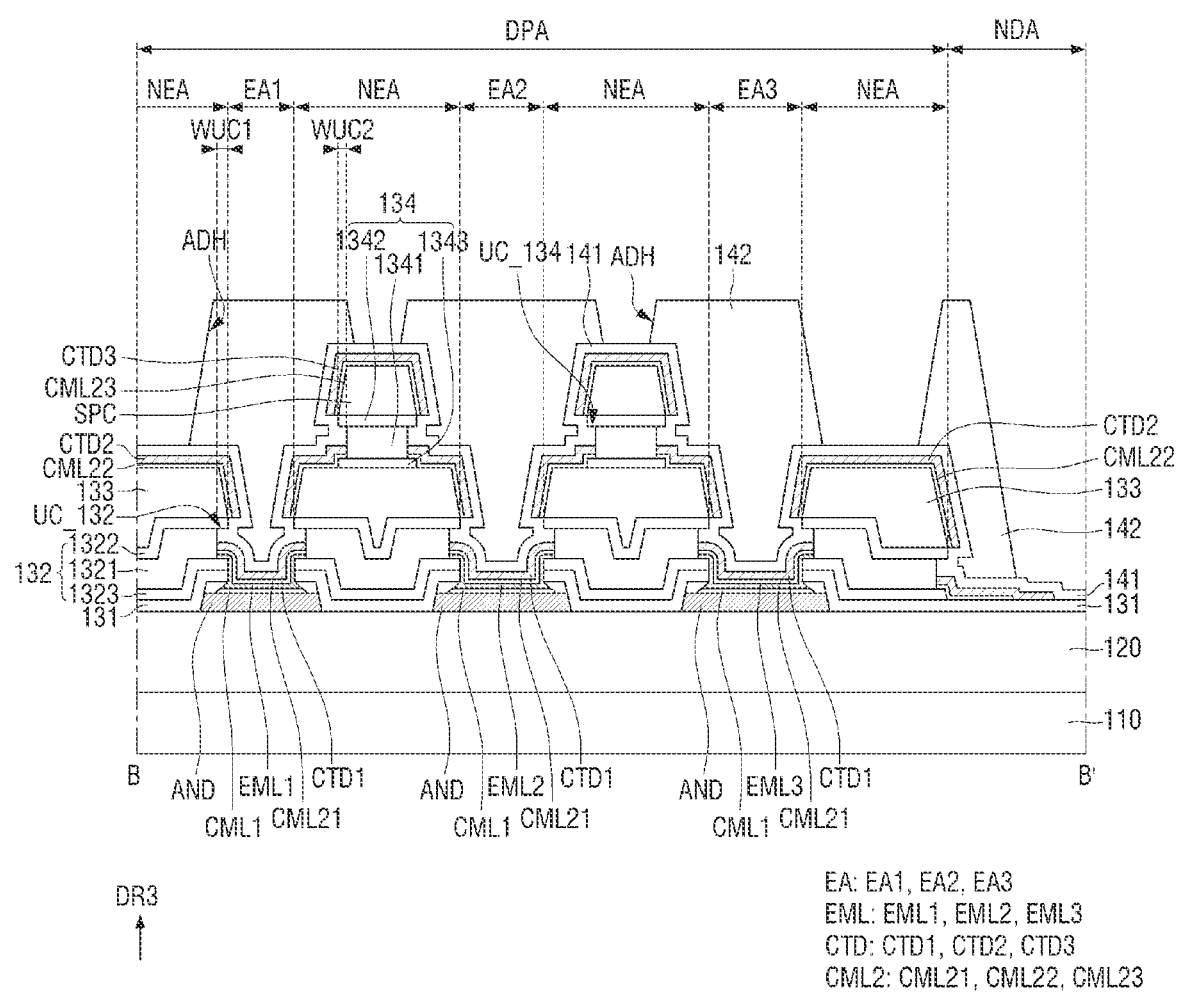

Referring to FIG. 29, the second encapsulation layer 142 may be patterned, so that adhesion holes ADH may be formed in the non-emission areas NEA (operation S83).

According to the one or more embodiments corresponding to FIGS. 4, 6, 7, 8, and/or 9, a plurality of second multi-layers 134 spaced apart from one another is located on a part of the pixel-defining layer 133 in the non-emission area NEA, and a plurality of spacers SPC may be located on a plurality of second multi-layers 134.

Accordingly, the adhesion holes ADH may overlap with the plurality of spacers SPC and other parts of the pixel-defining layer 133 in which they are not located.

In other words, the adhesion holes ADH may expose parts of the first encapsulation layer 141 in line with each of the plurality of spacers SPC and other parts of the pixel-defining layer 133.

Figure 30:
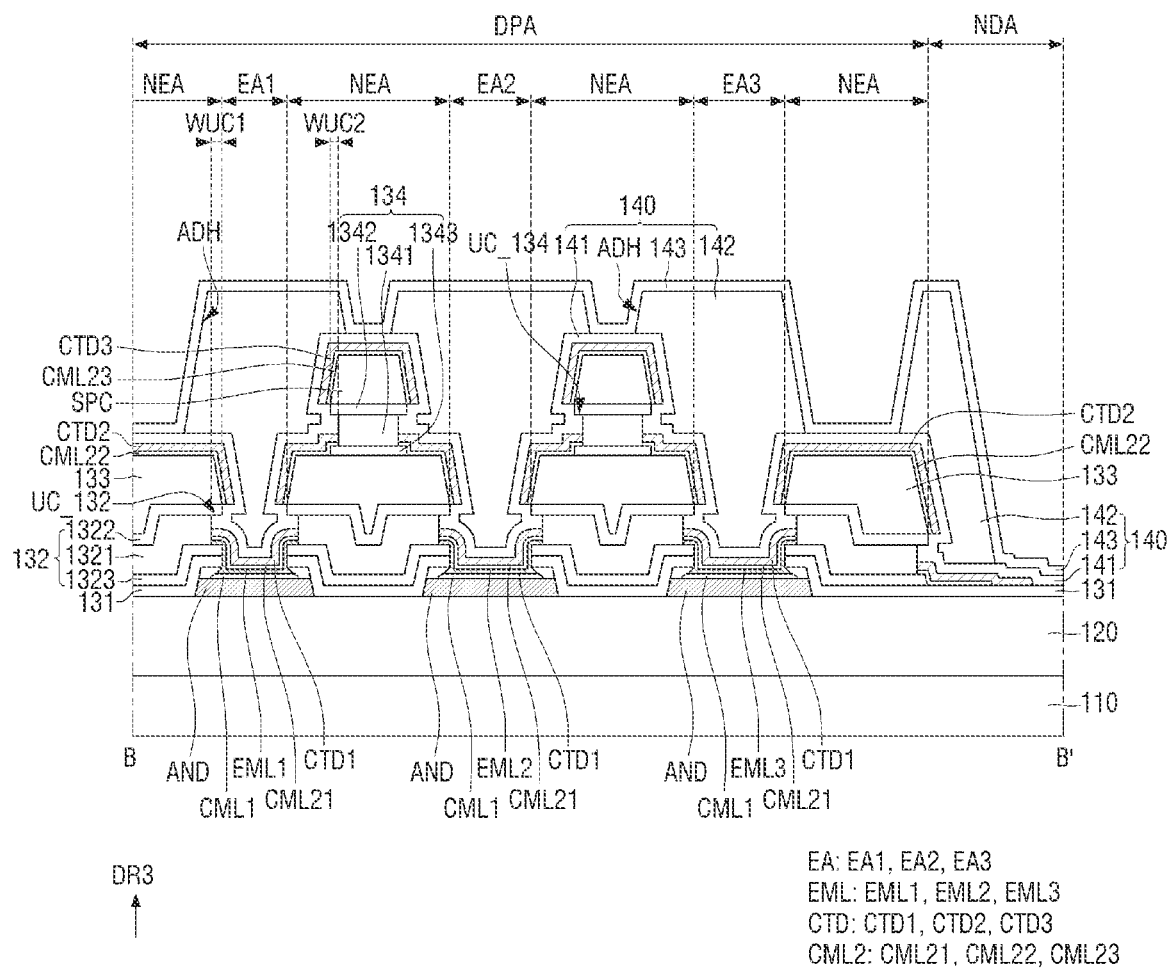

Referring to FIG. 30, an inorganic insulating material is stacked on the front surface of the first encapsulation layer 141 by a CVD process, so that a third encapsulation layer 143 covering the second encapsulation layer 142 and the adhesion holes ADH may be located (operation S84).

The third encapsulation layer 143 may be in contact with the first encapsulation layer 141 through the adhesion holes ADH.

Accordingly, the first common layer CML1, the emissive layer EML, and the second common layer CML2 of each of the plurality of emission areas EA can be individually encapsulated by the bonding of the first encapsulation layer 141 and the third encapsulation layer 143, which is a bonding of the inorganic insulating materials, and the second encapsulation layer 142 interposed therebetween.

Accordingly, it is possible to decrease or prevent a permeation path of oxygen or moisture generated in one emission area from diffusing to other nearby emission areas.

Figure 31:
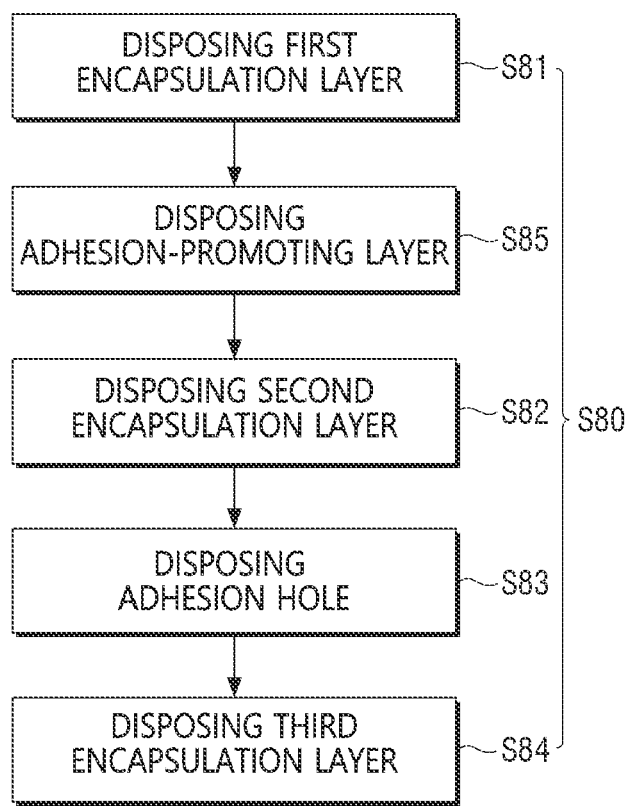
FIG. 31 is a flowchart for illustrating the steps of locating the encapsulation structure of FIG. 12 according to one or more other embodiments corresponding to FIG. 9.
Figure 32:
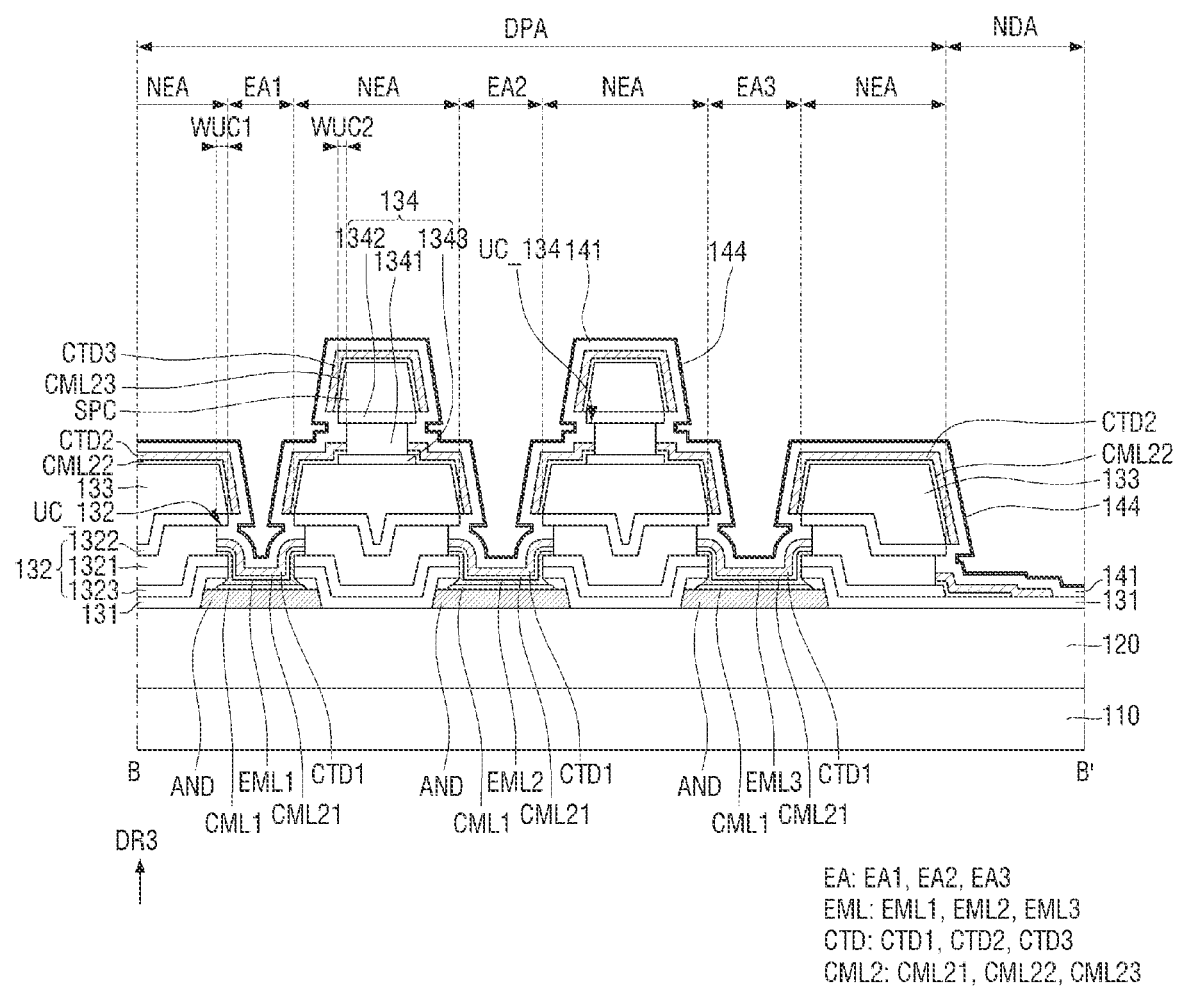
FIGS. 32 to 34 are views showing some of the processing steps of the flowchart of FIG. 31.
Figure 33:
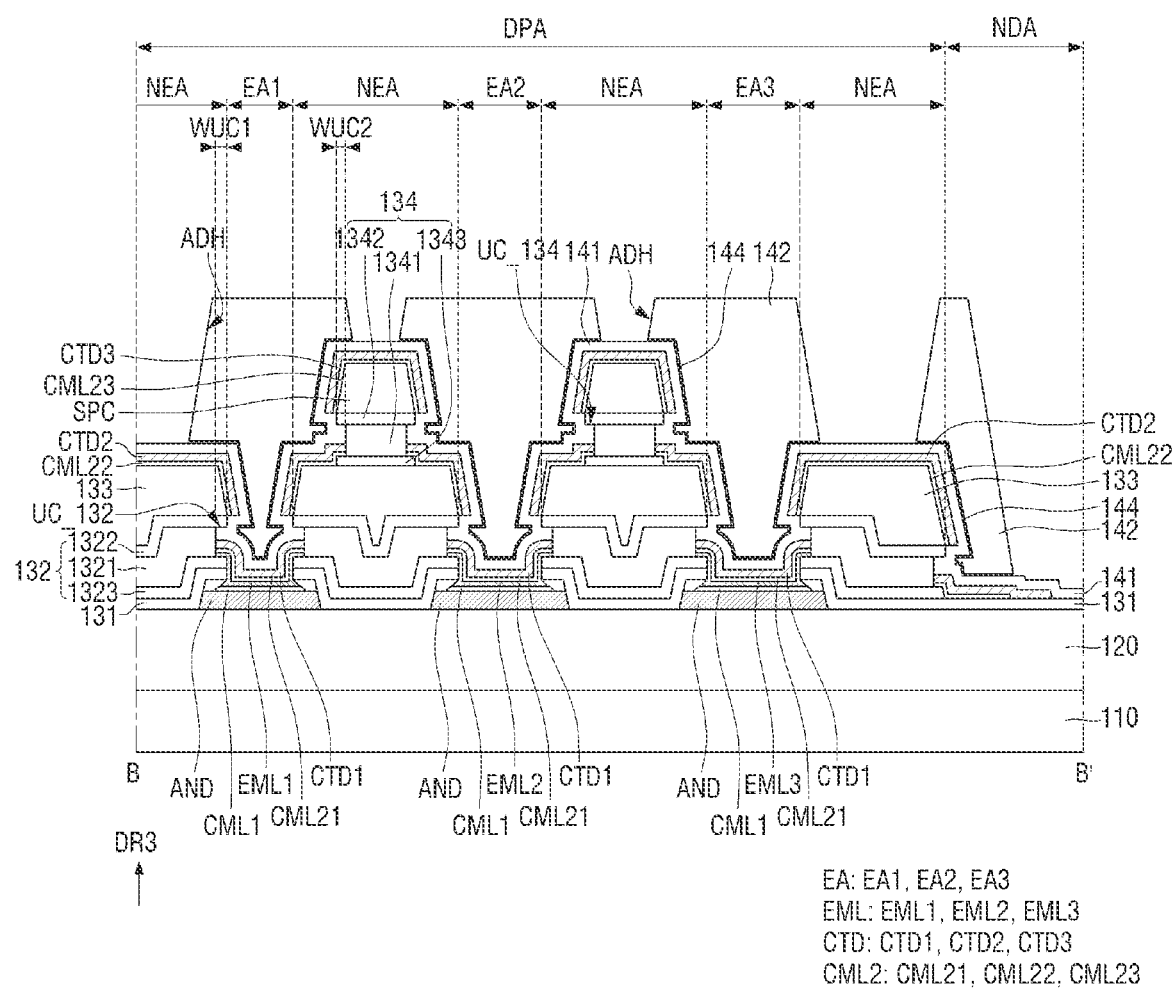
Figure 34:
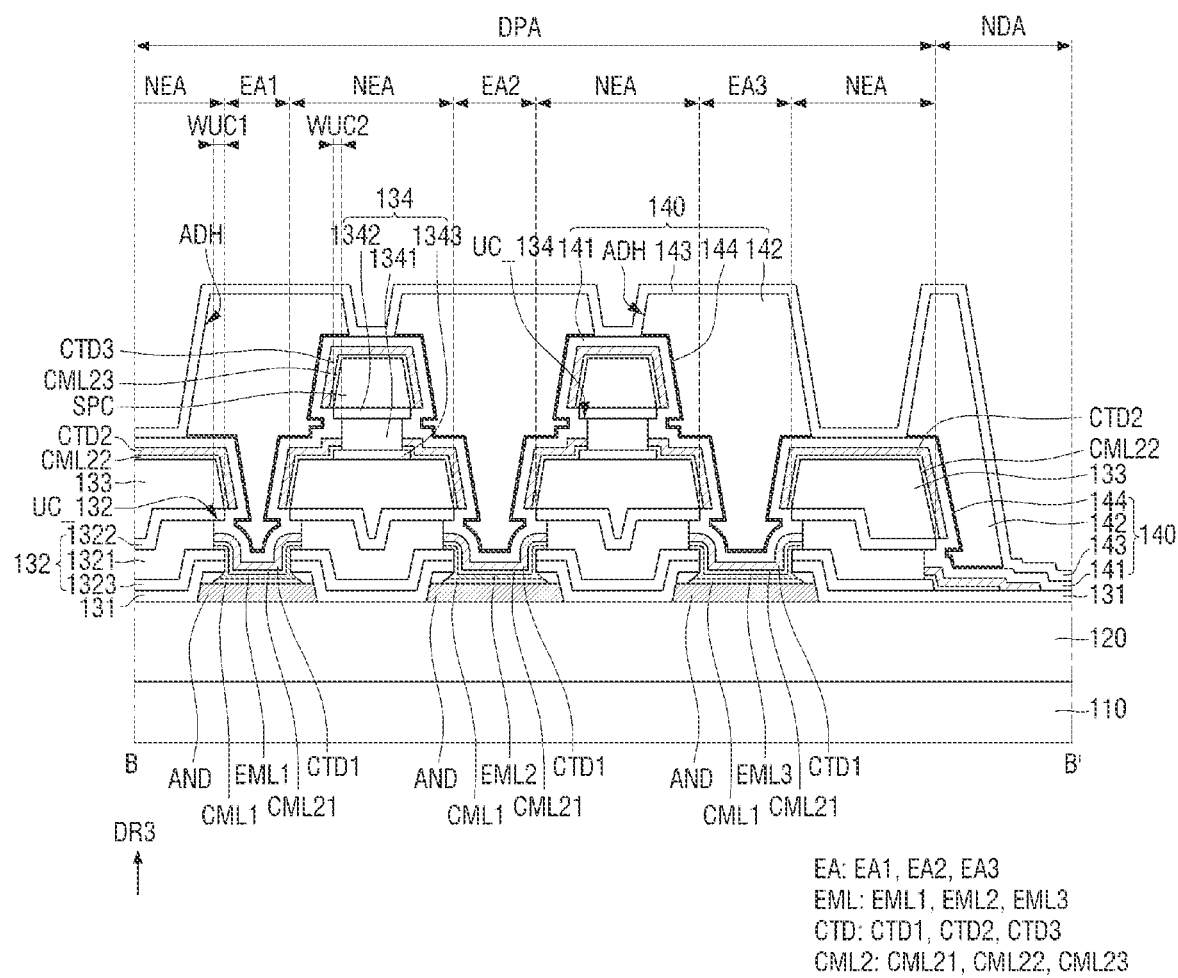

FIG. 31 is a flowchart for illustrating the steps of locating the encapsulation structure of FIG. 12 according to the one or more embodiments corresponding to FIG. 9. FIGS. 32 to 34 are views showing some of the processing steps of the flowchart of FIG. 31.

A method of fabricating the display device 100e according to the one or more embodiments corresponding to FIG. 9 and described in FIG. 31 is substantially identical to the method of FIGS. 12 and 13, except that the locating of the encapsulation structure 140 at operation S80 further includes locating an adhesion-promoting layer 144 (operation S85) before the locating of the second encapsulation layer 142 (operation S82), and, therefore, the redundant descriptions will be omitted.

Referring to FIG. 32, an adhesion-promoting layer 144 of a material including a functional group (e.g., predetermined functional group) may be located on the front surface of the first encapsulation layer 141.

The adhesion-promoting layer 144 may be made of a material having a surface energy similar to that of an organic insulating material. For example, the adhesion-promoting layer 144 may be made of a material including at least one functional group among —H, —CH, —CH$_2$, —CH$_3$, —F, —CF, —CF$_2$, and —CF$_3$.

Referring to FIG. 33, the second encapsulation layer 142 is located on the adhesion-promoting layer 144 (operation S82), and then the adhesion-promoting layer 144 and the second encapsulation layer 142 are patterned together, so that adhesion holes ADH may be formed in the non-emission area NEA (operation S83).

At this time, the liquid material dropped on the adhesion-promoting layer 144 for locating the second encapsulation layer 142 can evenly spread by the action of the adhesion-promoting layer 144. In this manner, the first encapsulation layer 141 may be completely covered with the second encapsulation layer 142.

That is, the adhesion hole ADH penetrates through the second encapsulation layer 142 and the adhesion-promoting layer 144 to expose a part of the first encapsulation layer 141.

Subsequently, as shown in FIG. 34, a third encapsulation layer 143 covering the second encapsulation layer 142 and in contact with the first encapsulation layer 141 through the adhesion holes ADH may be located (operation S84).

FIGS. 35 to 38 are views showing some of the processing steps of the flowcharts of FIGS. 12 and 13 according to the one or more other embodiments corresponding to FIGS. 10 and/or 11.

A method of fabricating the display device 100f (see FIG. 10) according to the one or more other embodiments corresponding to FIG. 10 is substantially identical to the method according to one or more embodiments shown in FIGS. 12 to 30, except that a spacer SPC is formed in the non-emission area NEA, and the locating of the spacer SPC at operation S54 further includes patterning the spacer SPC before the locating of the first common layer CML1 and the emissive layer EML at operation S60, and, therefore, the redundant descriptions will be omitted.

Figure 35:
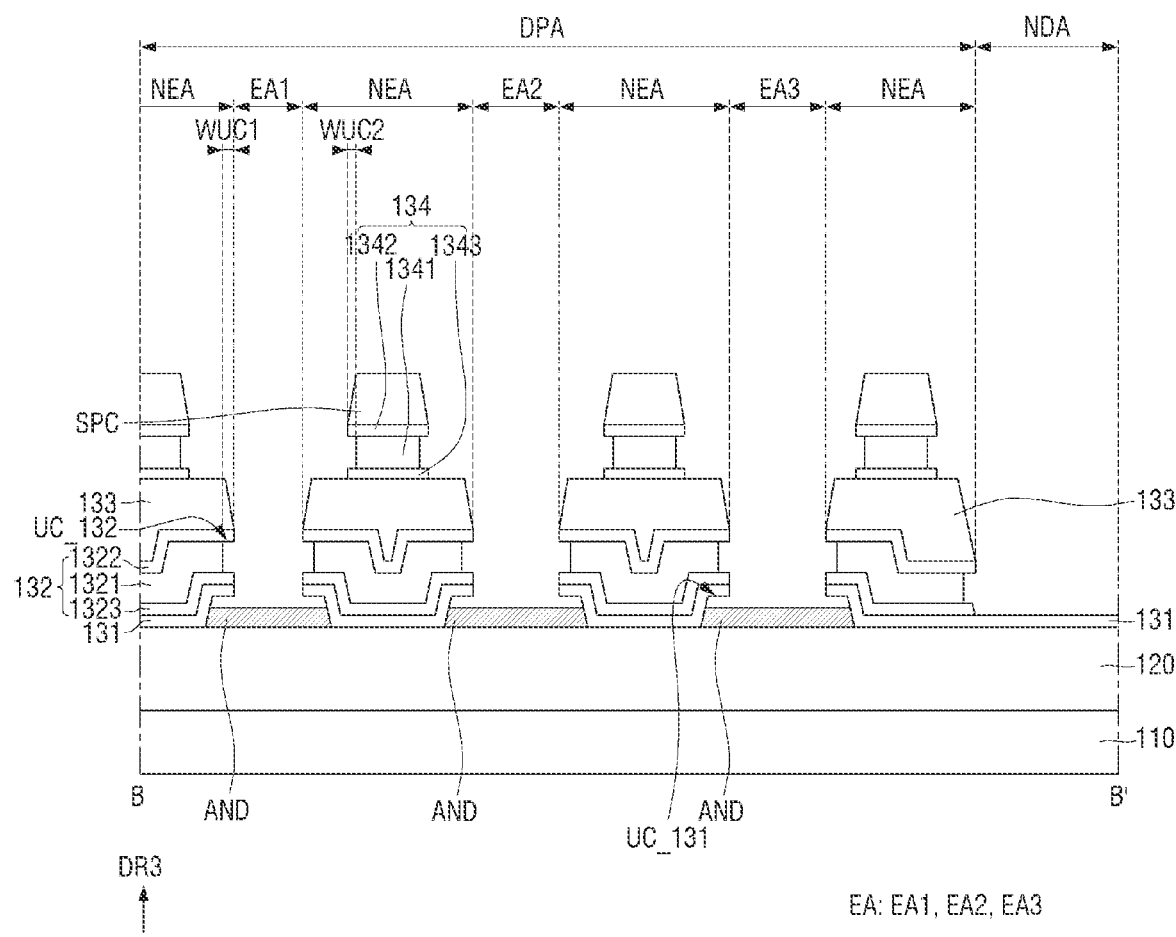
FIGS. 35 to 38 are views showing some of the processing steps of the flowcharts of FIGS. 12 and 13 according to the one or more other embodiments corresponding to FIGS. 10 and/or 11.

As shown in FIG. 35, according to the one or more other embodiments corresponding to FIG. 10, the locating of the spacer SPC at operation S54 includes locating the spacer SPC having a width that is less than the upper portion of the pixel-defining layer 133 in the non-emission area NEA.

Accordingly, in the patterning the first multi-layer 132 and the second multi-layer 134 at operation S55 according to the one or more other embodiments corresponding to FIG. 10, the second multi-layer 134 may be located in the non-emission area NEA, like the spacer SPC.

Figure 36:
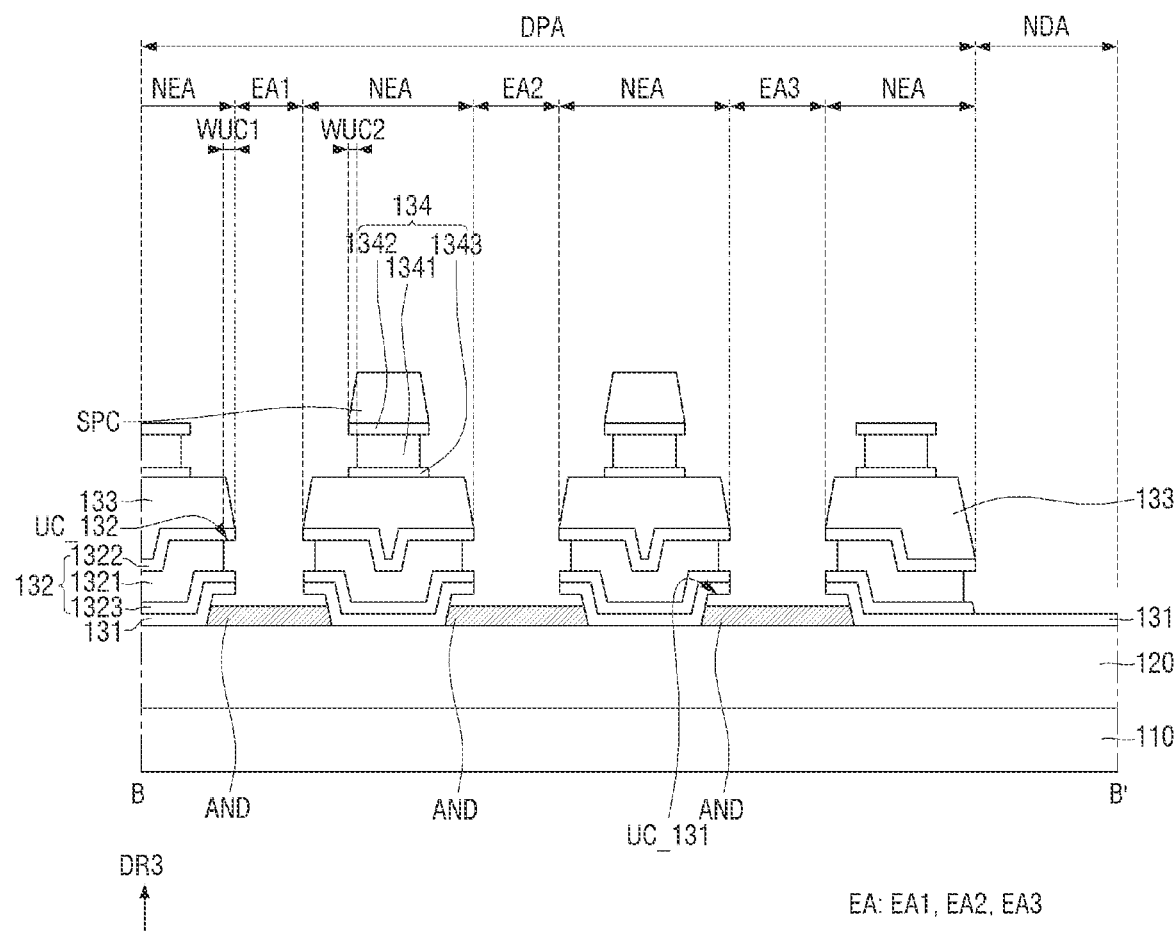

In addition, as shown in FIG. 36, the method according to the one or more other embodiments corresponding to FIG. 10 may further include patterning the spacer SPC in the non-emission area NEA before the locating a plurality of first common layers CML1 and a plurality of emissive layers EML at operation S60.

After the patterning the spacer SPC, the remaining spacer SPC may be located on a part of the second multi-layer 134. A plurality of spacers SPC may be arranged such that they are spaced apart from one another by a distance substantially equal to the distance between two or more emission areas among the plurality of emission areas EA.

Figure 37:
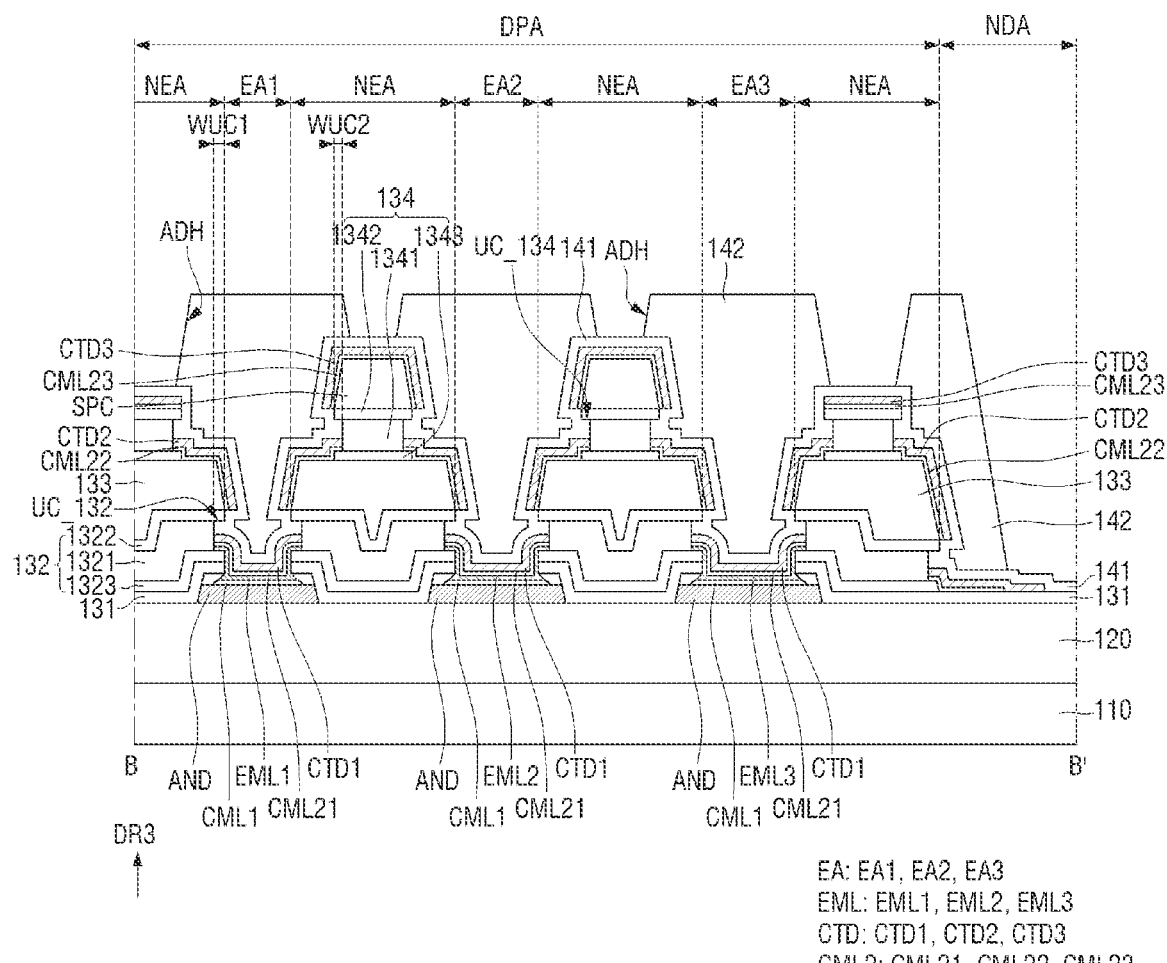

Subsequently, as shown in FIG. 37, according to the one or more other embodiments corresponding to FIG. 10, in the forming the adhesion holes ADH, the adhesion holes ADH may overlap a plurality of spacers SPC and other parts of the second multi-layer 142 where they are not located.

A method of fabricating the display device 100g (see FIG. 11) according to the one or more other embodiments corresponding to FIG. 11 is substantially identical to the method according to one or more embodiments shown in FIGS. 12 to 30, except that a spacer SPC is formed in the non-emission area NEA in the locating of the spacer SPC at operation S54.

In other words, the method of fabricating the display device 100g according to the one or more other embodiments corresponding to FIG. 11 is substantially identical to the one or more other embodiments corresponding to FIGS. 10 and/or 35, except that the display device 100g does not include the step of patterning the spacers SPC, and, therefore, the redundant descriptions will be omitted That is, as shown in FIG. 35, according to the one or more other embodiments corresponding to FIG. 11, the locating of the spacer SPC at operation S54 includes locating the spacer SPC having a width that is less than the upper portion of the pixel-defining layer 133 in the non-emission area NEA, and the patterning the first multi-layer 132 and the second multi-layer 134 at operation S55 includes locating the second multi-layer 134 in the non-emission area NEA, like the spacer SPC.

Figure 38:
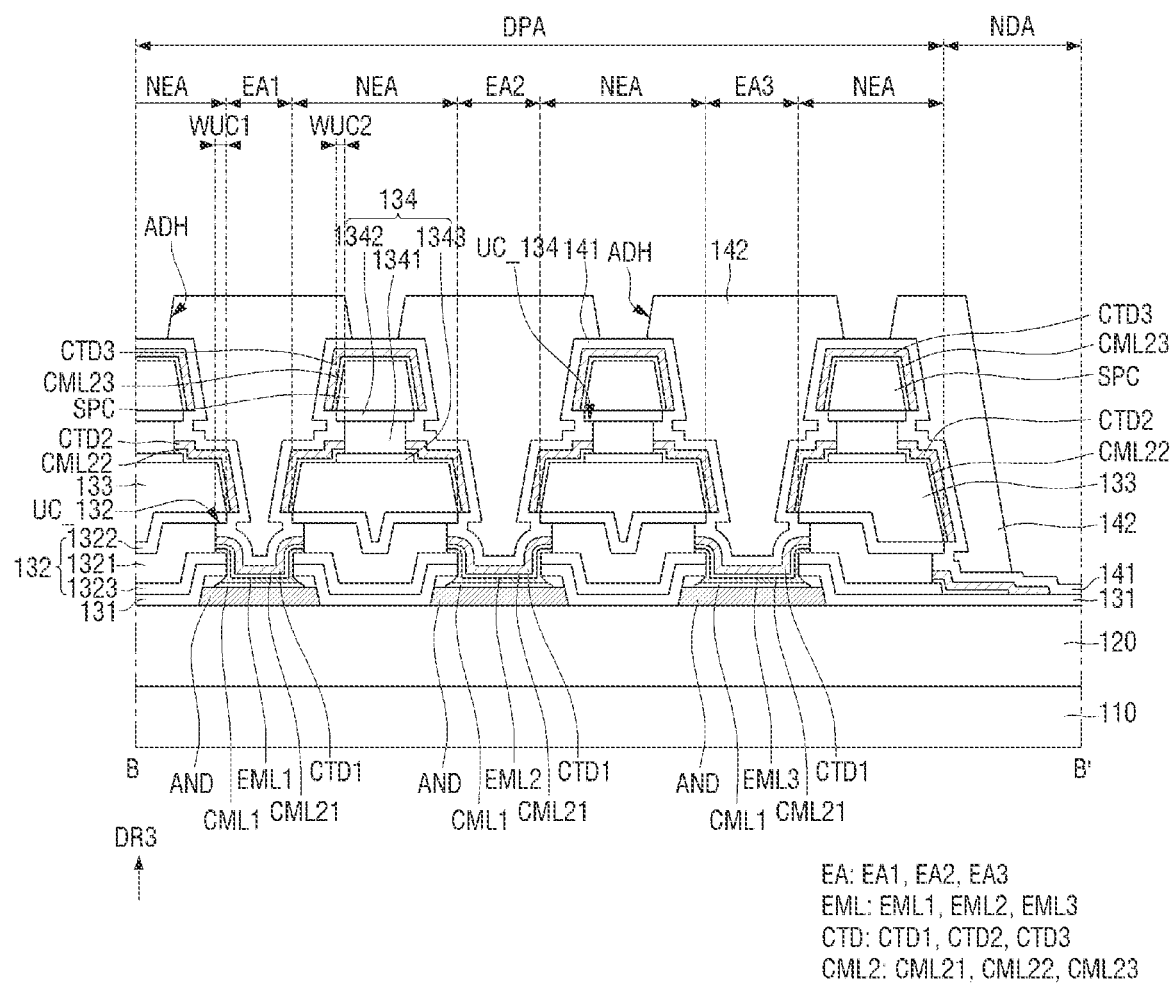

Subsequently, as shown in FIG. 38, a second common layer CML23 and a cathode electrode CTD3 are located on the spacer SPC in the non-emission area NEA, and a first encapsulation layer 141 may be located on the front surface of the cathode electrodes CTD.

According to the one or more other embodiments corresponding to FIG. 11, in the forming the adhesion hole ADH, the spacer SPC in the non-emission area NEA remains as it is, and thus the adhesion hole ADH formed in the non-emission area NEA may overlap only with the spacer SPC.

However, the aspects of the disclosure are not restricted to the one set forth herein. The above and other aspects of the disclosure will become more apparent to one of ordinary skill in the art to which the disclosure pertains by referencing the claims, with functional equivalents thereof to be included therein.

What is claimed is:

1. A display device comprising:
   a substrate comprising emission areas for displaying images, and a non-emission area between the emission areas;
   anode electrodes above the substrate and respectively in the emission areas;
   a bank buffer layer above the substrate in the non-emission area and covering edges of the anode electrodes;
   a first multi-layer above the bank buffer layer, comprising a stack of two or more different metal materials, and comprising an undercut structure;
   a pixel-defining layer above the first multi-layer;
   a second multi-layer above the pixel-defining layer, comprising a stack of two or more different metal materials, and comprising an undercut structure; and
   a spacer above the second multi-layer.

2. The display device of claim 1, further comprising:
   first common layers above the anode electrodes, respectively;
   emissive layers above the first common layers, respectively;
   a second common layer in the emission areas and the non-emission area and covering the emissive layers, the pixel-defining layer, and the spacer; and
   a cathode electrode above the second common layer.

3. The display device of claim 2, wherein the first common layers comprise a hole transport layer, and
   wherein the second common layer comprises an electron transport layer.

4. The display device of claim 2, wherein the first multi-layer comprises a first main layer comprising a metal material, and a first cover layer above the first main layer and comprising a metal material that is different from the metal material of the first main layer, and
   wherein the undercut structure of the first multi-layer is formed by the first cover layer having an edge extending past the first main layer.

5. The display device of claim 4, wherein the second common layer and the cathode electrode above the emissive layers are separated from the second common layer and the cathode electrode above the pixel-defining layer by the undercut structure of the first multi-layer, and
   wherein the cathode electrode above the emissive layers is in contact with the first multi-layer.

6. The display device of claim 5, wherein a width by which the first cover layer extends past the first main layer ranges from about 0.3 μm to about 0.7 μm.

7. The display device of claim 4, wherein the first multi-layer further comprises a first support layer between the bank buffer layer and the first main layer and comprising a metal material that is different from the metal material of the first main layer.

8. The display device of claim 4, wherein the second multi-layer comprises a second main layer comprising a metal material, and a second cover layer above the second main layer and comprising a metal material that is different from the metal material of the second main layer, and
   wherein the undercut structure of the second multi-layer is formed by the second cover layer having an edge extending past the second main layer.

9. The display device of claim 8, wherein the second common layer and the cathode electrode above the spacer are separated from the second common layer and the cathode electrode above the pixel-defining layer by the undercut structure of the second multi-layer.

10. The display device of claim 9, wherein a width by which the second cover layer extends past the second main layer ranges from about 0.3 µm to about 0.7 µm.

11. The display device of claim 8, wherein the second multi-layer further comprises a second support layer between the pixel-defining layer and the second main layer and comprising a metal material that is different from the metal material of the second main layer.

12. The display device of claim 8, wherein the first main layer and the second main layer comprise aluminum (Al) or copper (Cu), and
wherein the first cover layer and the second cover layer comprise titanium (Ti) or molybdenum (Mo).

13. The display device of claim 8, further comprising an encapsulation structure above the cathode electrode and comprising:
a first encapsulation layer above the cathode electrode, in contact with the first multi-layer and the second multi-layer, and comprising an inorganic insulating material;
a second encapsulation layer above the first encapsulation layer, comprising an organic insulating material, and defining adhesion holes penetrating therethrough in the non-emission area; and
a third encapsulation layer above the second encapsulation layer, comprising the inorganic insulating material, and contacting the first encapsulation layer through the adhesion holes.

14. The display device of claim 13, wherein a thickness of the first main layer or a thickness of the second main layer exceeds a sum of a thickness of the second common layer and a thickness of the cathode electrode.

15. The display device of claim 13, wherein the encapsulation structure further comprises an adhesion-promoting layer between the first encapsulation layer and the second encapsulation layer.

16. The display device of claim 15, wherein the second encapsulation layer comprises a negative photoresist material, and
wherein the adhesion-promoting layer comprises a material comprising at least one functional group selected from among —H, —CH, —CH$_2$, —CH$_3$, —F, —CF, —CF$_2$ or —CF$_3$.

17. The display device of claim 13, wherein the second multi-layer comprises multiple second multi-layers spaced apart from one another by a distance associated with a distance between two or more of the emission areas, with a width that is less than a width of an upper portion of the pixel-defining layer, and
wherein the spacer comprises multiple spacers respectively above the second multi-layers.

18. The display device of claim 17, wherein the second multi-layers are above a part of the pixel-defining layer, and
wherein the adhesion holes respectively overlap with other parts of the pixel-defining layer and the spacers.

19. The display device of claim 13, wherein the second multi-layer has a width that is less than a width of an upper surface of the pixel-defining layer and is in the non-emission area, and
wherein the spacer comprises multiple spacers spaced apart from one another by a distance associated with a distance between two or more of the emission areas.

20. The display device of claim 19, wherein the spacers are above a part of the second multi-layer, and
wherein the adhesion holes respectively overlap with other parts of the second multi-layer and the spacers.

21. The display device of claim 13, wherein the second multi-layer has a width that is less than a width of an upper surface of the pixel-defining layer and is in the non-emission area,
wherein the spacer is in the non-emission area, and
wherein the adhesion hole overlaps with the spacer.

22. The display device of claim 13, wherein the bank buffer layer is spaced apart from an upper portion of the edges of the anode electrodes.

23. The display device of claim 22, further comprising a sacrificial layer between the bank buffer layer and the anode electrodes,
wherein the bank buffer layer has an edge extending past the sacrificial layer.

24. The display device of claim 13, further comprising a circuit layer above the substrate and comprising pixel drivers respectively associated with the emission areas and respectively connected to the anode electrodes,
wherein the anode electrodes and the bank buffer layer are above the circuit layer.

25. A method of fabricating a display device, the method comprising:
preparing a substrate comprising emission areas for displaying images, and a non-emission area between the emission areas;
locating a circuit layer comprising pixel drivers respectively associated with the emission areas above the substrate;
locating anode electrodes respectively in the emission areas above the circuit layer;
locating a bank buffer layer covering the anode electrodes above the circuit layer;
locating a first multi-layer comprising a stack of two or more different metal materials above the bank buffer layer;
locating a pixel-defining layer in the non-emission area above the first multi-layer;
locating a second multi-layer covering the pixel-defining layer and comprising a stack of two or more different metal materials above the first multi-layer;
locating a spacer in at least a part of the non-emission area above the second multi-layer;
patterning the bank buffer layer, the first multi-layer, and the second multi-layer using the pixel-defining layer and the spacer as masks;
transforming the patterned first multi-layer and the patterned second multi-layer into respective undercut structures to expose central portions of the anode electrodes;
locating first common layers and emissive layers respectively in the emission areas above the anode electrodes;
locating a second common layer and a cathode electrode covering the emissive layers, the pixel-defining layer, and the spacer in the emission areas and the non-emission area; and
locating an encapsulation structure above the cathode electrode.

26. The method of claim 25, wherein the emission areas comprise first emission areas for emitting light of a first color in a first wavelength band, second emission areas for emitting light of a second color in a second wavelength band that is lower than the first wavelength band, and third emission areas for emitting light of a third color in a third wavelength band that is lower than the second wavelength band,
wherein the emissive layers comprise a first emissive layer for emitting light of the first color, a second emissive layer for emitting light of the second color, and a third emissive layer for emitting light of the third color, and wherein the locating of the first common layers and the emissive layers respectively above the anode electrodes comprises:

locating the first common layer and the first emissive layer above the anode electrodes of the first emission areas with a first mask defining openings aligned with the first emission areas above the spacer;

locating the first common layer and the second emissive layer above the anode electrodes of the second emission areas with a second mask defining openings aligned with the second emission areas above the spacer; and locating the first common layer and the third emissive layer above the anode electrodes of the third emission areas with a third mask defining openings aligned with the third emission areas above the spacer.

27. The method of claim 26, wherein the first common layers comprise a hole transparent layer, and wherein the second common layer comprises an electron transport layer.

28. The method of claim 25, wherein the first multi-layer comprises a first main layer comprising a metal material, and a first cover layer above the first main layer and comprising a metal material that is different from the metal material of the first main layer, and wherein the second multi-layer comprises a second main layer comprising a metal material, and a second cover layer above the second main layer and comprising a metal material that is different from the metal material of the second main layer.

29. The method of claim 28, wherein the transforming the patterned first multi-layer and the patterned second multi-layer into the respective undercut structures comprises patterning the first main layer and the second main layer, wherein an edge of the first cover layer of the patterned first multi-layer extends past the first main layer to provide the undercut structure of the first multi-layer, and wherein an edge of the second cover layer of the patterned second multi-layer extends past the second main layer to provide the undercut structure of the second multi-layer.

30. The method of claim 29, wherein the second common layer and the cathode electrode above the pixel-defining layer are separated from the second common layer and the cathode electrode above the emissive layers by the undercut structure of the first multi-layer, and are separated from the second common layer and the cathode electrode above the spacer by the undercut structure of the second multi-layer.

31. The method of claim 29, wherein the first multi-layer further comprises a first support layer between the bank buffer layer and the first main layer and comprising a metal material that is different from the metal material of the first main layer, and wherein the second multi-layer further comprises a second support layer between the pixel-defining layer and the second main layer and comprising a metal material that is different from the metal material of the second main layer.

32. The method of claim 29, wherein the locating of the encapsulation structure above the cathode electrode comprises:

locating a first encapsulation layer comprising an inorganic insulating material above the cathode electrode and contacting the first multi-layer and the second multi-layer;

locating a second encapsulation layer comprising an organic insulating material above the first encapsulation layer;

forming an adhesion hole in the non-emission area by patterning the second encapsulation layer; and locating a third encapsulation layer comprising an inorganic insulating material above the first encapsulation layer, the third encapsulation layer covering the second encapsulation layer and the adhesion hole to contact the first encapsulation layer through the adhesion hole.

33. The method of claim 32, wherein the locating of the encapsulation structure further comprises locating an adhesion-promoting layer above the first encapsulation layer, wherein the second encapsulation layer is above the adhesion-promoting layer, and wherein the adhesion-promoting layer is patterned with the second encapsulation layer to form the adhesion hole therethrough.

34. The method of claim 33, wherein the second encapsulation layer comprises a negative photoresist material, and wherein the adhesion-promoting layer comprises a material comprising at least one functional group selected from among —H, —CH, —CH$_2$, —CH$_3$, —F, —CF, —CF$_2$ or —CF$_3$.

35. The method of claim 32, wherein the spacer comprises multiple spacers spaced apart from one another by a distance associated with a distance between two or more of the emission areas, and having a width that is less than a width of an upper portion of the pixel-defining layer, wherein the patterned second multi-layer is above a part of the pixel-defining layer, and wherein the adhesion holes respectively overlap with other parts of the pixel-defining layer and the spacers.

36. The method of claim 32, wherein the spacer has a width that is less than a width of an upper portion of the pixel-defining layer in the non-emission area, and wherein the patterned second multi-layer is in the non-emission area.

37. The method of claim 36, wherein the adhesion hole overlaps with the spacer.

38. The method of claim 36, further comprising patterning the spacer in the non-emission area such that remaining spacers are above a part of the second multi-layer and are spaced apart from one another by a distance associated with a distance between two or more of the emission areas, and wherein the adhesion holes overlap with other parts of the second multi-layer and the spacers.

39. The method of claim 25, further comprising:

locating sacrificial layers respectively above the anode electrodes; and removing at least a part of the sacrificial layers to expose central portions of the anode electrodes, wherein the bank buffer layer is spaced apart from an upper portion of edges of the anode electrodes.

40. The method of claim 39, further comprising removing a part of the sacrificial layers such that other parts of the sacrificial layers remain between the bank buffer layer and the anode electrodes, and such that the bank buffer layer has an edge extending past the other parts of the sacrificial layers.

* * * * *